US011991881B2

United States Patent
Tanaka et al.

(10) Patent No.: US 11,991,881 B2
(45) Date of Patent: May 21, 2024

(54) THREE-DIMENSIONAL MEMORY DEVICE WITH OFF-CENTER OR REVERSE SLOPE STAIRCASE REGIONS AND METHODS FOR FORMING THE SAME

(71) Applicant: SANDISK TECHNOLOGIES LLC, Addison, TX (US)

(72) Inventors: Hiroyuki Tanaka, Yokkaichi (JP); Hiroyuki Ogawa, Nagoya (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 298 days.

(21) Appl. No.: 17/226,321

(22) Filed: Apr. 9, 2021

(65) Prior Publication Data

US 2022/0328512 A1     Oct. 13, 2022

(51) Int. Cl.
| | |
|---|---|
| H10B 43/27 | (2023.01) |
| H10B 41/10 | (2023.01) |
| H10B 41/27 | (2023.01) |
| H10B 41/35 | (2023.01) |
| H10B 43/10 | (2023.01) |
| H10B 43/35 | (2023.01) |

(52) U.S. Cl.
CPC ............. *H10B 43/27* (2023.02); *H10B 41/10* (2023.02); *H10B 41/27* (2023.02); *H10B 41/35* (2023.02); *H10B 43/10* (2023.02); *H10B 43/35* (2023.02)

(58) Field of Classification Search
CPC ........ H10B 43/27; H10B 43/10; H10B 43/35; H10B 43/50; H10B 41/27; H10B 41/10; H10B 41/35; H10B 41/50
See application file for complete search history.

(56) References Cited

U.S. PATENT DOCUMENTS

| | | | |
|---|---|---|---|
| 5,915,167 A | 6/1999 | Leedy | |
| 9,905,573 B1 | 2/2018 | Mada et al. | |
| 10,115,681 B1 | 10/2018 | Ariyoshi | |
| 10,170,570 B1 * | 1/2019 | Sonehara | H10B 43/27 |
| 10,192,877 B2 | 1/2019 | Norizuki et al. | |

(Continued)

FOREIGN PATENT DOCUMENTS

CN            111492480         8/2020

OTHER PUBLICATIONS

International Search Report and Written Opinion of the International Searching Authority for International Patent Application No. PCT/US2022/011879, mailed Apr. 24, 2022, 14 pages.

(Continued)

*Primary Examiner* — Alia Sabur
(74) *Attorney, Agent, or Firm* — THE MARBURY LAW GROUP PLLC

(57) ABSTRACT

A three-dimensional memory device includes alternating stacks of insulating layers and electrically conductive layers, and memory stack structures vertically extending through a respective one of the alternating stacks and located within the first memory array region and the second memory array region. An inter-array region containing lower and upper staircases is located between the first and the second memory array regions. The first memory array region may have a greater length than the second memory array region, or the lower staircase may generally ascend in an opposite direction from the upper staircase.

18 Claims, 40 Drawing Sheets

(56) References Cited

U.S. PATENT DOCUMENTS

| | | | |
|---|---|---|---|
| 10,290,803 B2 | 5/2019 | Sano et al. | |
| 10,546,870 B2 | 1/2020 | Shimabukuro et al. | |
| 10,629,606 B2 | 4/2020 | Sugawara et al. | |
| 10,804,284 B2 | 10/2020 | Ishii et al. | |
| 10,847,524 B2 | 11/2020 | Otsu et al. | |
| 2017/0236746 A1* | 8/2017 | Yu | H10B 43/27 257/314 |
| 2017/0373088 A1 | 12/2017 | Lee | |
| 2018/0061850 A1 | 3/2018 | Mada et al. | |
| 2018/0158873 A1 | 6/2018 | Sano et al. | |
| 2018/0261611 A1 | 9/2018 | Norizuki et al. | |
| 2019/0139974 A1 | 5/2019 | Sugawara et al. | |
| 2019/0221574 A1 | 7/2019 | Shimabukuro et al. | |
| 2019/0237477 A1* | 8/2019 | Baek | H10B 43/10 |
| 2019/0319040 A1 | 10/2019 | Ishii et al. | |
| 2019/0319042 A1* | 10/2019 | Baek | H10B 43/10 |
| 2019/0378855 A1* | 12/2019 | Kim | H10B 43/27 |
| 2019/0393240 A1* | 12/2019 | Kim | H10B 43/50 |
| 2020/0294850 A1 | 9/2020 | Lee | |
| 2021/0134827 A1* | 5/2021 | Iwai | H10B 43/27 |
| 2021/0296335 A1* | 9/2021 | Sun | H10B 43/50 |
| 2021/0366808 A1* | 11/2021 | Cui | H10B 43/27 |
| 2021/0375918 A1* | 12/2021 | Zhang | G11C 8/14 |
| 2022/0020681 A1* | 1/2022 | Nojima | H10B 43/50 |
| 2022/0085037 A1* | 3/2022 | Chung | H10B 41/35 |
| 2022/0139950 A1* | 5/2022 | Guo | H10B 41/27 257/314 |
| 2022/0328512 A1* | 10/2022 | Tanaka | H10B 43/10 |

OTHER PUBLICATIONS

Endoh et al., "Novel Ultra High Density Memory with a Stacked-Surrounding Gate Transistor (S-SGT) Structured Cell," IEDM Proc. (2001) 33-36.

U.S. Appl. No. 16/547,971, filed Aug. 22, 2019, SanDisk Technologies LLC.

U.S. Appl. No. 16/675,459, filed Nov. 6, 2019, SanDisk Technologies LLC.

U.S. Appl. No. 16/782,307, filed Feb. 5, 2020, SanDisk Technologies LLC.

U.S. Appl. No. 16/827,990, filed Mar. 24, 2020, SanDisk Technologies LLC.

U.S. Appl. No. 16/881,346, filed May 22, 2020, SanDisk Technologies LLC.

U.S. Appl. No. 16/881,401, filed May 22, 2020, SanDisk Technologies LLC.

U.S. Appl. No. 16/921,146, filed Jul. 6, 2020, SanDisk Technologies LLC.

U.S. Appl. No. 17/039,160, filed Sep. 30, 2020, SanDisk Technologies LLC.

U.S. Appl. No. 17/146,866, filed Jan. 12, 2021, SanDisk Technologies LLC.

U.S. Appl. No. 17/224,370, filed Apr. 7, 2021, SanDisk Technologies LLC.

\* cited by examiner

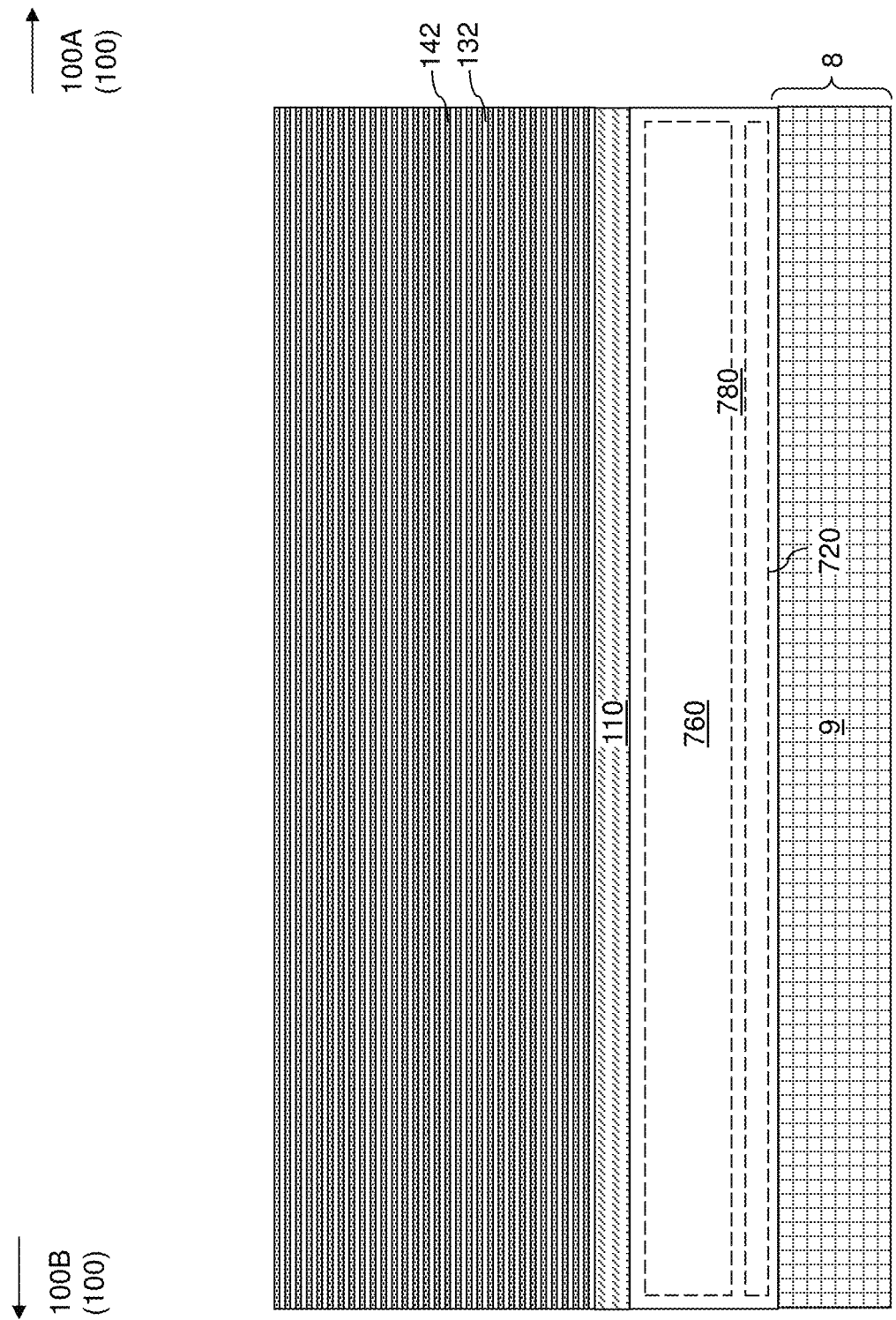

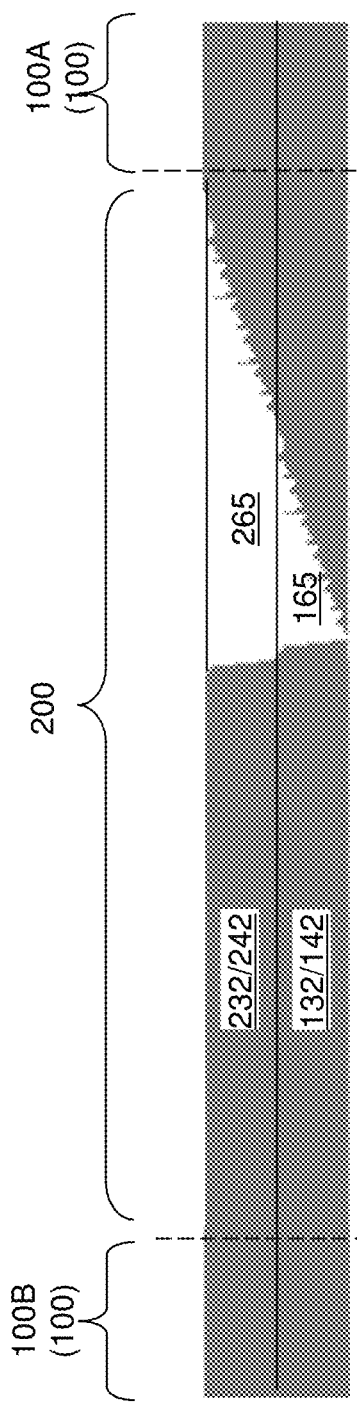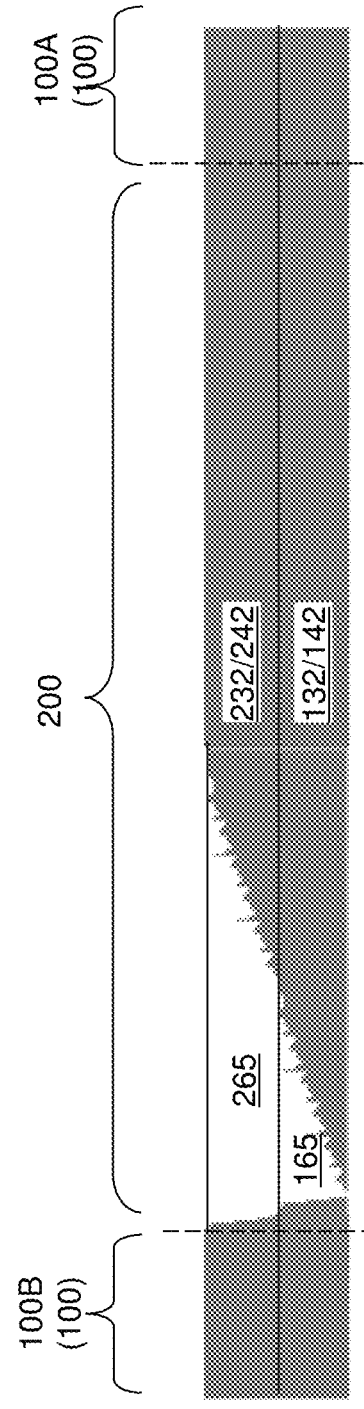

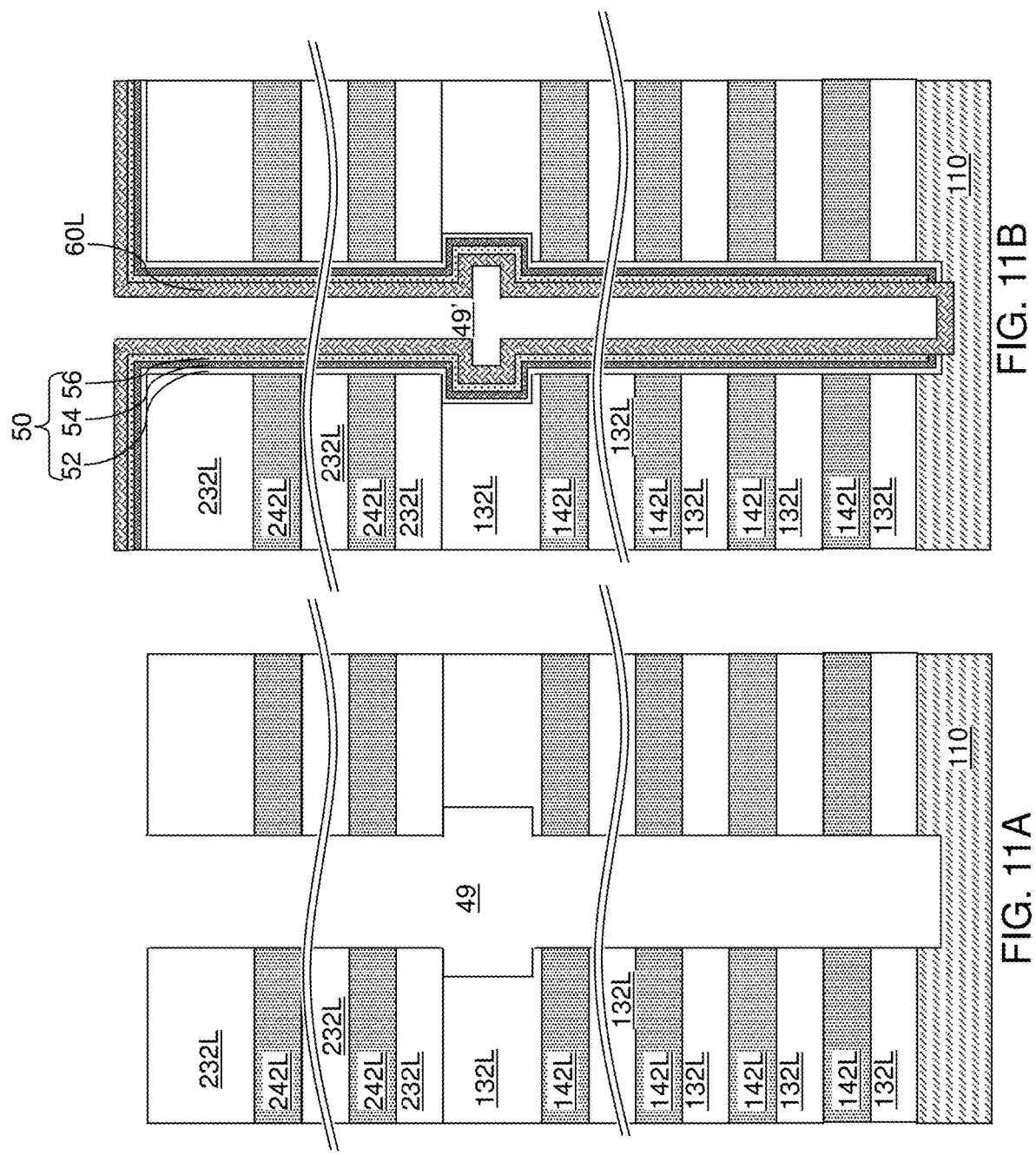

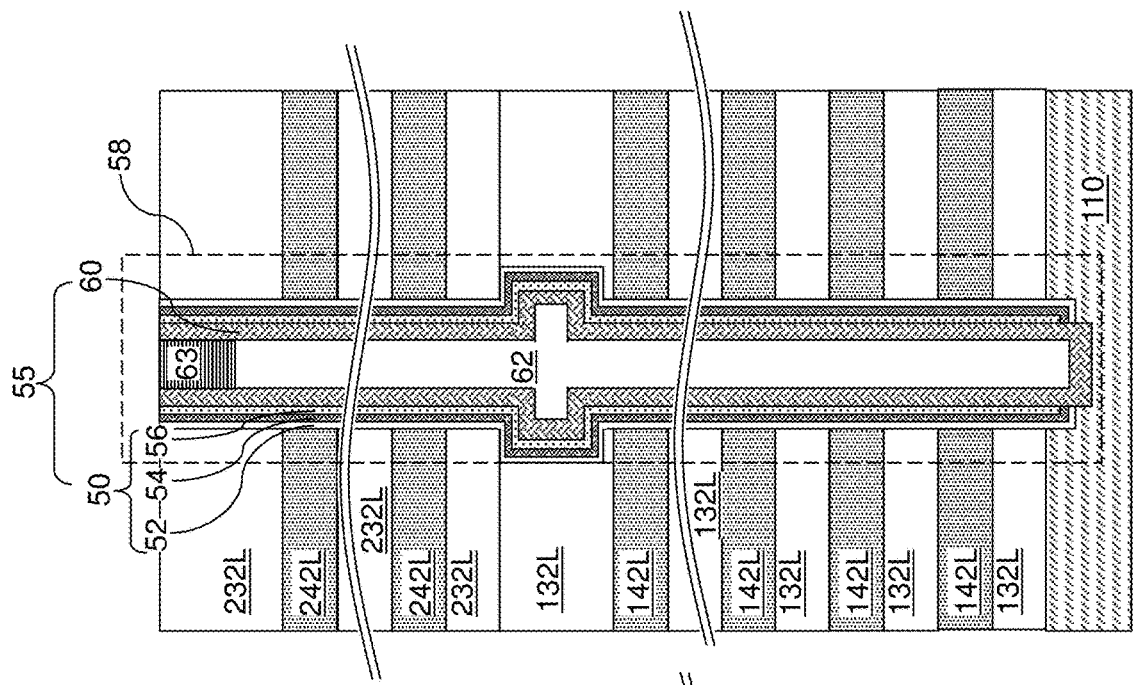
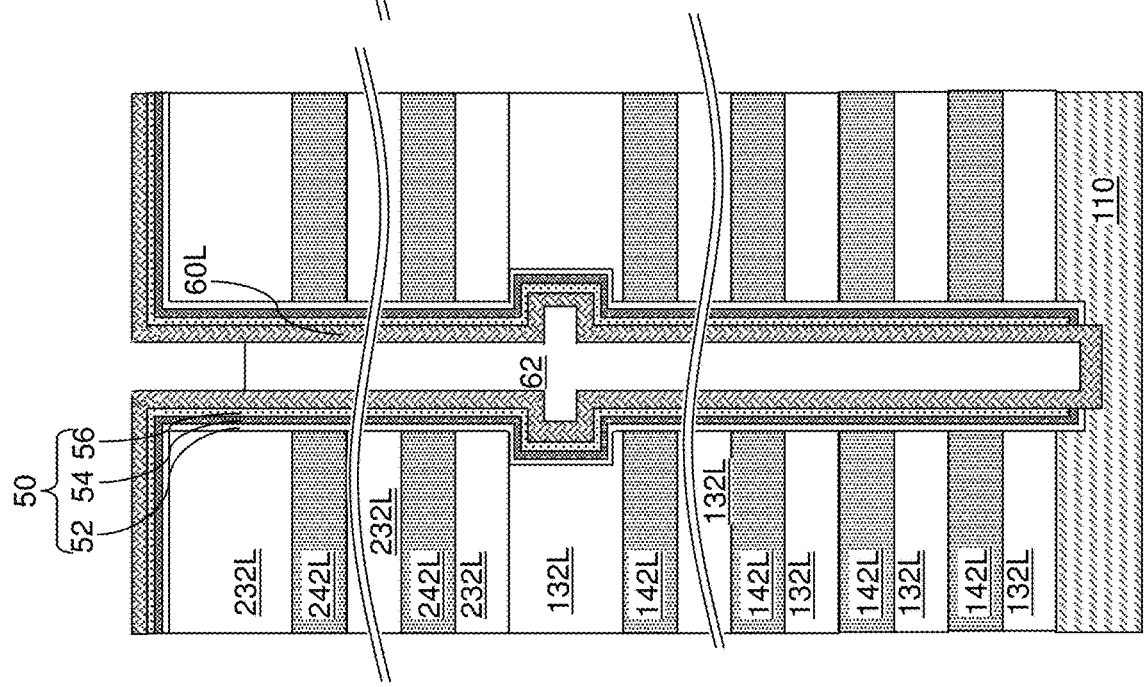

THREE-DIMENSIONAL MEMORY DEVICE WITH OFF-CENTER OR REVERSE SLOPE STAIRCASE REGIONS AND METHODS FOR FORMING THE SAME

FIELD

The present disclosure relates generally to the field of semiconductor devices, and particularly to a three-dimensional memory device with off-center or reverse slope staircase regions and methods of forming the same.

BACKGROUND

A three-dimensional memory device including three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an embodiment of the present disclosure, a three-dimensional memory device is provided, which comprises: alternating stacks of insulating layers and electrically conductive layers, wherein each of the alternating stacks laterally extends along a first horizontal direction through a first memory array region and a second memory array region that are laterally spaced apart by an inter-array region, and wherein each of the alternating stacks includes a set of stepped surfaces in the inter-array region; retro-stepped dielectric material portions overlying a respective set of stepped surfaces of the alternating stacks; and memory stack structures vertically extending through a respective one of the alternating stacks and located within the first memory array region and the second memory array region, wherein: the first memory array region has a first length along the first horizontal direction; and the second memory array region has a second length along the first horizontal direction that is less than the first length.

According to another aspect of the present disclosure, a three-dimensional memory device is provided, which comprises: alternating stacks of insulating layers and electrically conductive layers, wherein each of the alternating stacks laterally extends along a first horizontal direction through a first memory array region and a second memory array region that are laterally spaced apart by an inter-array region; and memory stack structures vertically extending through a respective one of the alternating stacks and located within the first memory array region and the second memory array region. Each of the alternating stacks comprises a first-tier alternating stack of first insulating layers and first electrically conductive layers and a second-tier alternating stack of second insulating layers and second electrically conductive layers located over the first tier-alternating stack; the first-tier alternating stack has a first staircase having first stepped surfaces located in the inter-array region; the second-tier alternating stack has a second staircase having second stepped surfaces located in the inter-array region; and the first staircase generally ascends in first direction and the second staircase generally ascends in a direction opposite to the first direction in each alternating stack which includes the first-tier alternating stack and the second-tier alternating stack.

A method of forming a three-dimensional memory device is provided, which comprises: forming a first-tier structure comprising a first vertically alternating sequence of first continuous insulating layers and first continuous sacrificial material layers and first-tier retro-stepped dielectric material portions overlying a first staircase comprising first stepped surfaces of the first vertically alternating sequence, wherein the first-tier retro-stepped dielectric material portions are formed in an inter-array region located between a first memory array region and a second memory array region that are laterally spaced apart along a first horizontal direction; forming a second-tier structure comprising a second vertically alternating sequence of second continuous insulating layers and second continuous sacrificial material layers and second-tier retro-stepped dielectric material portions overlying a second staircase comprising second stepped surfaces of the second vertically alternating sequence that are located in the inter-array region; forming memory openings through the second vertically alternating sequence and the first vertically alternating sequence; forming memory opening fill structures in the memory openings, wherein each of the memory opening fill structures comprises a respective vertical stack of memory elements; forming line trenches laterally extending along the first horizontal direction through the second vertically alternating sequence and the first vertically alternating sequence; replacing remaining portions of the first continuous sacrificial material layers and remaining portions of the second continuous sacrificial material layers with electrically conductive layers, whereby alternating stacks are formed, each of which comprising a first-tier alternating stack of first insulating layers and first electrically conductive layers and a second-tier alternating stack of second insulating layers and second electrically conductive layers; forming first layer contact via structures through the first-tier retro-stepped dielectric material portions on a respective one of the first electrically conductive layers; and forming second layer contact via structures through the second-tier retro-stepped dielectric material portions on a respective one of the second electrically conductive layers. The three-dimensional memory device is formed with at least one feature that is selected from: a first feature in which the first memory array region has a first length along the first horizontal direction, and the second memory array region has a second length along the first horizontal direction that is less than the first length; or a second feature in which the first staircase generally ascends in first direction and the second staircase generally ascends in a direction opposite to the first direction in each alternating stack.

BRIEF DESCRIPTION OF THE DRAWINGS

FIG. 2 is a vertical cross-sectional view of a first exemplary structure for forming a semiconductor die after formation of optional semiconductor devices, optional lower level dielectric layers, optional lower metal interconnect structures, a semiconductor material layer, and a first vertically alternating sequence of first continuous insulating layers and first continuous sacrificial material layers according to the first embodiment of the present disclosure.

FIG. 7A is another vertical cross-sectional view of the first exemplary structure of FIGS. 6A and 6B through an odd-numbered stack of retro-stepped dielectric material portions along the first horizontal direction according to the first embodiment of the present disclosure.

FIG. 7B is yet another vertical cross-sectional view of the first exemplary structure of FIGS. 6A and 6B through an even-numbered stack of retro-stepped dielectric material portions along the first horizontal direction according to the first embodiment of the present disclosure.

FIGS. 11A-11D illustrate sequential vertical cross-sectional views of a memory opening during formation of a memory opening fill structure according to the first embodiment of the present disclosure.

DETAILED DESCRIPTION

Figure 1A:
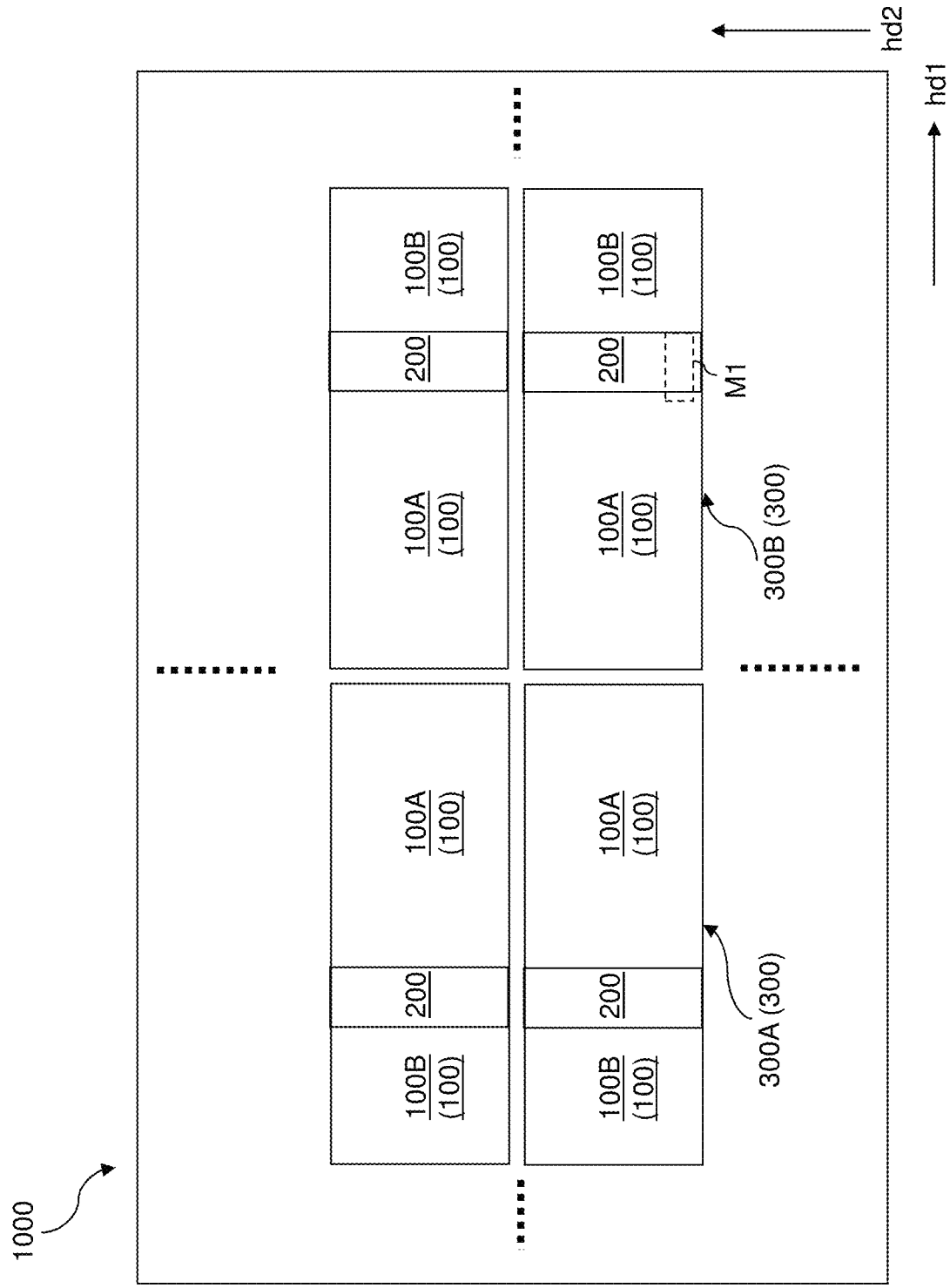
FIG. 1A is a plan view of a first exemplary semiconductor die including multiple three-dimensional memory array regions according to a first embodiment of the present disclosure.
Figure 1B:
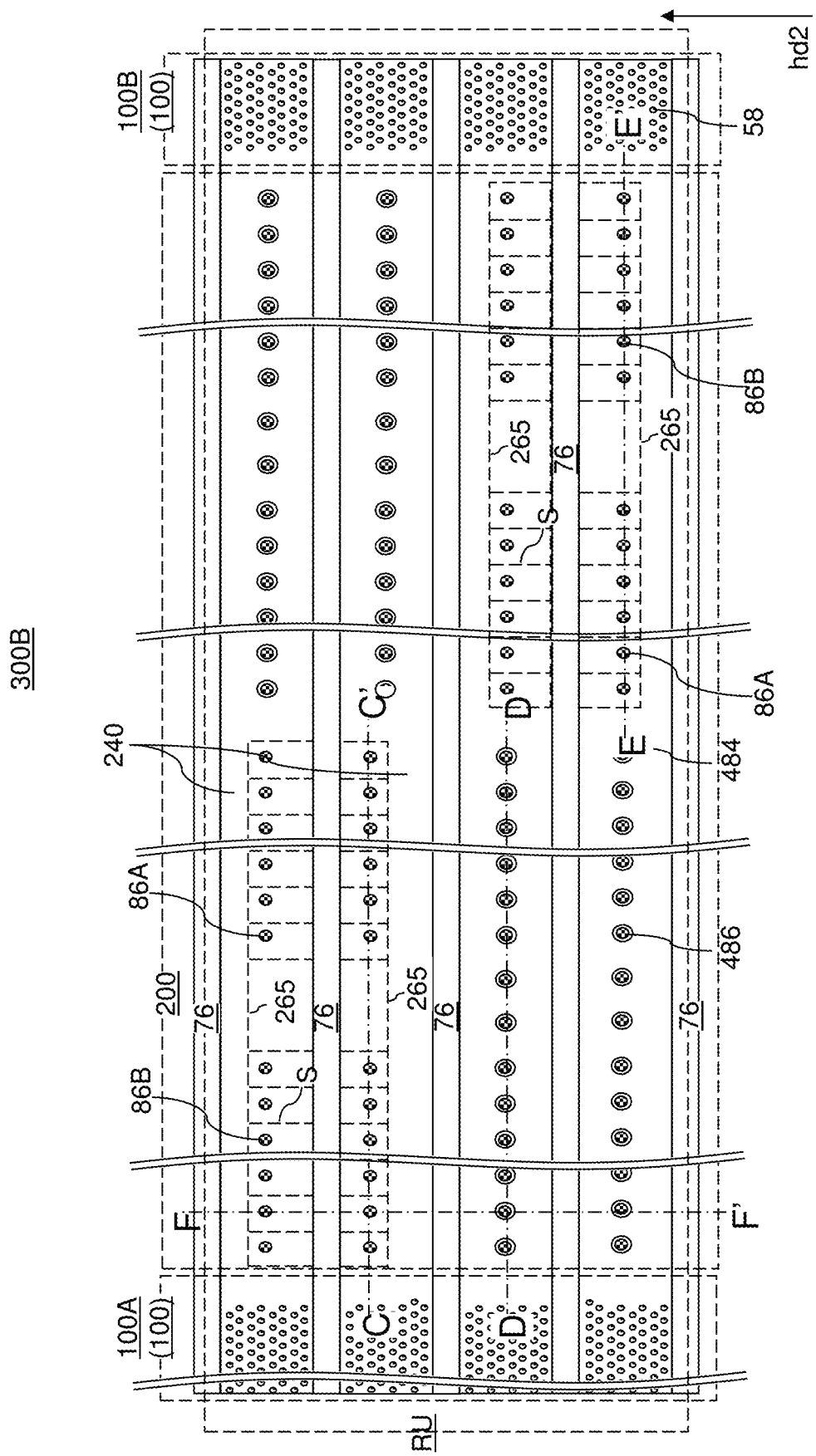
FIG. 1B is a schematic see-through top-down view of region M1 of FIG. 1A.
Figure 1C:
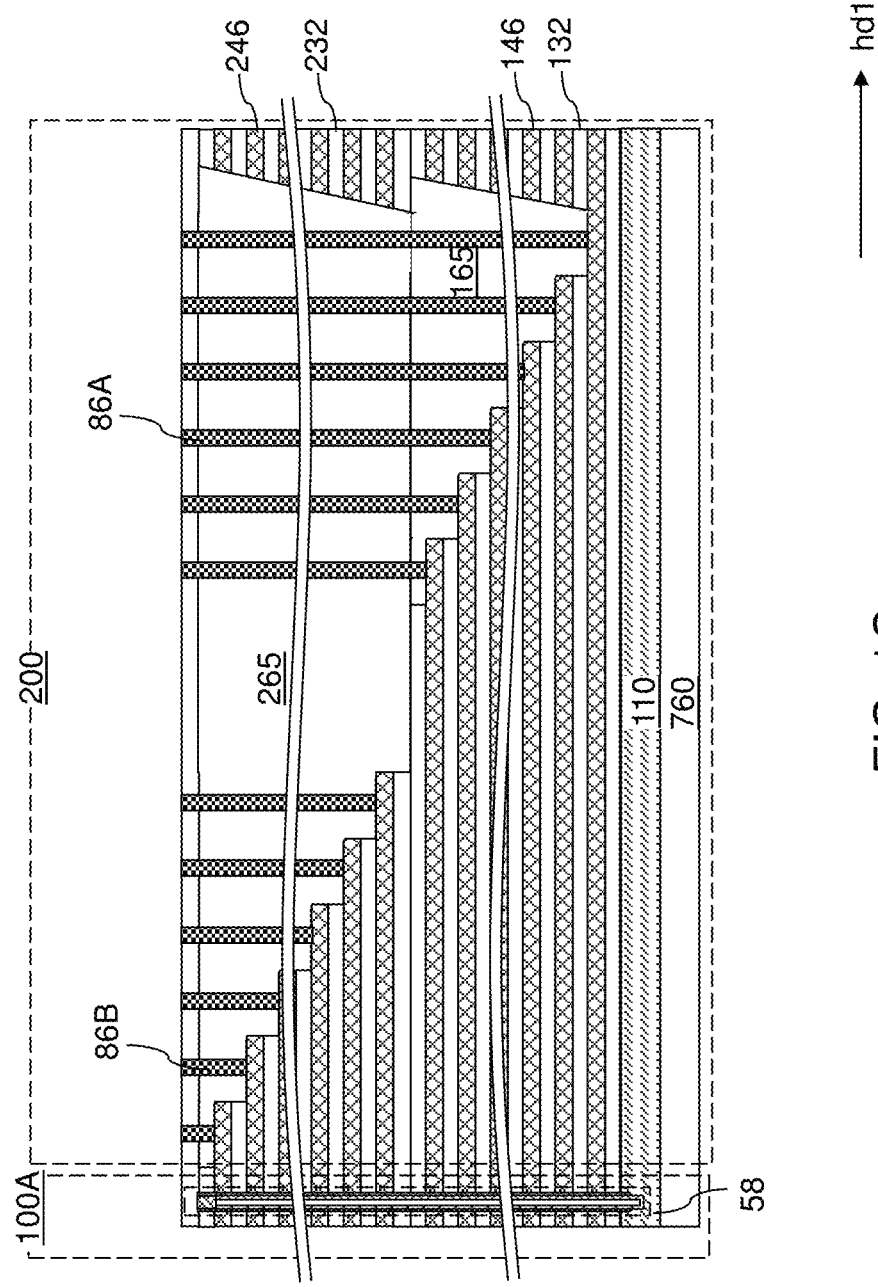
FIG. 1C is a schematic vertical cross-sectional view of a region of the first exemplary semiconductor die along the vertical plane C-C' of FIG. 1B.
Figure 1D:
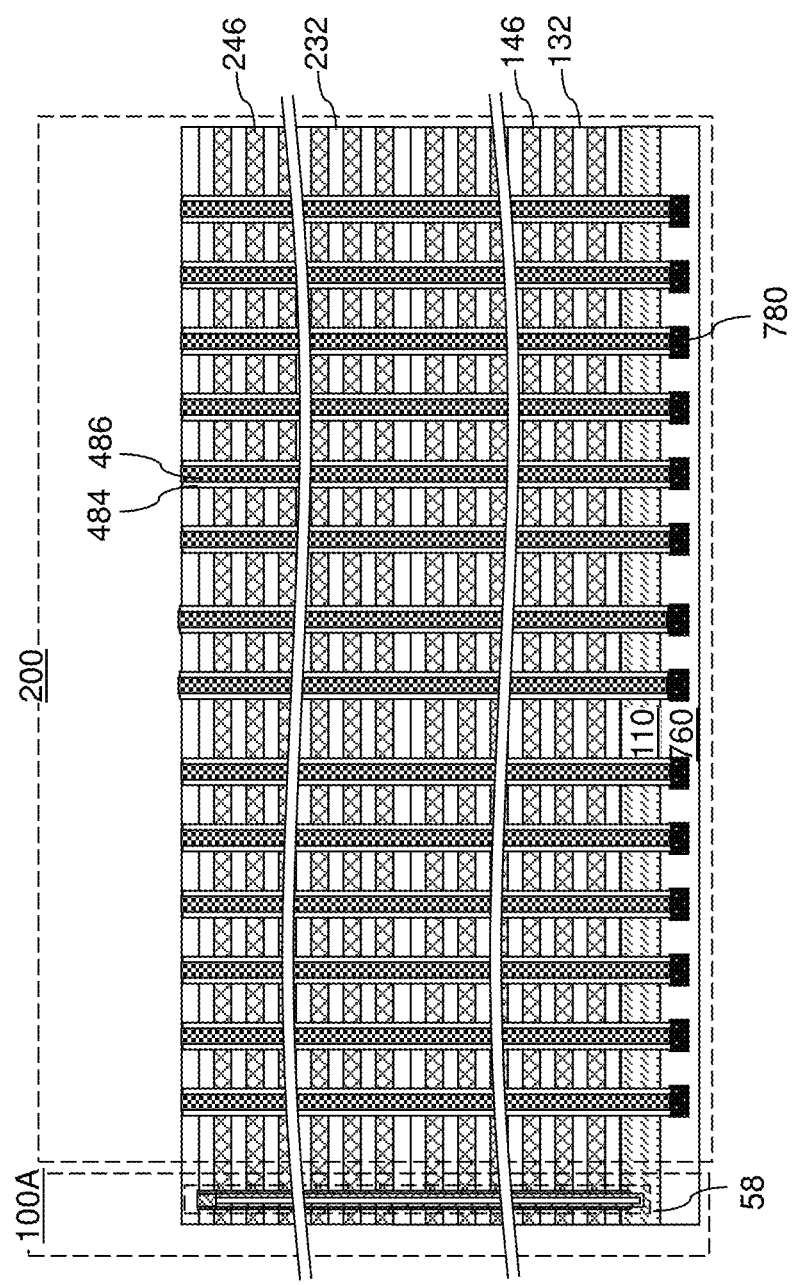
FIG. 1D is a schematic vertical cross-sectional view of a region of the first exemplary semiconductor die along the vertical plane D-D' of FIG. 1B.

As discussed above, the embodiments of the present disclosure are directed to a three-dimensional memory device off-center or reverse slope word line staircase regions which provide faster word line response and methods of forming the same, the various aspects of which are now described in detail.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or from each other, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the first continuous structure. For example, a layer may be located between any pair of horizontal planes between, or at, a top surface and a bottom surface of the first continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

As used herein, a "memory level" or a "memory array level" refers to the level corresponding to a general region between a first horizontal plane (i.e., a plane parallel to the top surface of the substrate) including topmost surfaces of an array of memory elements and a second horizontal plane including bottommost surfaces of the array of memory elements. As used herein, a "through-stack" element refers to an element that vertically extends through a memory level.

As used herein, a "semiconducting material" refers to a material having electrical conductivity in the range from $1.0 \times 10^{-5}$ S/m to $1.0 \times 10^{5}$ S/m. As used herein, a "semiconductor material" refers to a material having electrical conductivity in the range from $1.0 \times 10^{-5}$ S/m to $1.0$ S/m in the absence of electrical dopants therein, and is capable of producing a doped material having electrical conductivity in a range from $1.0$ S/m to $1.0 \times 10^{7}$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/m. As used herein, an "insulator material" or a "dielectric material" refers to a material having electrical conductivity less than $1.0 \times 10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to provide electrical conductivity greater than $1.0 \times 10^{5}$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-5}$ S/m to $1.0 \times 10^{7}$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The substrate may include integrated circuits fabricated thereon, such as driver circuits for a memory device.

The various three-dimensional memory devices of the present disclosure include a monolithic three-dimensional NAND string memory device, and may be fabricated using the various embodiments described herein. The monolithic three-dimensional NAND string is located in a monolithic, three-dimensional array of NAND strings located over the substrate. At least one memory cell in the first device level of the three-dimensional array of NAND strings is located over another memory cell in the second device level of the three-dimensional array of NAND strings.

Generally, a semiconductor package (or a "package") refers to a unit semiconductor device that may be attached to a circuit board through a set of pins or solder balls. A semiconductor package may include a semiconductor chip (or a "chip") or a plurality of semiconductor chips that are bonded throughout, for example, by flip-chip bonding or another chip-to-chip bonding. A package or a chip may include a single semiconductor die (or a "die") or a plurality of semiconductor dies. A die is the smallest unit that may independently execute external commands or report status. Typically, a package or a chip with multiple dies is capable of simultaneously executing as many number of external commands as the total number of dies therein. Each die includes one or more planes. Identical concurrent operations may be executed in each plane within a same die, although there may be some restrictions. In case a die is a memory die, i.e., a die including memory elements, concurrent read operations, concurrent write operations, or concurrent erase operations may be performed in each plane within a same memory die. In a memory die, each plane contains a number of memory blocks (or "blocks"), which are the smallest unit that may be erased by in a single erase operation. Each memory block contains a number of pages, which are the smallest units that may be selected for programming. A page is also the smallest unit that may be selected to a read operation.

Referring to FIGS. 1A-1F, a first exemplary semiconductor die 1000 according to an embodiment of the present disclosure is illustrated. The first exemplary semiconductor die 1000 includes multiple three-dimensional memory array regions and multiple inter-array regions. The first exemplary semiconductor die 1000 can include multiple planes 300 (e.g., 300A, 300B), each of which includes two memory array regions 100, such as a first memory array region 100A and a second memory array region 100B that are laterally spaced apart by a respective inter-array region 200. Generally, a semiconductor die 1000 may include a single plane 300 or multiple planes. The total number of planes in the semiconductor die 1000 may be selected based on performance requirements on the semiconductor die 1000. A pair of memory array regions 100 in a plane 300 may be laterally spaced apart along a first horizontal direction hd1 (which may be the word line direction). A second horizontal direction hd2 (which may be the bit line direction) can be perpendicular to the first horizontal direction hd1.

According to an aspect of the present disclosure, the size of the first memory array region 100A may differ from the size of the second memory array region 100B within a given plane. Specifically, the lateral extent of each of the first memory array region 100A and the second memory array region 100B may be the same along the second horizontal direction hd2 within a plane. However, the lateral extent of the first memory array region 100A within the plane 300 long the first horizontal direction hd1 can be greater than the lateral extent of the second memory array region 100B within the same plane 300. In one embodiment, each of the first memory array region 100A and the second memory array region 100B may have a respective rectangular area having a same width along the second horizontal direction hd2, and the lateral extent of the first memory array region 100A along the first horizontal direction hd1 can be greater than the lateral extent of the second memory array region 100B along the first horizontal direction hd1. Thus, the staircase region 200 within each plane 300 can be located off-center of the respective plane 300 along the first horizontal direction hd1 (i.e., the staircase region 200 is located closer to one end than to another end of the respective plane 300). For example, the staircase region 200 in the left plane 300A may be shifted toward the left edge of the die 1000, while the staircase region 200 in the right plane 300B may be shifted toward the right edge of the die 1000.

Each memory array region 100 includes first-tier alternating stacks of first insulating layers 132 and first electrically conductive layers 146 (which function as first word lines) and second-tier alternating stacks of second insulating layers 232 and second electrically conductive layers 246 (which function as second word lines). Each second-tier alternating stack (232, 246) overlies a respective first-tier alternating stack (132, 146), and each first-tier alternating stack (132, 146) underlies a respective second-tier alternating stack (232, 246). Each combination of a first-tier alternating stack (132, 146) and an overlying second-tier alternating stack (232, 246) may be laterally spaced apart from neighboring combinations of a respective first-tier alternating stack (132, 146) and a respective second-tier alternating stack (232, 246) by trench fill structures 76 that laterally extend along the first horizontal direction hd1.

The first exemplary structure can include an optional semiconductor material layer 110 that includes a single crystalline or polycrystalline semiconductor material, such as single crystalline silicon or polysilicon. In one embodiment, the semiconductor material layer 110 may be a substrate. Optionally, underlying dielectric material layers may be provided underneath the semiconductor material layer 110. In this case, the underlying dielectric material layers are referred to as lower-level dielectric material layers 760.

A first-tier alternating stack of first insulating layers 132 and first electrically conductive layers 146 is located over a substrate (which may include the semiconductor material layer 110 or another structure, such as a silicon wafer that underlies the semiconductor material layer 110) between each neighboring pair of trench fill structures 76. A first-tier retro-stepped dielectric material portion 165 overlies, and contacts, first stepped surfaces of the first-tier alternating stack (132, 146). A second-tier alternating stack of second insulating layers 232 and second electrically conductive layers 246 overlies the first-tier alternating stack (132, 146), and overlies a horizontal plane including a planar top surface of the first-tier retro-stepped dielectric material portion 165 between each neighboring pair of trench fill structures 76. A second-tier retro-stepped dielectric material portion 265 overlies, and contacts, second stepped surfaces of the second-tier alternating stack (232, 246). Vertical steps S of the first stepped surfaces and the second stepped surfaces laterally extend along the second horizontal direction hd2 (e.g., bit line direction).

Memory opening fill structures 58 can be located within each memory array region 100 (which includes a first memory array region 100A and a second memory array region 100B) between each neighboring pair of trench fill structures 76. The memory opening fill structures 58 can be located within memory openings that vertically extend through each layer within the first-tier alternating stack (132, 146) and the second-tier alternating stack (232, 246) that are located between a respective neighboring pair of trench fill structures 76.

Each memory opening fill structure 58 includes a respective memory stack structure, which includes a respective memory film and a respective vertical semiconductor channel. The memory openings and the memory opening fill structures 58 are formed in region in which each layer of a first-tier alternating stack and each layer of the second-tier alternating stack are present. For each area within which a continuous combination of a first-tier alternating stack (132, 146) and a second-tier alternating stack (232, 246) continuously laterally extends, first memory stack structures can be located within a respective first memory array region 100A and second memory stack structures can be located within a respective second memory array region 100B. The second memory array region 100B can be connected to the first memory array region 100A through a respective inter-array region 200, in which a first-tier retro-stepped dielectric material portion 165 and a second-tier retro-stepped dielectric material portion 265 are located.

A first-tier retro-stepped dielectric material portion 165 can be located between each neighboring pair of trench fill structures 76. Each first-tier retro-stepped dielectric material portion 165 overlies first stepped surfaces of a respective first-tier alternating stack (132, 146). Each first-tier retro-stepped dielectric material portion 165 can have a sidewall that laterally extends along the first horizontal direction hd1 and contacts a respective trench fill structure 76. The first stepped surfaces comprise vertical steps of the first-tier alternating stack (132, 146) that are laterally spaced apart along the first horizontal direction hd1 and vertically offset from each other.

A second-tier retro-stepped dielectric material portion 265 can be located between each neighboring pair of trench fill structures 76. Each second-tier retro-stepped dielectric material portion 265 overlies second stepped surfaces of a respective second-tier alternating stack (232, 246). Each second-tier retro-stepped dielectric material portion 265 can have a sidewall that laterally extends along the second horizontal direction hd1 and contacts a respective trench fill structure 76. The second stepped surfaces comprise vertical steps of the second-tier alternating stack (232, 246) that are laterally spaced apart along the first horizontal direction hd1 and vertically offset from each other. In one embodiment, each second-tier retro-stepped dielectric material portion 265 overlies, and contacts, a respective one of the first-tier retro-stepped dielectric material portions 165.

Backside trenches can laterally extend along the first horizontal direction hd1. Each backside trench can be filled with a trench fill structure 76, which may include a combination of a backside contact via structure and an insulating spacer that laterally surround the backside contact via structure. Alternatively, each trench fill structure 76 may consist of an insulating fill structure. Each contiguous combination of a first-tier alternating stack (132, 146) and an overlying second-tier alternating stack (232, 246) can be located between a neighboring pair of trench fill structure 76.

For each contiguous combination of a first-tier alternating stack (132, 146) and an overlying second-tier alternating stack (232, 246), a respective first trench fill structure 76 laterally extends along the first horizontal direction hd1 (e.g., word line direction) and contacts first sidewalls of the first-tier alternating stack (132, 146) and first sidewalls of the second-tier alternating stack (232, 246), and a second trench fill structure 76 laterally extends along the first horizontal direction hd1 and contacts second sidewalls of the first-tier alternating stack (132, 146) and second sidewalls of the second-tier alternating stack (232, 246). The first trench fill structure 76 can contact each layer within the first-tier alternating stack (132, 146) and the second-tier alternating stack (232, 246), and can contact a sidewall of the first-tier retro-stepped dielectric material portion 165. The second trench fill structure 76 can contact each layer within the first-tier alternating stack (132, 146) and the second-tier alternating stack (232, 246), and can be laterally spaced from the first-tier retro-stepped dielectric material portion 165.

A contact-level dielectric layer 280 can be provided over each second-tier alternating stack (232, 246). In one embodiment, first contact via structures 86A vertically extend through a second-tier retro-stepped dielectric material portion 265 and a first-tier retro-stepped dielectric material portion 165, and contact a respective one of the first electrically conductive layers 146. Second contact via structures 86B vertically extend through a second-tier retro-stepped dielectric material portion 265 and contact a respective one of the second electrically conductive layers 246.

For each contiguous combination of a first-tier alternating stack (132, 146) and an overlying second-tier alternating stack (232, 246), a second-tier retro-stepped dielectric material portion 265 overlies second stepped surfaces of the second-tier alternating stack (232, 246), and second contact via structures 86B vertically extend through the second-tier retro-stepped dielectric material portion 265 and contact a respective one of the second electrically conductive layers 246.

For each contiguous combination of a first-tier alternating stack (132, 146) and an overlying second-tier alternating stack (232, 246), first memory opening fill structures 58 can be located within a first memory array region 100A in which each layer of the first-tier alternating stack and each layer of the second-tier alternating stack are present. Second memory opening fill structures 58 can be located within a second memory array region 100B that is laterally offset along the first horizontal direction hd1 from the first memory array region 100A by the first-tier retro-stepped dielectric material portion 165 and the second-tier retro-stepped dielectric material portion 265. Each layer of the first-tier alternating stack (132, 146) and each layer of the second-tier alternating stack (232, 246) are present within the second memory array region 100B. At least a portion of the first electrically conductive layers 146 and at least a portion of the second electrically conductive layers 246 continuously extend from the first memory array region 100A to the second memory array region 100B through a strip-shaped connection region (e.g., a "bridge" region) 240 within an inter-array region 200 located between a trench fill structures 76 and the second-tier retro-stepped dielectric material portion 265 at the level of the second-tier alternating stack (232, 246), and between the trench fill structure 76 and the first-tier retro-stepped dielectric material portion 165 at the level of the first-tier alternating stack (132, 146).

Each combination of a first-tier alternating stack (132, 146) and an overlying second-tier alternating stack (232, 246) can be located between a respective neighboring pair of trench fill structures 76. Thus, for each combination of a first-tier alternating stack (132, 146) and an overlying second-tier alternating stack (232, 246), a neighboring combination of an additional first-tier alternating stack (132, 146) and an additional second-tier alternating stack (232, 246)

may be provided. A structure that is adjacent to each combination of a first-tier alternating stack (132, 146) and an overlying second-tier alternating stack (232, 246) can include an additional first-tier alternating stack of additional first insulating layers 132 and additional first electrically conductive layers 146 located over the substrate, an additional first-tier retro-stepped dielectric material portion 165 overlying additional first stepped surfaces of the additional first-tier alternating stack (132, 146), an additional second-tier alternating stack of additional second insulating layers 232 and additional second electrically conductive layers 246, additional memory opening fill structures 58 located within an additional memory array region 100B and vertically extending through each layer within the additional first-tier alternating stack (132, 146) and the additional second-tier alternating stack (232, 246), an additional second-tier retro-stepped dielectric material portion 265 overlying additional second stepped surfaces of the additional second-tier alternating stack (232, 246), and a trench fill structure 76 laterally extending along the first horizontal direction hd1 and contacting sidewalls of the first-tier alternating stack (132, 146), sidewalls of the second-tier alternating stack (232, 246), sidewalls of the additional first-tier alternating stack (132, 146), and sidewalls of the additional second-tier alternating stack (232, 246). The additional second-tier alternating stack (232, 246) overlies the additional first-tier alternating stack (132, 146) and overlies a horizontal plane including the planar top surface of the first-tier retro-stepped dielectric material portion 165.

Staircases including the first stepped surfaces and the second stepped surfaces of combinations of a first-tier alternating stack (132, 146) and an overlying second-tier alternating stack (232, 246) can ascend (i.e., rise) from the substrate along the first horizontal direction hd1, or along the opposite direction of the first horizontal direction hd1. In one embodiment, the direction of rise of the staircases can change for every other pair of combinations of a respective first-tier alternating stack (132, 146) and a respective second-tier alternating stack (232, 246). In other words, the direction of rise is staggered in adjacent alternating stacks that are separated along the second horizontal direction. For example, upon sequentially numbering each combination of a respective first-tier alternating stack (132, 146) and a respective second-tier alternating stack (232, 246) with positive integers N starting with 1, each (4N+1)-th combination and each (4N+2)-th combination of a respective first-tier alternating stack (132, 146) and a respective second-tier alternating stack (232, 246) can have stairs that rise along the first horizontal direction hd1, and each (4N+3)-th combination and each (4N+4)-th combination of a respective first-tier alternating stack (132, 146) and a respective second-tier alternating stack (232, 246) can have stairs that rise along the opposite direction of the first horizontal direction hd1. In this embodiment, a vertical distance between the first stepped surfaces and the substrate increases along the first horizontal direction hd1, a vertical distance between the second stepped surfaces and the substrate increases along the first horizontal direction hd1, a vertical distance between the additional first stepped surfaces and the substrate decreases along the first horizontal direction hd1, and a vertical distance between the additional second stepped surfaces and the substrate decreases along the first horizontal direction hd1.

In an alternative embodiment, the direction of rise of the staircases does not change for every other pair of combinations of a respective first-tier alternating stack (132, 146) and a respective second-tier alternating stack (232, 246). In other words, the direction of rise is the same (i.e., non-staggered) in adjacent alternating stacks that are separated along the second horizontal direction.

The inter-array region 200 includes strips of the first insulating layers 132, the first electrically conductive layers 146, the second insulating layers 232, and the second electrically conductive layers 246 located between each laterally neighboring pair of trench fill structures 76. The portions of the strips in the respective strip-shaped connection ("bridge") regions 240 of the inter-array regions 200 located adjacent to a respective first-tier retro-stepped dielectric material portion 165 and a respective second-tier retro-stepped dielectric material portion 265 have a narrower width along the second horizontal direction hd2 than portions of the alternating stacks (132, 146, 232, 246) located in the memory array regions 100, and portions of the strips located in the remaining portions of the inter array regions 200 outside of the respective strip-shaped connection ("bridge") regions 240. Each layer within the first-tier alternating stack (132, 146) and the second-tier alternating stack (232. 246) comprises a respective strip portion located within the inter-array region 200 and laterally extending continuously from the first memory array region 100A to the second memory array region 100B. Thus, each strip of the first insulating layers 132, the first electrically conductive layers 146, the second insulating layers 232, and the second electrically conductive layers 246 can continuously extend from the first memory array region 100A to the second memory array region 100B.

Figure 1E:
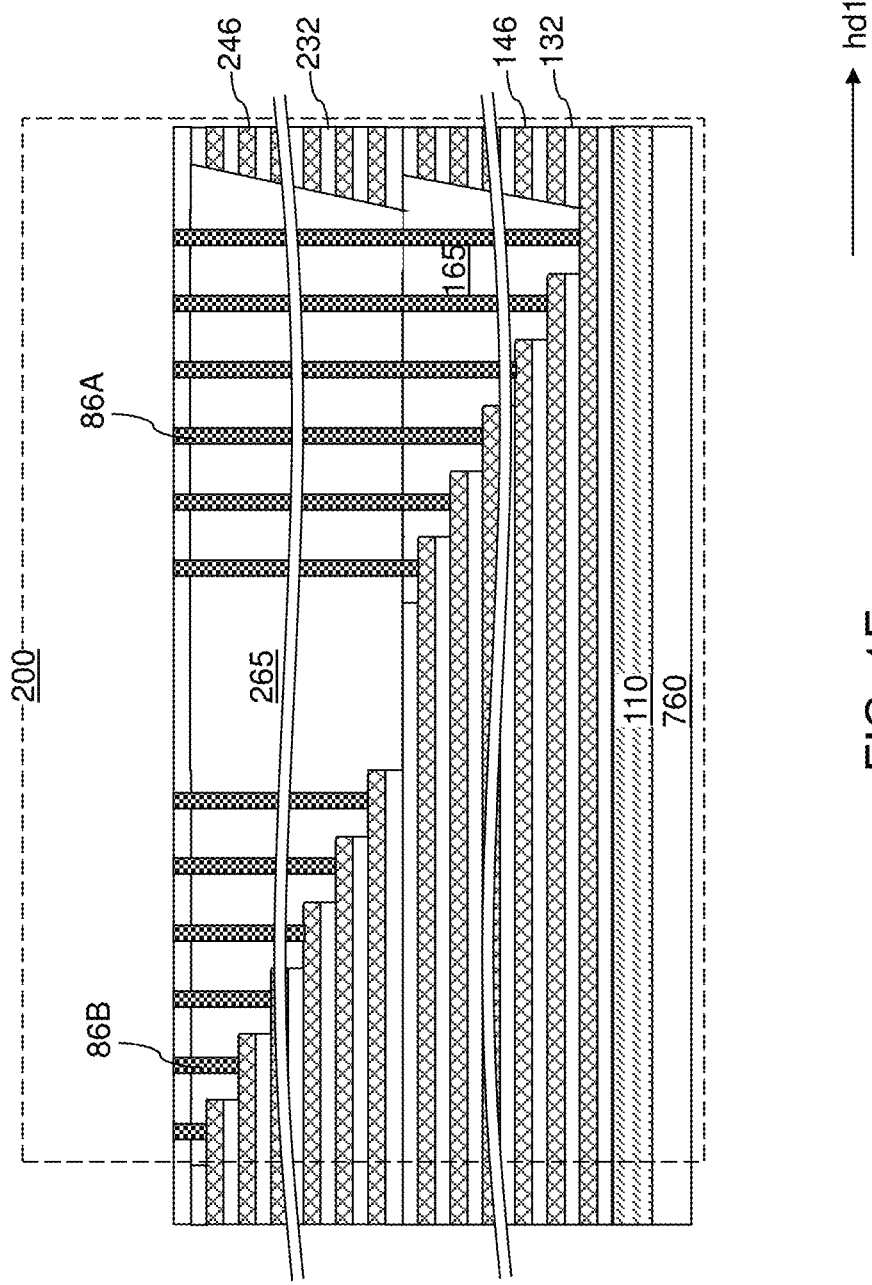
FIG. 1E is a schematic vertical cross-sectional view of a region of the first exemplary semiconductor die along the vertical plane E-E' of FIG. 1B.

Laterally-isolated vertical interconnection structures (484, 486) can be formed through the inter-array region 200. Each laterally-isolated vertical interconnection structure (484, 486) can include a through-memory-level conductive via structure 486 and a tubular insulating spacer 484 that laterally surrounds the conductive via structure 486. Each through-memory-level conductive via structure 486 can contact a lower-level metal interconnect structure 780 located in the lower-level dielectric material layers 760, as shown in FIG. 1E. The lower-level metal interconnect structures 780 can be embedded in the lower-level dielectric material layers 760, which are located between the first-tier alternating stack (132, 146) and a substrate (not shown) that can be provided underneath the lower-level dielectric material layers 760. The laterally-isolated vertical interconnection structures (484, 486) vertically extend through the strip portions of the first-tier alternating stack (132, 146) and the second-tier alternating stack (232, 246), and contact a respective one of the lower-level metal interconnect structures 780.

Drain contact via structures (not illustrated) can extend through the contact-level dielectric layer 280, and can contact an upper portion of a respective memory opening fill structure 58 (such as a drain region within the respective memory opening fill structure 58). Bit lines (not illustrated) can laterally extend along the second horizontal direction hd2, and can contact top surfaces of a respective subset of the drain contact via structures. Additional metal interconnect structures embedded in overlying dielectric material layers (not shown) may be employed to provide electrical connection among the various nodes of the three-dimensional memory device located in the semiconductor die 1000.

In one embodiment, upon sequentially numbering the trench fill structures 76 along the second horizontal direction hd2 with positive integers, each odd-numbered trench fill structure 76 contacts a respective pair of first-tier retro-stepped dielectric material potions 165 (and a respective pair of second-tier retro-stepped dielectric material portions 265) and each even-numbered trench fill structure 76 does not contact any of the first-tier retro-stepped dielectric material portions 165 (or any of the second-tier retro-stepped dielectric material portions 265).

Each trench fill structure 76 includes an insulating material portion that contacts sidewalls of a neighboring pair of alternating stacks (132, 146, 232, 246). In one embodiment, each insulating material portion may comprise an insulating spacer that laterally surrounds a contact via structure such as a backside contact via structure (not expressly shown). In another embodiment, each insulating material portion may comprise a dielectric wall structure which takes up the entire volume of the respective trench fill structure 76. In one embodiment, each sidewall of the first alternating stacks (132, 146) can be contacted by a sidewall of an insulating material portion of a respective one of the trench fill structures 76.

In one embodiment, each plane 300 within the first exemplary semiconductor die 100 includes a three-dimensional memory device, which includes alternating stacks of insulating layers (132, 232) and electrically conductive layers (146, 246). Each of the alternating stacks {(132, 146), (232, 246)} laterally extends along a first horizontal direction hd1 through a first memory array region 100A and a second memory array region 100B that are laterally spaced apart by an inter-array region 200. Each of the alternating stacks {(132, 146), (232, 246)} includes a set of stepped surfaces (i.e., a staircase) in the inter-array region (i.e., staircase region) 200. Each plane 300 within the first exemplary semiconductor die 1000 includes retro-stepped dielectric material portions (165, 265) overlying a respective set of stepped surfaces of the alternating stacks {(132, 146), (232, 246)}. Each plane 300 within the first exemplary semiconductor die 1000 includes clusters of memory stack structures located within memory opening fill structures 58. Each of the memory stack structures vertically extends through a respective one of the alternating stacks {(132, 146), (232, 246)} and is located within the first memory array region 100A or the second memory array region 100B. Each memory stack structure can include a respective vertical semiconductor channel and a vertical stack of memory elements (e.g., a memory film) located at levels of the electrically conductive layers (146, 246).

According to an aspect of the present disclosure, the first memory array region 100A has a first length along the first horizontal direction hd1. The second memory array region 100B has a second length along the first horizontal direction hd1 that is less than the first length.

The three-dimensional memory device can comprise layer contact via structures (e.g., word line contact via structures) (86A, 86B) vertically extending through a respective one of the retro-stepped dielectric material portions (165, 265) and contacting a respective one of the electrically conductive layers (146, 246). In one embodiment, for each pair of electrically conductive layers (146 or 246) located within a same alternating stack, a layer contact via structure (86A, 86B) that contacts an overlying electrically conductive layer is more proximal to the first memory array region 100A than a layer contact via structure that contacts an underlying electrically conductive layer is to the first memory array region 100A. In other words, the higher the bottom surface of a layer contact via structure (86A, 86B) is from a substrate (110, 760), the closer the layer contact via structure (86A, 86B) is to the first memory array region 100A. In other words, the staircases generally ascend (i.e., rise up) from the shorter second memory array region 100B towards the longer first memory array region 300 in each plane 300.

Electrical connection between each layer contact via structure (86A, 86B) and a portion of each electrically conductive layer (146 or 246) within the second memory array region 100B is provided by a strip portion of the electrically conductive layer (146 or 246) located in the bridge region 240 adjacent to and laterally offset along the second horizontal direction from a respective retro-stepped dielectric material portion (165, 265). The strip portion has a lesser width (i.e., narrower width) than the portions of the electrically conductive layer (146 or 246) located in the first memory array region 100A or in the second memory array region 100B. The portions of the electrically conductive layer (146 or 246) located in the first memory array region 100A or in the second memory array region 100B have a width along the second horizontal direction hd2 that is the same as a lateral distance between a neighboring pair of trench fill structures 76. In contrast, each strip portion of the electrically conductive layer (146 or 246) in the bridge region 240 has a width along the second horizontal direction hd2 that is the same as the difference between the lateral distance between a neighboring pair of trench fill structures 76 and the width of an adjoining retro-stepped dielectric material portion (165 or 265) along the second horizontal direction hd2. Each electrical connection between a layer contact via structure (86A, 86B) and a most proximal portion of the second memory array region 100B includes a narrow strip portion of an electrically conductive layer (146, 246) in the bridge region 240, while electrical connection between the layer contact via structure (86A, 86B) and a most proximal portion of the first memory array region 100A does not include any narrow strip portion of the electrically conductive layer (146, 246) because the first memory array region 100A is not separated from the layer contact via structures (86A, 86B) by the bridge region 240. This geometrical difference tends to increase the electrical resistance between the layer contact via structure (86A, 86B) and the most proximal portion of the second memory array region 100B relative to the electrical resistance between the layer contact via structure (86A, 86B) and the most proximal portion of the first memory array region 100A.

Figure 1F:
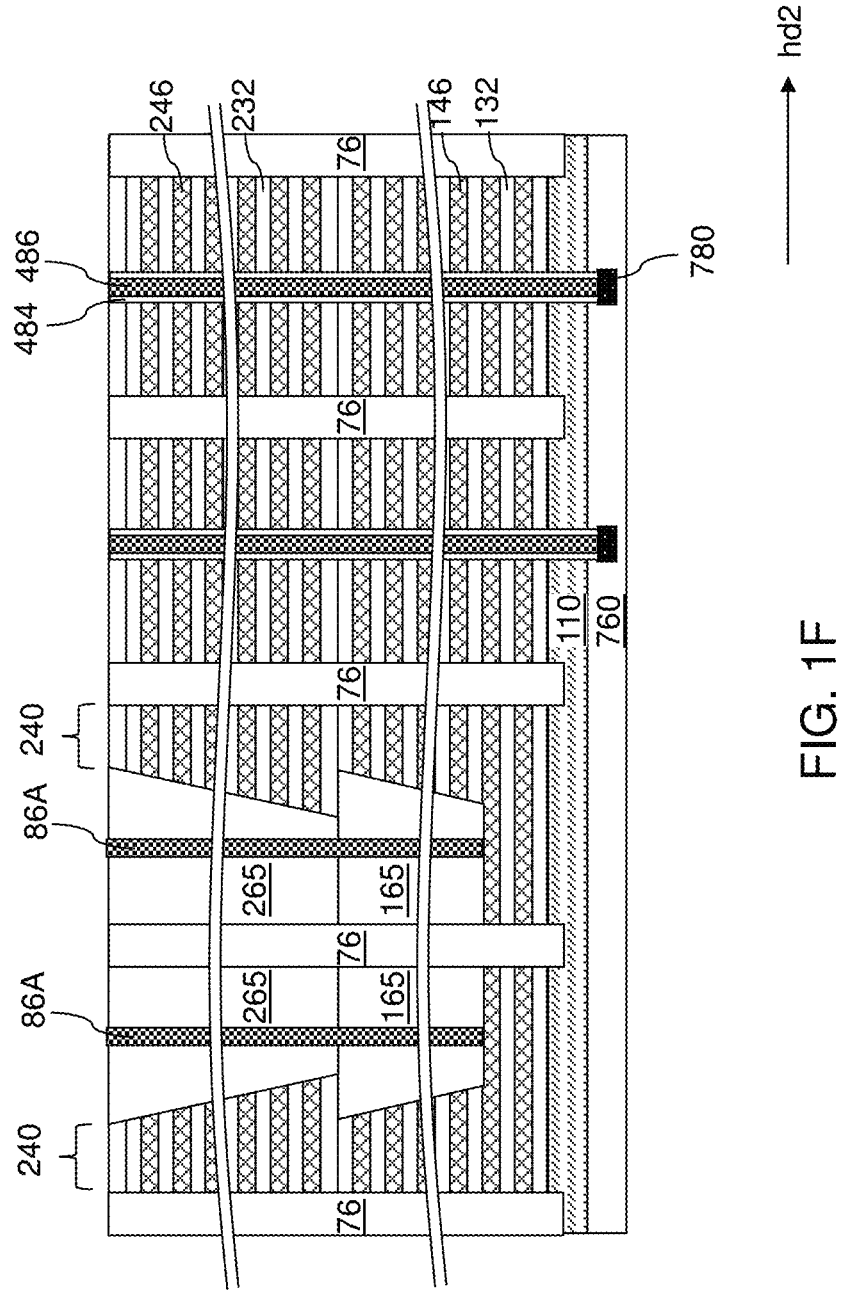
FIG. 1F is a schematic vertical cross-sectional view of a region of the first exemplary semiconductor die along the vertical plane F-F' of FIG. 1B.

Generally, each of the sidewall of the retro-stepped dielectric material portion (165, 265) laterally extending along the first horizontal direction hd1 has a tapered sidewall such that a bottom portion of each retro-stepped dielectric material portion (165 or 265) has a lesser (i.e., narrower) width than a top portion of each retro-stepped dielectric material portion (166 or 265), as illustrated in FIG. 1F. Thus, the effect of the increase in the electrical resistance due to the presence of the narrow strip portion of an electrically conductive layer (146 or 246) in the bridge region 240 between a layer contact via structure (86A, 86B) and a most proximal portion of the second memory array region 100B tends to increases with a vertical distance from the substrate (760, 110) for the set of all first electrically conductive layers 146, and for the set of all second electrically conductive layers 246.

Further, the length of the strip portions of the electrically conductive layers (146, 246) is greater for the second electrically conductive layers 246 than for the first electrically conductive layers 146. For this reason, the greatest electrical resistance between a layer contact via structure (86A, 86B) and a portion of an electrically conductive layer (146, 246) at a proximal portion of a memory array region (100A, 100B) occurs for a topmost second layer contact via structure 86B that contacts a topmost electrically conductive layer, i.e., a topmost second electrically conductive layer 246.

According to an aspect of the present disclosure, placing the inter-array region 200 off-center of the plane 200, which leads to asymmetric sizing of the first and second memory array regions (100A, 100B) compensates for the resistance differential, i.e., the difference between the electrical resistance between the topmost second layer contact via structure 86B and a portion of the topmost second electrically conductive layer located at a proximal end of the second memory array region 100B relative to the electrical resistance between the topmost second layer contact via structure 86B and a portion of the topmost second electrically conductive layer located at a proximal end of the first memory array region 100A. The highest resistance path for word line portions of the electrically conductive layers (146, 246) in the second memory array region 100B and a layer contact via structure (86A, 86B) is provided between the word line portion of the topmost second electrically conductive layer 246 at the distal end of the second memory array region 100B and the topmost second layer contact via structure 86B that contacts the topmost second electrically conductive layer 246.

The highest resistance path for word line portions of the electrically conductive layers (146, 246) in the first memory array region 100A and a layer contact via structure (86A, 86B) is provided between the word line portion of the bottommost first electrically conductive layer 146 at the distal end of the first memory array region 100A and the bottommost first layer contact via structure 86A that contacts the bottommost first electrically conductive layer 146.

In one embodiment, the off-center placement of the inter-array region and the corresponding difference in the lengths of the memory array regions (100A, 100B) along the first horizontal direction hd1 may be selected as follows. If the total length of a given electrically conductive layer (e.g., word line) (146, 246) is set to one arbitrary unit, then the resistance between a layer contact via structure (86A, 86B) in the inter-array region 200 and the end of the word line at the end of the second memory array region 100B at the edge of the plane 300 is approximately $xR_{wlb}+R_{br}$, where $R_{wlb}$ is the resistance of the word line in the second memory array region 100B, $R_{br}$ is the resistance of the word line in the bridge region 240, and x is the fraction of the total length (i.e., fraction of one arbitrary unit) of the word line located in the second memory array region 100B. In contrast, the resistance between a layer contact via structure (86A, 86B) in the inter-array region 200 and the end of the word line at the end of the first memory array region 100A at the edge of the plane 300 is approximately $(1-x)R_{wla}$, where $R_{wla}$ is the resistance of the word line in the first memory array region 100A. Thus, by selecting a value of x that is less than 0.5, such as 0.1 to 0.45, the resistance of each word line in the first and second memory array regions can be about equal (e.g., within 10%, such as 5% of each other).

Thus, in one embodiment, the off-center placement of the inter-array region and the corresponding difference in the lengths of the memory array regions (100A, 100B) along the first horizontal direction hd1 may be selected such that the electrical resistance of a portion of the topmost second electrically conductive layer 246 within the first memory array region 100A that provides an additional length along the first horizontal direction hd1 relative to the portion of the topmost second electrically conductive layer 246 within the second memory array region 100B such that the additional electrical resistance provided along the first horizontal direction hd1 (provided by the portion of the second topmost electrically conductive layer 246 that provides the additional length) is the same as, or is approximately the same as, the resistance differential less the electrical resistance between a bottommost layer contact via structure (i.e., the bottommost first layer contact via structure 86A) and a most proximal portion of a bottommost first electrically conductive layer in the first memory array region 100A.

This configuration of an embodiment of the present disclosure provides the same resistance, or about the same resistance (e.g. within 10% such as 5%), between the highest resistance paths between the layer contact via structures (86A, 86B) and a most distal portion of the electrically conductive layers (146, 246) in the second memory array region 100B and between the layer contact via structures (86A, 86B) and a most distal portion of the electrically conductive layers (146, 246) in the first memory array region 100A. Thus, two values of resistance for the electrically conductive paths providing the highest resistance values between a layer contact via structure (86A, 86B) and most distal portions of the electrically conductive layer (146, 246) are equalized according to an embodiment of the present disclosure. Thus, the operational speed of word lines, as limited by RC delays, between the first memory array region 100A and the second memory array region 100B can be equalized to provide uniform operational speed.

In one embodiment of the present disclosure, the first length of the first memory array region 100A along the first horizontal direction hd1 can be greater than the second length of the second memory array region 100B along the first horizontal direction hd1 at least by one half of a length of the inter-array region 200 along the first horizontal direction hd1. In one embodiment, the first length can be greater than the second length at least by the length of the inter-array region 200 along the first horizontal direction hd1.

In one embodiment, each electrically conductive layer (146, 246) within the alternating stacks {(132, 146), (232, 246)} has a respective bridge (e.g., indentation) region 240 having a respective strip width within the inter-array region 200, and has a respective uniform width greater than the strip width in the first memory array region 100A, the second memory array region 100B, and portions of the inter-array region 200 located outside the bridge region.

In one embodiment, the alternating stacks {(132, 146), (232, 246)} are laterally spaced apart along the second horizontal direction hd2 by line trenches (such as backside trenches) that laterally extend along the first horizontal direction hd1. The line trenches are filled with line trench fill structures 76 having dielectric surfaces (such as surfaces of insulating spacers or dielectric wall structures) that contact sidewalls of the alternating stacks {(132, 146), (232, 246)}. Upon sequentially numbering the line trench fill structures 76 with positive integers along the second horizontal direction hd1, odd-numbered line trench fill structures contact a respective pair of retro-stepped dielectric material portions (165, 265) (which are located on either side of a respective odd-numbered line trench fill structure), and even-numbered line trench fill structures do not contact any retro-stepped dielectric material portion (165, 265), or even-numbered line trench fill structures contact a respective pair of retro-stepped dielectric material portions (165, 265) and odd-numbered line trench fill structures do not contact any retro-stepped dielectric material portion (165, 265).

In one embodiment, each of the alternating stacks {(132, 146}, (232, 246)} has a same value for the respective uniform width along the second horizontal direction hd2.

According to an aspect of the present disclosure a length adjustment unit can be employed as a parameter for determining a difference between the first length of the first memory array region 100A long the first horizontal direction hd1 and the second length of the second memory array region 100B along the first horizontal direction hd.1. The length adjustment unit can be a maximum length of the bridge region 240 (which may equal to length of each retro-stepped dielectric material portion (165, 265) (such as the length of the second-tier retro-stepped dielectric material portion 265)) along the first horizontal direction hd1 times a ratio of the same value for the respective uniform width to a minimum strip width of the strip widths of the electrically conductive layers (146, 246). In one embodiment, a difference between the first length and the second length is in a range from 0.8 times a length adjustment unit to 1.2 times the length adjustment unit.

In one embodiment, each of the alternating stacks {(132, 146}, (232, 246)} comprises a vertical stack of a first-tier alternating stack (132, 146) of first insulating layers 132 and first electrically conductive layers 146 and a second-tier alternating stack (232, 246) of second insulating layers 232 and second electrically conductive layers 246 that overlie the first-tier alternating stack (132, 146). Strip widths of the first electrically conductive layers 146 decrease with a respective vertical distance from the substrate (760, 110). Strip widths of the second electrically conductive layers 246 decrease with a respective vertical distance from the substrate (760, 110). A bottommost second electrically conductive layer 246 within the second-tier alternating stack (232, 246) has a greater strip width than a topmost first electrically conductive layer 146 within the first-tier alternating stack (132, 146).

In one embodiment, the three-dimensional memory device comprises a memory plane 300, and the inter-array region 200 is offset from a center of the memory plane 300 toward the second memory array region 100B such that the second memory array region 100B has the second length along the first horizontal direction that is less than the first length of the first memory array region 100A along the first horizontal direction hd1.

In one embodiment, a total length of a first electrically conductive layer 146 or 246 of the electrically conductive layers (146, 246) equals to one arbitrary unit. A resistance of the first electrically conductive layer between its corresponding layer contact via structure 86A or 86B and an end of the first electrically conductive layer at an end of the second memory array region 100B at a first edge of the plane 300 equals to $xR_{wlb}+R_{br}$, where $R_{wlb}$ is a resistance of the first electrically conductive layer in the second memory array region, $R_{br}$ is a resistance of the first electrically conductive layer in the bridge region 240, and x is the fraction of the total length of the first electrically conductive layer located in the second memory array region 100B. A resistance of the first electrically conductive layer 146 or 246 between its corresponding layer contact via structure 86A or 86B and an end of the electrically conductive layer an end of the first memory array region 100A at a second edge of the plane 300 equals to $(1-x)R_{wla}$, where $R_{wla}$ is a resistance of the first electrically conductive layer in the first memory array region 100A, and x is less than 0.5.

In one embodiment, each of the memory stack structures within the memory opening fill structures 58 comprises a vertical stack of memory elements located at levels of the electrically conductive layers (146, 246) and a vertical electrical current path (such as a vertical semiconductor channel 60) that is electrically connected to a respective overlying metal interconnect structure (such as a bit line) and the inter-array region 200 is free of any memory stack structure that is electrically contacted by any metal interconnect structure (such as a bit line).

The first exemplary semiconductor die 1000 of FIGS. 1A-1E can be manufactured employing a sequence of processing steps. Referring to FIG. 2, a first exemplary structure for formation of the structure of FIGS. 1A-1E is illustrated in a vertical cross sectional view along the first horizontal direction hd1 (e.g., the word line direction) according to the first embodiment of the present disclosure. The structure shown in FIG. 2 is provided after formation of semiconductor devices 720 on a substrate semiconductor layer 9 (which is provided at least within an upper portion of a substrate 8), lower level dielectric layers 760, lower-level metal interconnect structures 780 (schematically represented by a dotted area including physical implementations of the lower level metal interconnect structures) that are embedded in the lower-level dielectric layers 760, a semiconductor material layer 110, and a first vertically alternating sequence of first continuous insulating layers 132L and first continuous sacrificial material layers 142L. The substrate semiconductor layer 9 may comprise a top portion (e.g., a doped well) of a substrate 8, such as silicon wafer, or a semiconductor layer located over a substrate, such as a silicon on insulator substrate or a semiconductor substrate. The semiconductor devices 720 may include field effect transistors that are formed over a top surface of the substrate 8. The lower-level dielectric layers 760 may be interconnect-level dielectric material layers that embed the lower-level metal interconnect structures 780.

As used herein, a vertically alternating sequence refers to a sequence of multiple instances of a first element and multiple instances of a second element that is arranged such that an instance of a second element is located between each vertically neighboring pair of instances of the first element, and an instance of a first element is located between each vertically neighboring pair of instances of the second element.

The first continuous insulating layers 132L can be composed of the first material, and the first continuous sacrificial material layers 142L can be composed of the second material, which is different from the first material. Each of the first continuous insulating layers 132L is an insulating layer that continuously extends over the entire area of the substrate 8, and may have a uniform thickness throughout. Each of the first continuous sacrificial material layers 142L includes is a sacrificial material layer that includes a dielectric material and continuously extends over the entire area of the substrate 8, and may have a uniform thickness throughout. Insulating materials that may be used for the first continuous insulating layers 132L include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first continuous insulating layers 132L may be silicon oxide.

The second material of the first continuous sacrificial material layers 142L is a dielectric material, which is a sacrificial material that may be removed selective to the first material of the first continuous insulating layers 132L. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The second material of the first continuous sacrificial material layers 142L may be subsequently replaced with electrically conductive electrodes which may function, for example, as control gate electrodes of a vertical NAND device. In one embodiment, the first continuous sacrificial material layers 142L may be material layers that comprise silicon nitride.

Generally, a vertically alternating sequence of unit layer stacks over a substrate. Each of the unit layer stacks comprises a first insulating layer (such as a first continuous insulating layer 132L) and a first spacer material layer (such as a first continuous sacrificial material layer 142L). Generally, the first spacer material layers are formed as, or are subsequently replaced with, first electrically conductive layers. While the present disclosure is described employing an embodiment in which the first spacer material layers are formed as first continuous sacrificial material layers 142L that are subsequently replaced with first electrically conductive layers, embodiments are expressly contemplated herein in which the first spacer material layers are formed as first electrically conductive layers. In such embodiments, steps for replacing the material of the first spacer material layers with an electrically conductive material can be omitted.

Figure 3A:
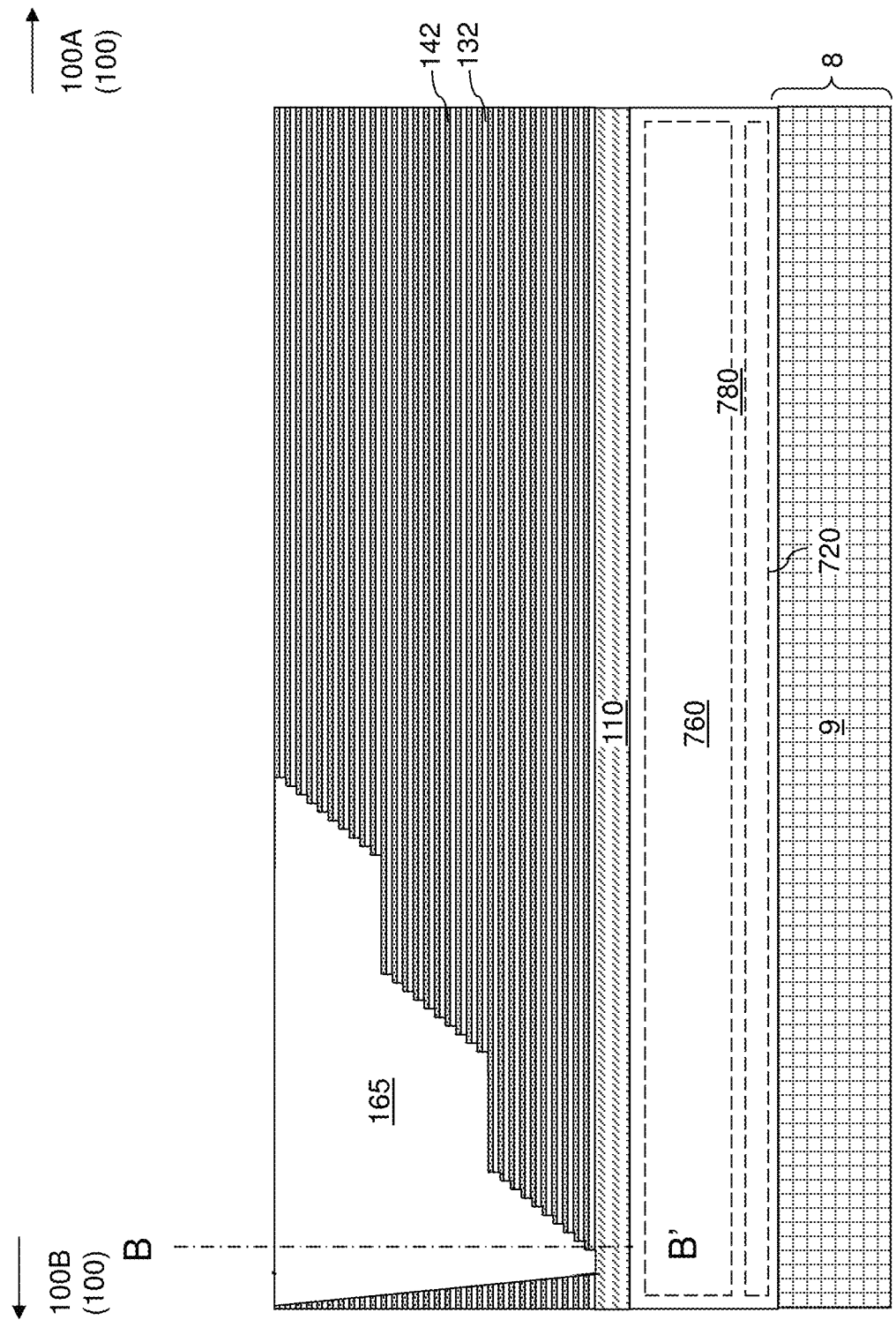
FIG. 3A is a vertical cross-sectional view of the first exemplary structure along the first horizontal direction after formation of a first-tier retro-stepped dielectric material portion according to the first embodiment of the present disclosure.
Figure 3B:
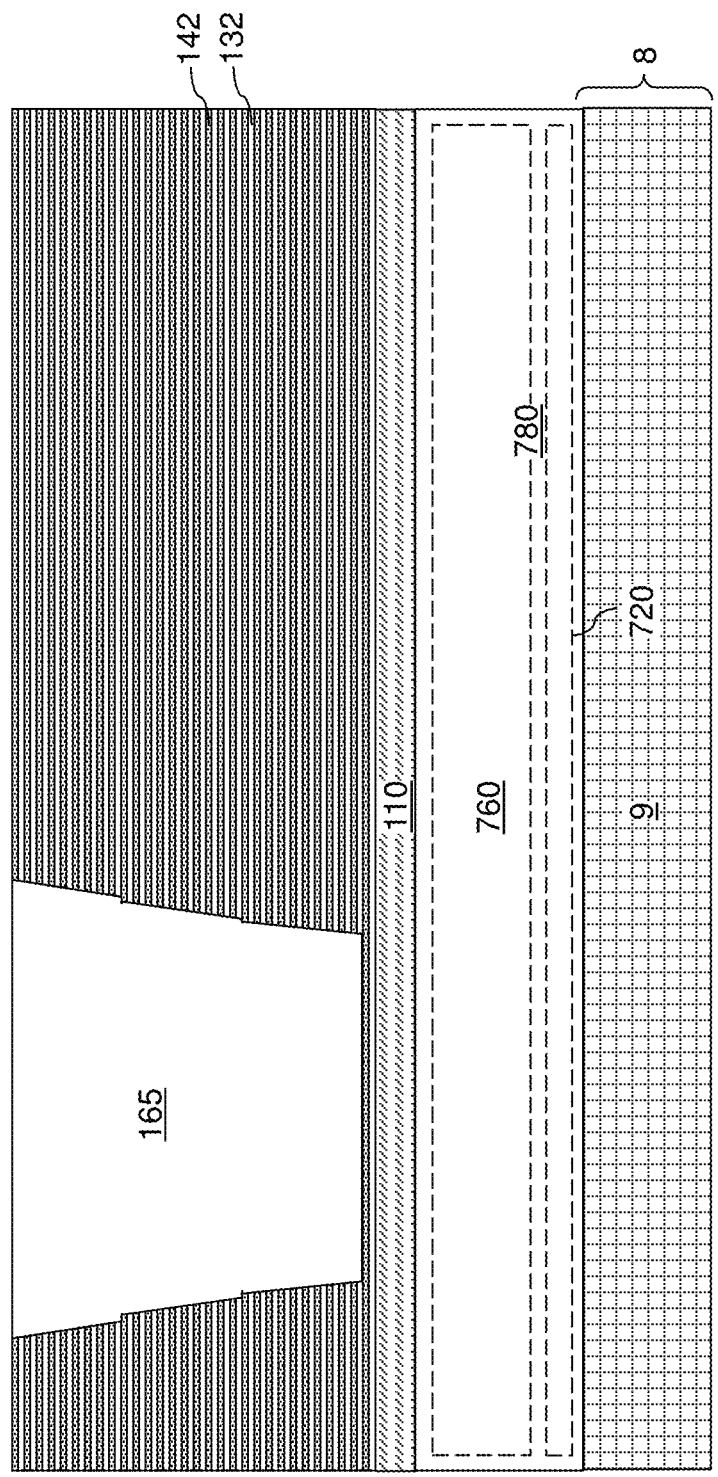
FIG. 3B is a vertical cross-sectional view of the first exemplary structure along a vertical plane B-B' of FIG. 3A.

Referring to FIGS. 3A and 3B, first stepped surfaces can be formed within the staircase regions of the inter-array region 200 which will be filled with the first-tier retro-stepped dielectric material portions 165. For example, a combination of a sacrificial hard mask layer and a trimming mask layer may be employed to form the first stepped surfaces. In one embodiment, a row of multiple first staircase regions can be formed within each area that corresponds to a combination of the area of a laterally-neighboring pair of first-tier retro-stepped dielectric material portions 165 and an intervening area. In this case, the multiple first staircase regions can be subsequently vertically offset by different depths by subsequently performing area recess etch processes.

In an illustrative example, $2^M$ sets of first stepped surfaces can be formed within a combination of the area of a laterally-neighboring pair of first-tier retro-stepped dielectric material portions 165 and an intervening area. M can be an integer in a range from 1 to 8. Each set of first stepped staircases may include P steps such that sidewalls of P first continuous spacer material layers are physically exposed with lateral offsets. P may be an integer from 2 to 64. M area recess etch processes can be performed such that each area recess etch process vertically recesses P times $2^i$ sets of a first continuous insulating layer 132L and a first continuous sacrificial material layer 142L, in which i is a different integer from 0 to (M−1). A total of up to $2^M \times P$ stepped surfaces can be formed for the first vertically alternating sequence of the first continuous insulating layers 132L and the first continuous sacrificial material layers 142L. The total number of the stepped surfaces within each continuous cavity overlying the first stepped surfaces can be the same as the total number of the first continuous sacrificial material layers 142L in the first vertically alternating sequence (132L, 142L).

A first dielectric fill material (such as undoped silicate glass (i.e., silicon oxide) or a doped silicate glass) can be deposited in each first continuous retro-stepped cavity. The first dielectric fill material can be planarized to remove excess portions of the first dielectric fill material from above the horizontal plane including the topmost surface of the first vertically alternating sequence (132L, 142L). Each remaining portion of the first dielectric fill material that fills a respective first continuous retro-stepped cavity constitutes a first-tier retro-stepped dielectric material portion 165. Generally, the first-tier retro-stepped dielectric material portions 165 can be formed in inter-array regions 200 located between a respective first memory array region 100A and a respective second memory array region 100B that are laterally spaced apart along the first horizontal direction hd1.

Figure 4:
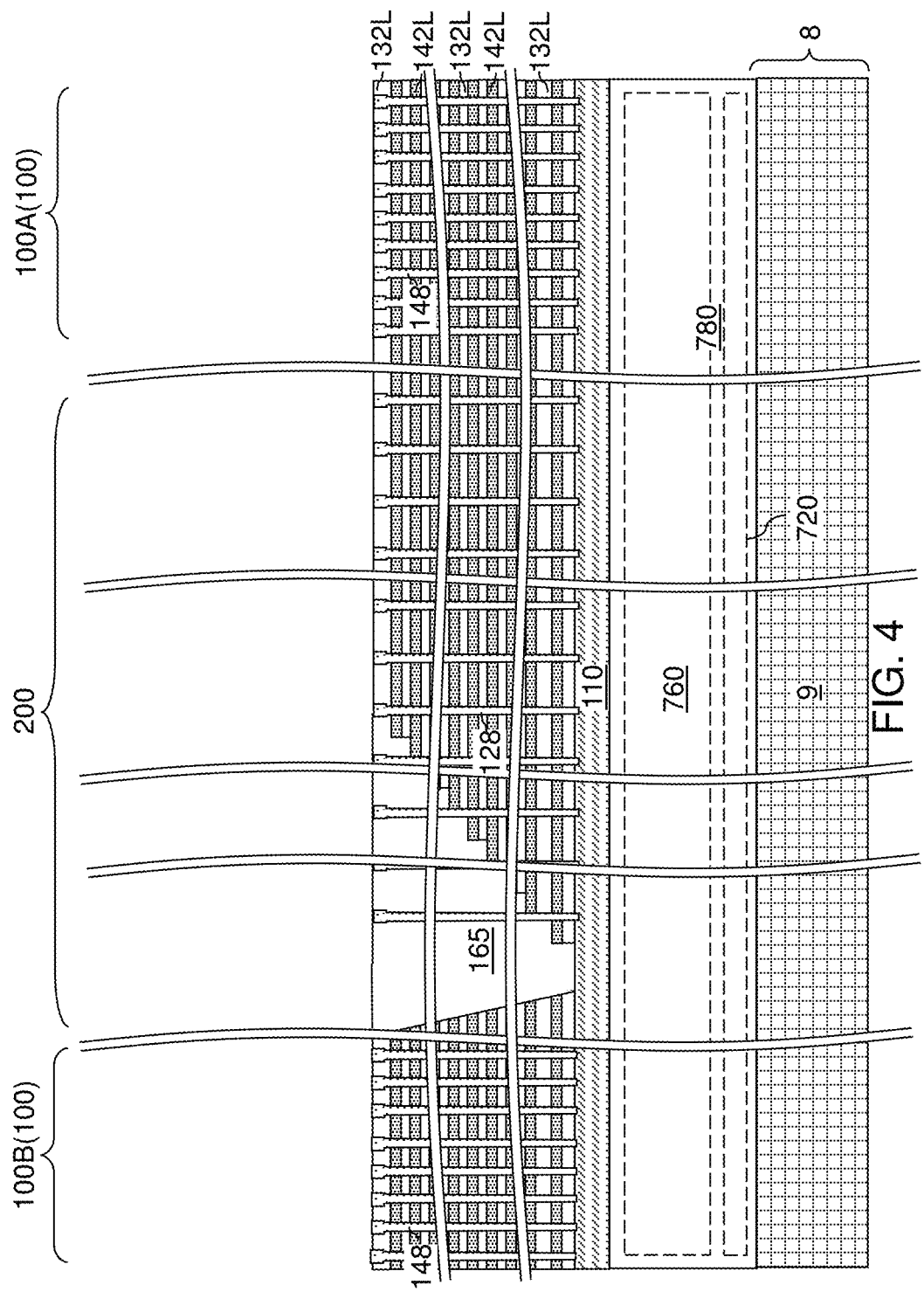
FIG. 4 is a vertical cross-sectional view of the first exemplary structure after formation of first-tier openings and sacrificial first-tier opening fill portions according to the first embodiment of the present disclosure.

Referring to FIG. 4, various first-tier openings may be formed through the first vertically alternating sequence (132L, 142L) and into the semiconductor material layer 110. A photoresist layer (not shown) may be applied over the first vertically alternating sequence (132L, 142L), and may be lithographically patterned to form various openings therethrough. The pattern of openings in the photoresist layer may be transferred through the first vertically alternating sequence (132L, 142L) and into the semiconductor material layer 110 by a first anisotropic etch process to form the various first-tier openings concurrently, i.e., during the first isotropic etch process. The various first-tier openings may include first-tier memory openings formed in the memory array regions 100 and first-tier support openings formed in the inter-array region 200. Each cluster of first-tier memory openings may be formed as a two-dimensional array of first-tier memory openings. The first-tier support openings are openings that are formed in the inter-array region 200, and are subsequently employed to form support pillar structures. A subset of the first-tier support openings may be formed through a respective horizontal surface of the first stepped surfaces.

Sacrificial first-tier opening fill portions (148, 128) may be formed in the various first-tier openings. For example, a sacrificial first-tier fill material is deposited concurrently deposited in each of the first-tier openings. The sacrificial first-tier fill material includes a material that may be subsequently removed selective to the materials of the first continuous insulating layers 132L and the first continuous sacrificial material layers 142L. In one embodiment, the sacrificial first-tier fill material may include a semiconductor material such as silicon (e.g., a-Si or poly silicon), a silicon-germanium alloy, germanium, a III-V compound semiconductor material, or a combination thereof. Optionally, a thin etch stop liner (such as a silicon oxide layer or a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In another embodiment, the sacrificial first-tier fill material may include a silicon oxide material having a higher etch rate than the materials of the first continuous insulating layers 132L. For example, the sacrificial first-tier fill material may include borosilicate glass or porous or non-porous organosilicate glass having an etch rate that is at least 100 times higher than the etch rate of densified TEOS oxide (i.e., a silicon oxide material formed by decomposition of tetraethylorthosilicate glass in a chemical vapor deposition process and subsequently densified in an anneal process) in a 100:1 dilute hydrofluoric acid. In this case, a thin etch stop liner (such as a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In yet another embodiment, the sacrificial first-tier fill material may include carbon-containing material (such as amorphous carbon or diamond-like carbon) that may be subsequently removed by ashing, or a silicon-based polymer that may be subsequently removed selective to the materials of the first vertically alternating sequence (132L, 142L).

Portions of the deposited sacrificial material may be removed from above the topmost layer of the first vertically alternating sequence (132L, 142L), such as from above the topmost first continuous insulating layer 132L. For example, the sacrificial first-tier fill material may be recessed to a top surface of the topmost first continuous insulating layer 132L using a planarization process. The planarization process may include a recess etch, chemical mechanical planarization (CMP), or a combination thereof. The top surface of the topmost first continuous insulating layer 132L may be used as an etch stop layer or a planarization stop layer.

Remaining portions of the sacrificial first-tier fill material comprise sacrificial first-tier opening fill portions (148, 128). Specifically, each remaining portion of the sacrificial material in a first-tier memory opening constitutes a sacrificial first-tier memory opening fill portion 148. Each remaining portion of the sacrificial material in a first-tier support opening constitutes a sacrificial first-tier support opening fill portion 128. The various sacrificial first-tier opening fill portions (148, 128) are concurrently formed, i.e., during a same set of processes including the deposition process that deposits the sacrificial first-tier fill material and the planarization process that removes the first-tier deposition process from above the first vertically alternating sequence (132L, 142L) (such as from above the top surface of the topmost first continuous insulating layer 132L). The top surfaces of the sacrificial first-tier opening fill portions (148, 128) may be coplanar with the top surface of the topmost first continuous insulating layer 132L. Each of the sacrificial first-tier opening fill portions (148, 128) may, or may not, include cavities therein. The set of all structures located between the bottommost surface of the first vertically alternating sequence (132L, 142L) and the topmost surface of the first vertically alternating sequence (132L, 142L) or embedded within the first vertically alternating sequence (132L, 142L) constitutes a first-tier structure.

Figure 5:
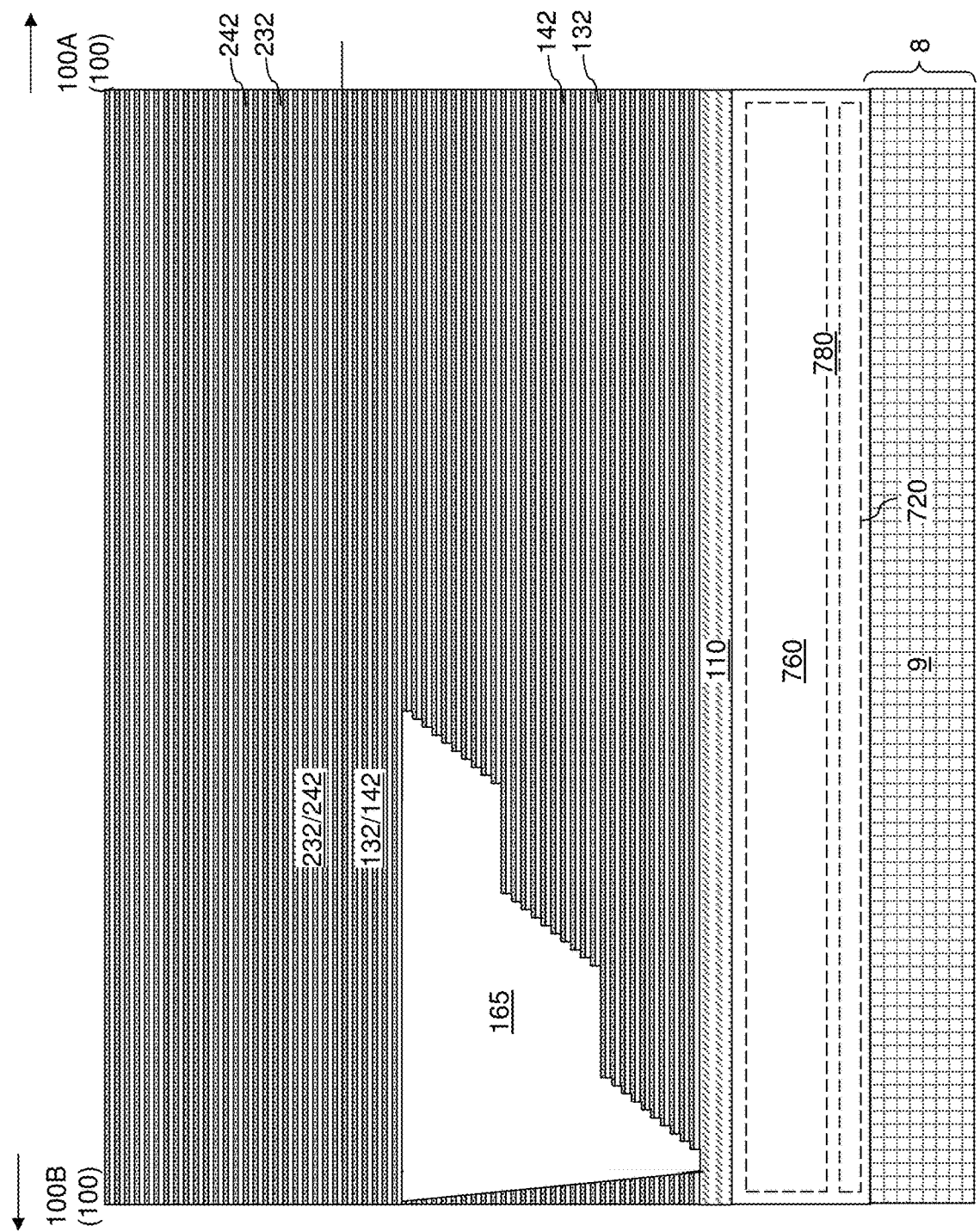
FIG. 5 is a vertical cross-sectional view of the first exemplary structure after formation of a second vertically alternating sequence of second continuous insulating layers and second continuous sacrificial material layers according to the first embodiment of the present disclosure.

Referring to FIG. 5, a second vertically alternating sequence of second continuous insulating layers 232L and second continuous sacrificial material layers 242L can be formed. Each of the second continuous insulating layers 232L is an insulating layer that continuously extends over the entire area of the substrate 8, and may have a uniform thickness throughout. Each of the second sacrificial material layers 242L includes is a sacrificial material layer that includes a dielectric material and continuously extends over the entire area of the substrate 8, and may have a uniform thickness throughout. The second continuous insulating layers 232L can have the same material composition and the same thickness as the first continuous insulating layers 132L. The second sacrificial material layers 242L can have the same material composition and the same thickness as the first continuous sacrificial material layers 142L.

Generally, at least one additional vertically alternating sequence of additional continuous insulating layers and additional continuous sacrificial material layers can be optionally formed over the first vertically alternating sequence (132L, 142L) and the first-tier retro-stepped dielectric material portions 165.

Referring to FIGS. 6A, 6B, 7A, 7B, and 8, second stepped surfaces can be formed within the staircase regions of the inter-array region 200 which will be filled with the second-tier retro-stepped dielectric material portions 265. For example, a combination of a sacrificial hard mask layer and a trimming mask layer may be employed to form the second stepped surfaces. In one embodiment, a row of multiple second staircase regions can be formed within each area that corresponds to a combination of the area of a laterally-neighboring pair of second-tier retro-stepped dielectric material portions 265 and an intervening area. In this case, the multiple second staircase regions can be subsequently vertically offset by different depths by subsequently performing area recess etch processes.

In an illustrative example, $2^N$ sets of second stepped surfaces can be formed within a combination of the area of a laterally-neighboring pair of second-tier retro-stepped dielectric material portions 265 and an intervening area. N can be an integer in a range from 2 to 8. Each set of second stepped staircases may include P steps such that sidewalls of Q second continuous spacer material layers are physically exposed with lateral offsets. Q may be an integer from 2 to 64. M area recess etch processes can be performed such that each area recess etch process vertically recesses Q times $2^j$ sets of a second continuous insulating layer 232L and a second continuous sacrificial material layer 242L, in which j is a different integer from 0 to (N−1). A total of up to $2^N \times Q$ stepped surfaces can be formed for the second vertically alternating sequence of the second continuous insulating layers 232L and the second continuous sacrificial material layers 242L. The total number of the stepped surfaces within each continuous cavity overlying the second stepped surfaces can be the same as the total number of the second continuous sacrificial material layers 242L in the second vertically alternating sequence (132L, 242L).

A second dielectric fill material (such as undoped silicate glass (i.e., silicon oxide) or a doped silicate glass) can be deposited in each second continuous retro-stepped cavity. The second dielectric fill material can be planarized to remove excess portions of the second dielectric fill material from above the horizontal plane including the topmost surface of the second vertically alternating sequence (232L, 242L). Each remaining portion of the second dielectric fill material that fills a respective second continuous retro-stepped cavity constitutes a second-tier retro-stepped dielectric material portion 265.

Generally, a second-tier structure is formed, which comprises a second vertically alternating sequence of second continuous insulating layers 232L and second continuous sacrificial material layers 242L and second-tier retro-stepped dielectric material portions 265 overlying second stepped surfaces of the second vertically alternating sequence that are located in the inter-array regions 200.

Figure 9:
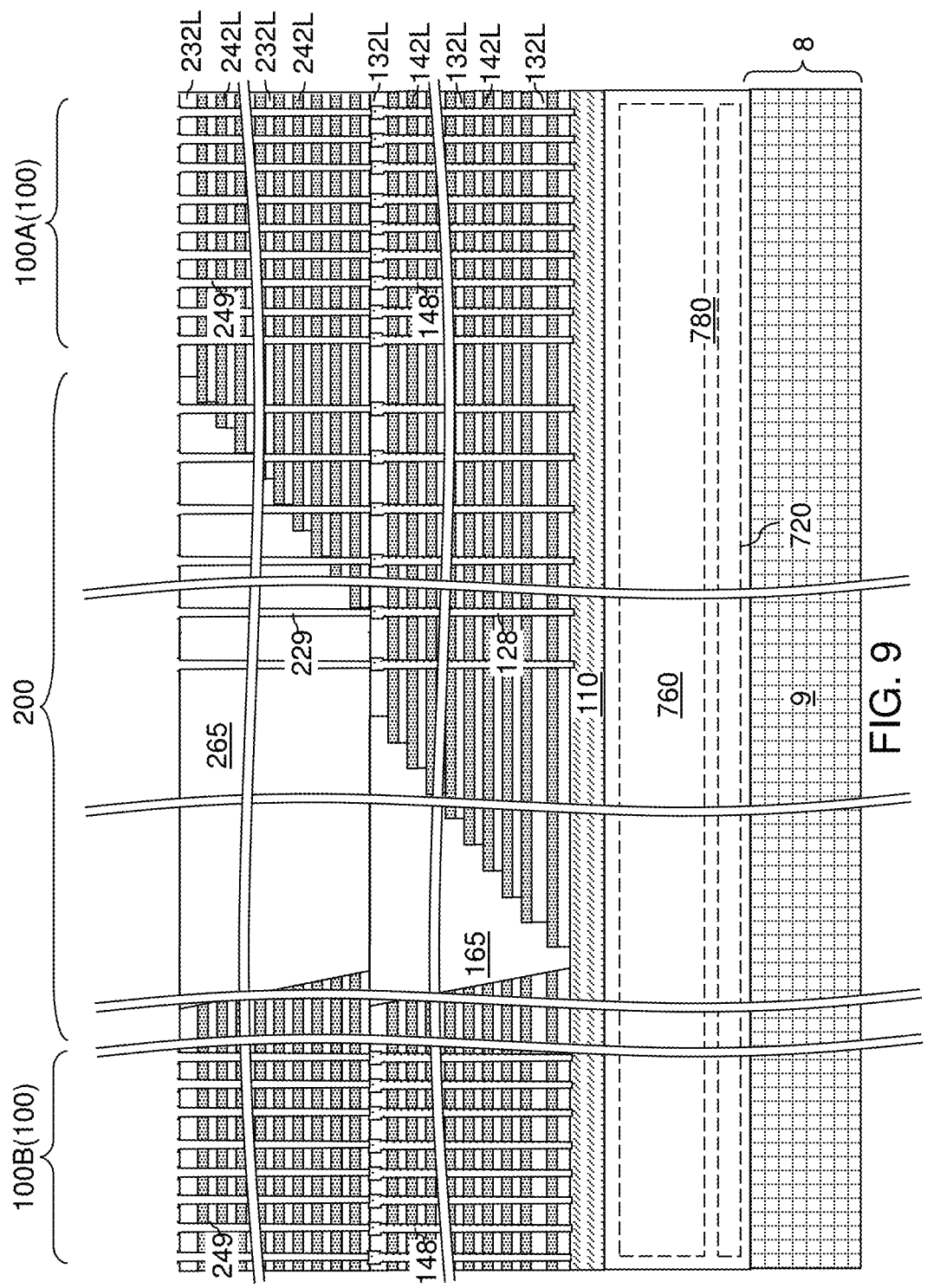
FIG. 9 is a vertical cross-sectional view of the first exemplary structure after formation of second-tier openings through the second vertically alternating sequence according to the first embodiment of the present disclosure.

Referring to FIG. 9, various second-tier openings (249, 229) may be formed through the second vertically alternating sequence (232L, 242L) and over the sacrificial first-tier opening fill portions (148, 128). A photoresist layer (not shown) may be applied over the second vertically alternating sequence (232L, 242L), and may be lithographically patterned to form various openings therethrough. The pattern of openings in the photoresist layer may be transferred through the second vertically alternating sequence (232L, 242L) to form the various second-tier openings (249, 229) concurrently, i.e., during the second isotropic etch process.

The various second-tier openings (249, 229) may include second-tier memory openings 249 formed in the memory array regions 100 and second-tier support openings 229 formed in the inter-array region 200. Each second-tier opening (249, 229) may be formed within the area of a respective one of the sacrificial first-tier opening fill portions (148, 128). Thus, a top surface of a sacrificial first-tier opening fill portion (148, 128) can be physically exposed at the bottom of each second-tier opening (249, 229). Specifically, each second-tier memory openings 249 can be formed directly over a respective sacrificial first-tier opening fill portion 148, and each second-tier support opening 229 can be formed directly over a respective sacrificial first-tier support opening fill portion 128. Each cluster of second-tier memory openings 249 may be formed as a two-dimensional array of second-tier memory openings 249. The second-tier support openings 229 are openings that are formed in the inter-array region 200, and are subsequently employed to form support pillar structures. A subset of the second-tier support openings may be formed through a respective horizontal surface of the second stepped surfaces.

Figure 10:
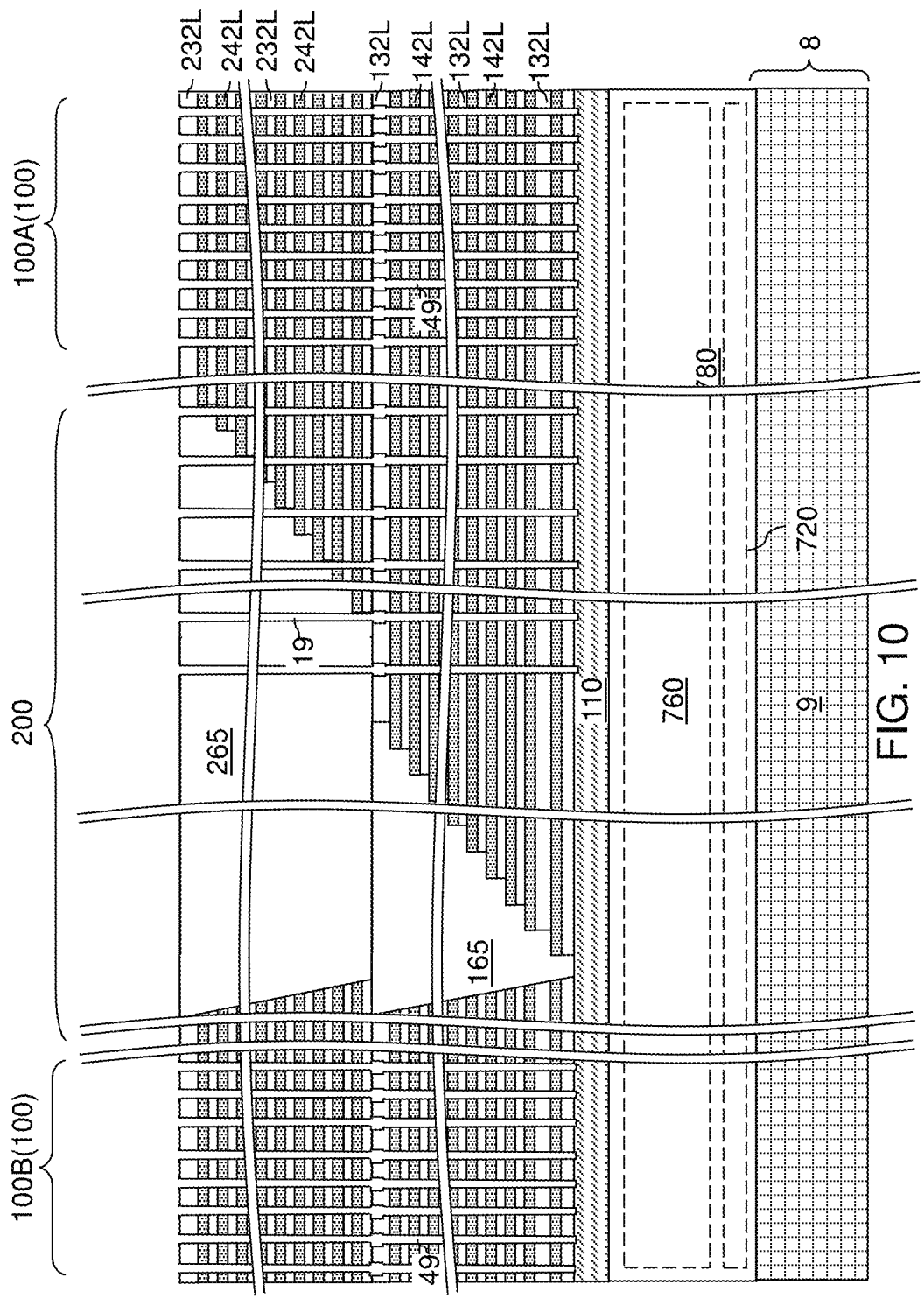
FIG. 10 is a vertical cross-sectional view of the first exemplary structure after formation of inter-tier memory openings and inter-tier support openings according to the first embodiment of the present disclosure.

Referring to FIGS. 10 and 11A, the sacrificial first-tier fill material of the sacrificial first-tier opening fill portions (148, 128) may be removed using an etch process that etches the sacrificial first-tier fill material selective to the materials of the first and second continuous insulating layers (132L, 232L) and the first and second continuous sacrificial material layers (142L, 242L). A memory opening, which is also referred to as an inter-tier memory opening 49, is formed in each combination of a second-tier memory openings and a volume from which a sacrificial first-tier memory opening fill portion 148 is removed. A support opening, which is also referred to as an inter-tier support opening 19, is formed in each combination of a second-tier support openings and a volume from which a sacrificial first-tier support opening fill portion 128 is removed. The inter-tier memory opening 49 extends through the first-tier structure and the second-tier structure. Generally, memory openings 49 can be formed within each memory array region 100, in which each layer of the first vertically alternating sequence (132L, 142L) and each layer within the second vertically alternating sequence (232L, 242L) are present.

Referring to FIG. 11B, a stack of layers including a blocking dielectric layer 52, a charge storage layer 54, a tunneling dielectric layer 56, and a semiconductor channel material layer 60L may be sequentially deposited in the inter-tier memory openings 49. The blocking dielectric layer 52 may include a single dielectric material layer or a stack of a plurality of dielectric material layers. In one embodiment, the blocking dielectric layer may include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 may include a dielectric metal oxide having a dielectric constant greater than 7.9, i.e., having a dielectric constant greater than the dielectric constant of silicon nitride. The thickness of the dielectric metal oxide layer may be in a range from 1 nm to 20 nm, although lesser and greater thicknesses may also be used. The dielectric metal oxide layer may subsequently function as a dielectric material portion that blocks leakage of stored electrical charges to control gate electrodes. In one embodiment, the blocking dielectric layer 52 includes aluminum oxide. Alternatively or additionally, the blocking dielectric layer 52 may include a dielectric semiconductor compound such as silicon oxide, silicon oxynitride, silicon nitride, or a combination thereof.

Subsequently, the charge storage layer 54 may be formed. In one embodiment, the charge storage layer 54 may be a continuous layer or patterned discrete portions of a charge trapping material including a dielectric charge trapping material, which may be, for example, silicon nitride. Alternatively, the charge storage layer 54 may include a continuous layer or patterned discrete portions of a conductive material such as doped polysilicon or a metallic material that is patterned into multiple electrically isolated portions (e.g., floating gates), for example, by being formed within lateral recesses into continuous sacrificial material layers (142L, 242L). In one embodiment, the charge storage layer 54 includes a silicon nitride layer. In one embodiment, the continuous sacrificial material layers (142L, 242L) and the continuous insulating layers (132L, 232L) may have vertically coincident sidewalls, and the charge storage layer 54 may be formed as a single continuous layer. Alternatively, the continuous sacrificial material layers (142L, 242L) may be laterally recessed with respect to the sidewalls of the continuous insulating layers (132L, 232L), and a combination of a deposition process and an anisotropic etch process may be used to form the charge storage layer 54 as a plurality of memory material portions that are vertically spaced apart. The thickness of the charge storage layer 54 may be in a range from 2 nm to 20 nm, although lesser and greater thicknesses may also be used.

The tunneling dielectric layer 56 includes a dielectric material through which charge tunneling may be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 may include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 may include a stack of a first silicon oxide layer, a silicon oxynitride layer, and a second silicon oxide layer, which is commonly known as an ONO stack. In one embodiment, the tunneling dielectric layer 56 may include a silicon oxide layer that is substantially free of carbon or a silicon oxynitride layer that is substantially free of carbon. The thickness of the tunneling dielectric layer 56 may be in a range from 2 nm to 20 nm, although lesser and greater thicknesses may also be used. The stack of the blocking dielectric layer 52, the charge storage layer 54, and the tunneling dielectric layer 56 constitutes a memory film 50 that stores memory bits.

The semiconductor channel material layer 60L includes a p-doped semiconductor material such as at least one elemental semiconductor material, at least one III-V compound semiconductor material, at least one II-VI compound semiconductor material, at least one organic semiconductor material, or other semiconductor materials known in the art. In one embodiment, the semiconductor channel material layer 60L may have a uniform doping. In one embodiment, the semiconductor channel material layer 60L has a p-type doping in which p-type dopants (such as boron atoms) are present at an atomic concentration in a range from $1.0 \times 10^{12}/cm^3$ to $1.0 \times 10^{18}/cm^3$, such as from $1.0 \times 10^{14}/cm^3$ to $1.0 \times 10^{17}/cm^3$. In one embodiment, the semiconductor channel material layer 60L includes, and/or consists essentially of, boron-doped amorphous silicon or boron-doped polysilicon. In another embodiment, the semiconductor channel material layer 60L has an n-type doping in which n-type dopants (such as phosphor atoms or arsenic atoms) are present at an atomic concentration in a range from $1.0 \times 10^{12}/cm^3$ to $1.0 \times$ $10^{18}/cm^3$, such as from $1.0 \times 10^{14}/cm^3$ to $1.0 \times 10^{17}/cm^3$. The semiconductor channel material layer 60L may be formed by a conformal deposition method such as low pressure chemical vapor deposition (LPCVD). The thickness of the semiconductor channel material layer 60L may be in a range from 2 nm to 10 nm, although lesser and greater thicknesses may also be used. A cavity 49' is formed in the volume of each inter-tier memory opening 49 that is not filled with the deposited material layers (52, 54, 56, 60L).

Referring to FIG. 11C, in case the cavity 49' in each memory opening is not completely filled by the semiconductor channel material layer 60L, a dielectric core layer may be deposited in the cavity 49' to fill any remaining portion of the cavity 49' within each memory opening. The dielectric core layer includes a dielectric material such as silicon oxide or organosilicate glass. The dielectric core layer may be deposited by a conformal deposition method such as low pressure chemical vapor deposition (LPCVD), or by a self-planarizing deposition process such as spin coating. The horizontal portion of the dielectric core layer overlying the top second continuous insulating layer 232L may be removed, for example, by a recess etch. The recess etch continues until top surfaces of the remaining portions of the dielectric core layer are recessed to a height between the top and bottom surfaces of the topmost second insulating layer 232L. Each remaining portion of the dielectric core layer constitutes a dielectric core 62.

Referring to FIG. 11D, a doped semiconductor material having a doping of a second conductivity type may be deposited in cavities overlying the dielectric cores 62. The second conductivity type is the opposite of the first conductivity type. For example, if the first conductivity type is p-type, the second conductivity type is n-type, and vice versa. Portions of the deposited doped semiconductor material, the semiconductor channel material layer 60L, the tunneling dielectric layer 56, the charge storage layer 54, and the blocking dielectric layer 52 that overlie the horizontal plane including the top surface of the topmost second continuous insulating layer 232L may be removed by a planarization process such as a chemical mechanical planarization (CMP) process.

Each remaining portion of the doped semiconductor material of the second conductivity type constitutes a drain region 63. The dopant concentration in the drain regions 63 may be in a range from $5.0 \times 10^{19}/cm^3$ to $2.0 \times 10^{21}/cm^3$, although lesser and greater dopant concentrations may also be used. The doped semiconductor material may be, for example, doped polysilicon.

Each remaining portion of the semiconductor channel material layer 60L constitutes a vertical semiconductor channel 60 through which electrical current may flow when a vertical NAND device including the vertical semiconductor channel 60 is turned on. A tunneling dielectric layer 56 is surrounded by a charge storage layer 54, and laterally surrounds a vertical semiconductor channel 60. Each adjoining set of a blocking dielectric layer 52, a charge storage layer 54, and a tunneling dielectric layer 56 collectively constitute a memory film 50, which may store electrical charges with a macroscopic retention time. In some embodiments, a blocking dielectric layer 52 may not be present in the memory film 50 at this step, and a blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 (which is a vertical semiconductor channel) within an inter-tier memory opening 49 constitutes a memory stack structure 55. The memory stack structure 55 is a combination of a vertical semiconductor channel 60, a tunneling dielectric layer 56, a plurality of memory elements comprising portions of the charge storage layer 54, and an optional blocking dielectric layer 52. The memory stack structures 55 can be formed through memory array regions 100 of the first and second vertically alternating sequences in which all layers of the first and second vertically alternating sequences are present. Each combination of a memory stack structure 55, a dielectric core 62, and a drain region 63 within an inter-tier memory opening 49 constitutes a memory opening fill structure 58. Generally, memory opening fill structures 58 are formed within the memory openings 49. Each of the memory opening fill structures 58 comprises a respective memory film 50 and a respective vertical semiconductor channel 60.

In one embodiment, each of the memory stack structures 55 comprises vertical NAND string including the respective vertical stack of memory elements (comprising portions of a charge storage layer 54 located at levels of the continuous sacrificial material layers (142L, 242L)) and a vertical semiconductor channel 60 that vertically extend through the continuous sacrificial material layers (142L, 242L) adjacent to the respective vertical stack of memory elements.

Figure 12:
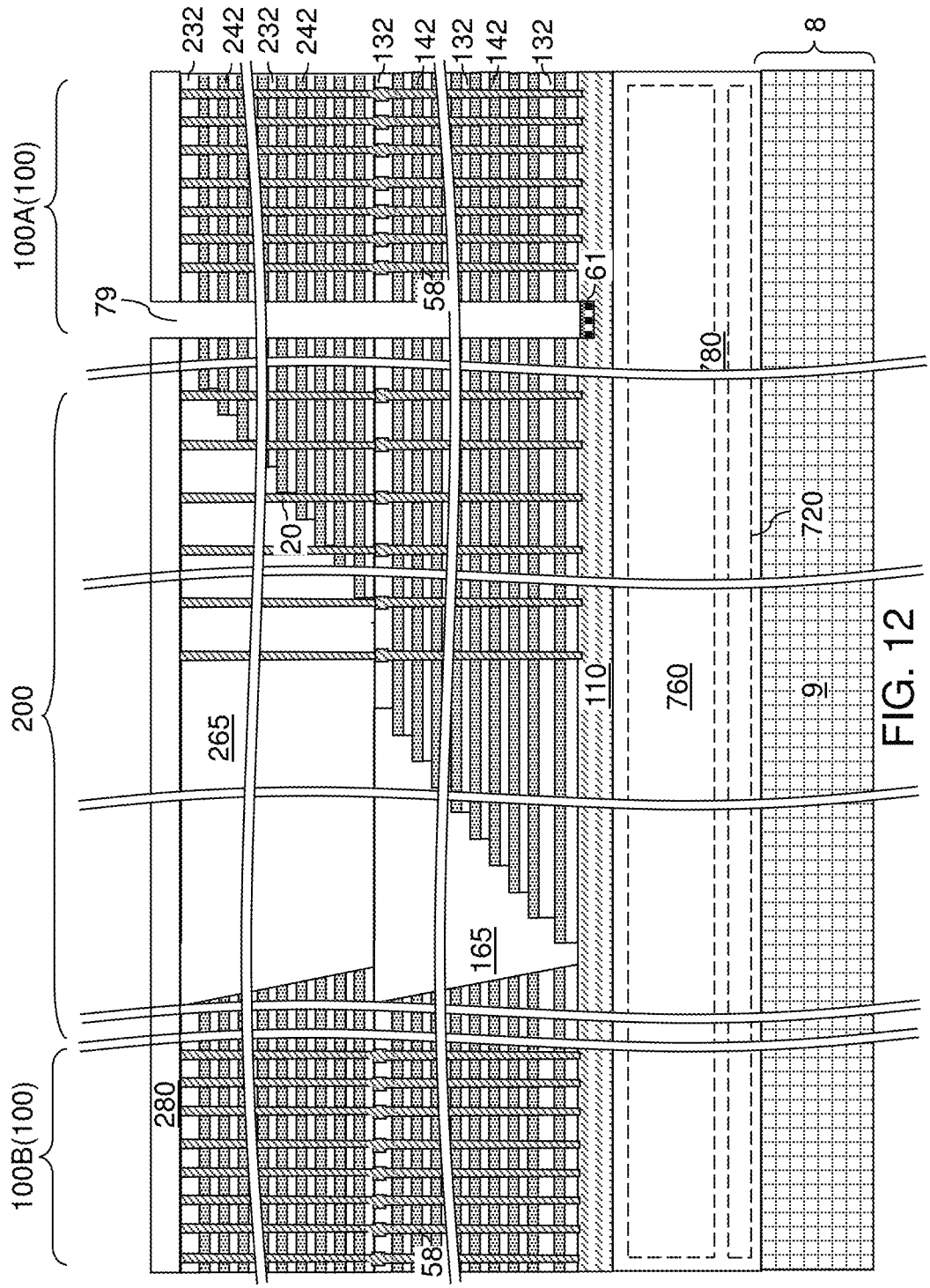
FIG. 12 is a schematic vertical cross-sectional view of the first exemplary structure after formation of a contact-level dielectric layer, backside trenches, and source regions according to the first embodiment of the present disclosure.
Figure 13A:
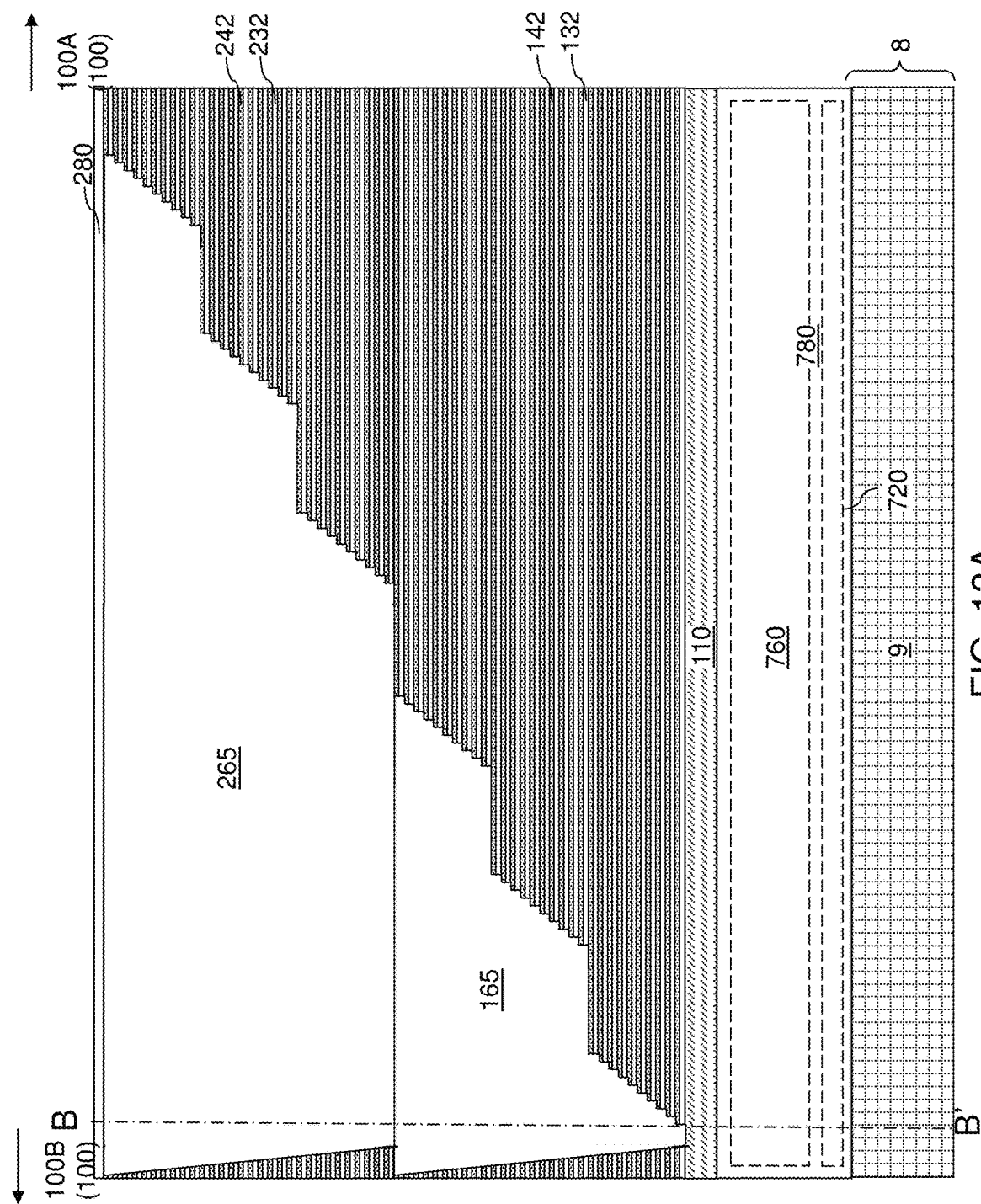
FIG. 13A is another vertical cross-sectional view of the first exemplary structure of FIG. 12.
Figure 13B:
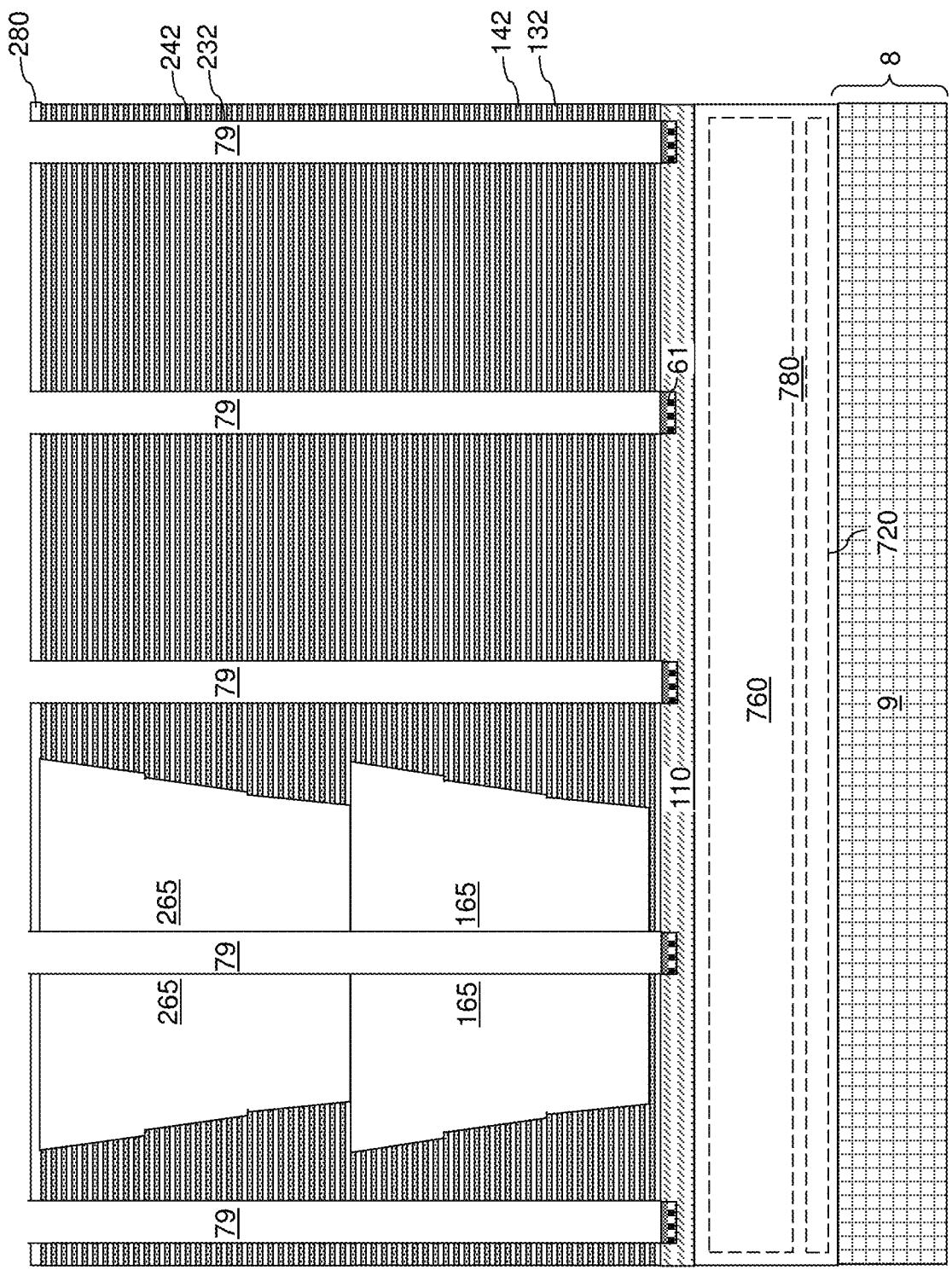
FIG. 13B is a vertical cross-sectional view of the first exemplary structure along a vertical plane B-B' of FIG. 13A.
Figure 17A:
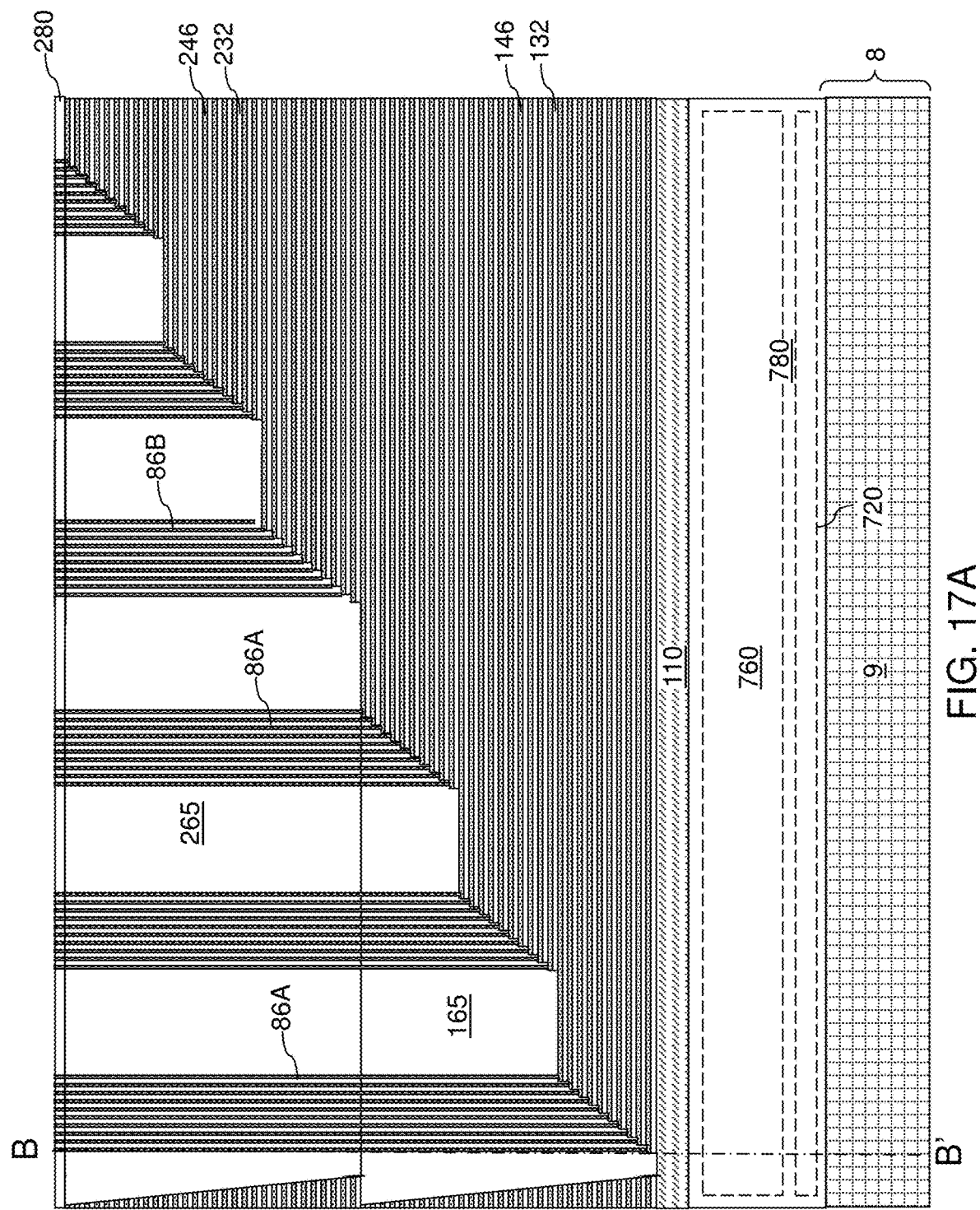
FIG. 17A is a vertical cross-sectional view of the first exemplary structure of FIG. 16 according to the first embodiment of the present disclosure.
Figure 17B:
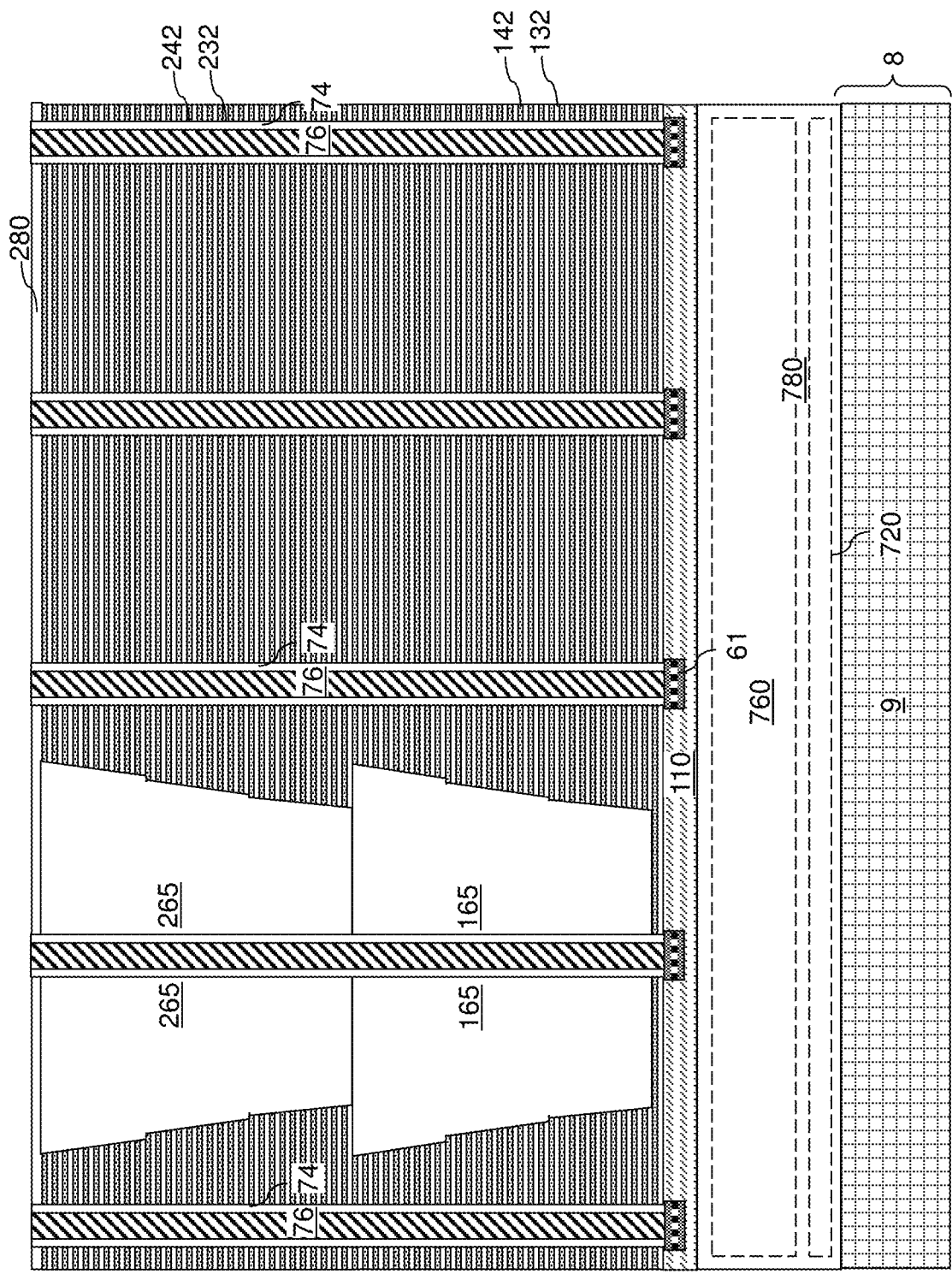
FIG. 17B is a vertical cross-sectional view of the first exemplary structure along a vertical plane B-B' of FIG. 17A.

Referring to FIGS. 12, 13A, and 13B, each inter-tier support opening can be filled with a respective set of material portions having the same material composition as a corresponding component in a memory opening fill structure 58 during the processing steps of FIGS. 17B-17D. Each set of material portions filling an inter-tier support opening is herein referred to as a support pillar structure 20. It is noted that the support pillar structures 20 are not illustrated in FIGS. 1A-1E for the purpose of clarity. The semiconductor material layer 110, the first-tier structure (132L, 142L, 165), the second-tier structure (232L, 242L, 265), the memory opening fill structures 58, and the support pillar structures 20 collectively constitute a memory-level assembly.

Generally, the support pillar structures 20 are formed in the inter-array region 200. The support pillar structures 20 include first support pillar structures 20 that vertically extend through the second vertically alternating sequence (232L, 242L), a first-tier retro-stepped dielectric material portion 165, and a portion of the first vertically alternating sequence (132L, 142L) that underlies the first-tier retro-stepped dielectric material portion 165. The support pillar structures 20 further include second support pillar structures 20 that vertically extend through a second-tier retro-stepped dielectric material portion 265, a portion of the second vertically alternating sequence (232L, 242L) that underlies the second-tier retro-stepped dielectric material portion 265, and each layer within the first vertically alternating sequence (132L, 142L).

A contact-level dielectric layer 280 may be formed over the second vertically alternating sequence (232L, 242L). The contact-level dielectric layer 280 includes a dielectric material such as silicon oxide, and may be formed by a conformal or non-conformal deposition process. For example, the contact-level dielectric layer 280 may include undoped silicate glass and may have a thickness in a range from 100 nm to 600 nm, although lesser and greater thicknesses may also be used.

A photoresist layer (not shown) may be applied over the contact-level dielectric layer 280, and may be lithographically patterned to form linear openings laterally extending along the first horizontal direction hd1 and laterally spaced apart along the second horizontal direction hd2. The pattern of the linear openings in the photoresist layer can be identical to the pattern of the trench fill structures 76 illustrated in FIGS. 1B-1F. The linear openings in the photoresist layer can be formed within areas in which memory opening fill structures 58 or the support pillar structures 20 are not present.

Backside trenches 79 be formed by transferring the pattern in the photoresist layer (not shown) through the contact-level dielectric layer 280, the second-tier structure (232L, 242L, 265), and the first-tier structure (132L, 142L, 165), and into the semiconductor material layer 110. The pattern of the backside trenches 79 can be identical to the pattern of the trench fill structures 76 illustrated in FIGS. 1B-1F. Portions of the contact-level dielectric layer 280, the second-tier structure (232L, 242L, 265), the first-tier structure (132L, 142L, 165), and the semiconductor material layer 110 that underlie the linear openings in the photoresist layer may be removed by an anisotropic etch process to form the backside trenches 79. In one embodiment, the backside trenches 79 may be formed between clusters of memory stack structures 55. The clusters of the memory stack structures 55 may be laterally spaced apart along the second horizontal direction hd2 by the backside trenches 79.

The backside trenches 79 can be formed as a periodic one-dimensional array with a periodicity along the second horizontal direction hd2. The backside trenches 79 can be sequentially numerically numbered with positive integers from one side to another along the second horizontal direction hd2. In one embodiment, every odd-numbered backside trench 79 can extend through the second vertically alternating sequence (232L, 242L) and the first vertically alternating sequence (132L, 142L) without etching through the first-tier retro-stepped dielectric material portions 165 or the second-tier retro-stepped dielectric material portions 265. Every even-numbered backside trench 79 can extend through the second vertically alternating sequence (232L, 242L) and the first vertically alternating sequence (132L, 142L) and cut through a respective first-tier retro-stepped dielectric material portion 165 and a respective second-tier retro-stepped dielectric material portion 265.

Each vertically alternating sequence {(132L, 142L), (232L, 242L)} is divided into a plurality of alternating stacks of insulating layers (132 or 232) and sacrificial material layers (142, 242) (which correspond to volumes of memory blocks) by the backside trenches 79. Each backside trench 79 can laterally extend along the first horizontal direction hd1 through am inter-array region 200 and a pair of memory array regions 100 that are adjoined to inter-array region 200. Further, each backside trench 79 can vertically extend through an entire thickness of the vertically alternating sequences {(132L, 142L), (232L, 242L)}. Each patterned portion of the first vertically alternating sequence (132L, 142L) located between a neighboring pair of backside trenches 79 constitutes a first-tier alternating stack of first insulating layers 132 and first sacrificial material layers 142. Each patterned portion of the second vertically alternating sequence located between a neighboring pair of backside trenches 79 constitutes a second-tier alternating stack of second insulating layers 232L and second sacrificial material layers 242. A plurality of alternating stacks of insulating layers (132 or 232) and sacrificial material layers (which may be first sacrificial material layers 142 or second sacrificial material layers 242) can be formed.

Each first-tier retro-stepped dielectric material portion 165 may be divided into two disjoined first-tier retro-stepped dielectric material portions 165 by a backside trench 79. Each second-tier retro-stepped dielectric material portion 265 may be divided into two disjoined second-tier retro-stepped dielectric material portions 265 by a backside trench 79. Each contiguous combination of a first-tier alternating stack (132, 142) and a second-tier alternating stack (232, 242) can be laterally bounded by a neighboring pair of backside trenches 79. One of the neighboring pair of backside trenches 79 can divide a first-tier retro-stepped dielectric material portion 165 into two discrete dielectric material portions, such as a first portion of the first-tier retro-stepped dielectric material portion 165 and a second portion of the first-tier retro-stepped dielectric material portion 165. Further, one of the neighboring pair of backside trenches 79 can divide a second-tier retro-stepped dielectric material portion 265 into two discrete dielectric material portions, such as a first portion of the second-tier retro-stepped dielectric material portion 265 and a second portion of the second-tier retro-stepped dielectric material portion 265.

In one embodiment, the semiconductor material layer 110 can have a doping of the same conductivity type as the vertical semiconductor channels 60, i.e., a first conductivity type, and a source region 61 having a doping of a second conductivity type (which is the same conductivity type as the doping of the drain regions 63) can be formed underneath each backside trench 79 by implantation of dopants of the second conductivity type.

Figure 14:
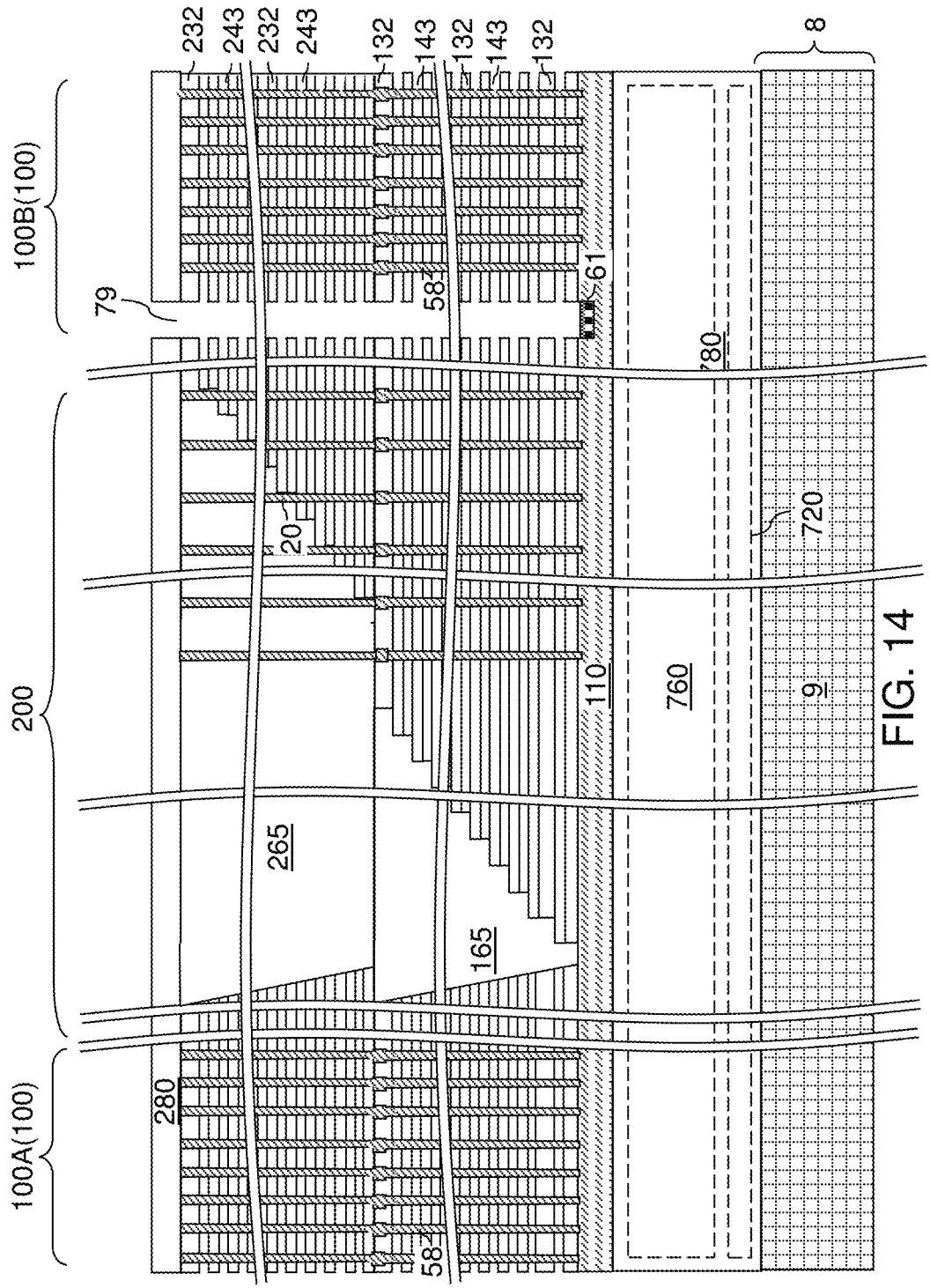
FIG. 14 is a schematic vertical cross-sectional view of the first exemplary structure after formation of backside recesses according to the first embodiment of the present disclosure.

Referring to FIG. 14, the sacrificial material layers (142, 242) are removed selective to the insulating layers (132, 232), the contact-level dielectric layer 280, and the semiconductor material layer 110. For example, an etchant that selectively etches the materials of the sacrificial material layers (142, 242) with respect to the materials of the insulating layers (132, 232), the retro-stepped dielectric material portions (165, 265), and the material of the outermost layer of the memory films 50 may be introduced into the backside trenches 79, for example, using an isotropic etch process. For example, the sacrificial material layers (142, 242) may include silicon nitride, the materials of the insulating layers (132, 232), the retro-stepped dielectric material portions (165, 265), and the outermost layer of the memory films 50 may include silicon oxide materials.

The isotropic etch process may be a wet etch process using a wet etch solution, or may be a gas phase (dry) etch process in which the etchant is introduced in a vapor phase into the backside trench 79. For example, if the sacrificial material layers (142, 242) include silicon nitride, the etch process may be a wet etch process in which the first exemplary structure is immersed within a wet etch tank including phosphoric acid, which etches silicon nitride selective to silicon oxide, silicon, and various other materials used in the art.

Backside recesses (143, 243) are formed in volumes from which the sacrificial material layers (142, 242) are removed. The backside recesses (143, 243) include first backside recesses 143 that are formed in volumes from which the first sacrificial material layers 142 are removed and second backside recesses 243 that are formed in volumes from which the second sacrificial material layers 242 are removed. Each of the backside recesses (143, 243) may be a laterally extending cavity having a lateral dimension that is greater than the vertical extent of the cavity. In other words, the lateral dimension of each of the backside recesses (143, 243) may be greater than the height of the respective backside recess. A plurality of backside recesses (143, 243) may be formed in the volumes from which the material of the sacrificial material layers (142, 242) is removed. Each of the backside recesses (143, 243) may extend substantially parallel to the top surface of the substrate semiconductor layer 9. A backside recess (143, 243) may be vertically bounded by a top surface of an underlying insulating layer (132, 232) and a bottom surface of an overlying insulating layer (132, 232). In one embodiment, each of the backside recesses (143, 243) may have a uniform height throughout.

Generally, the backside recesses (143, 243) can be formed by removing the patterned portions of the first continuous sacrificial material layers 142L and the second sacrificial material layers 242L selective to patterned portions of the first continuous insulating layers 132L and the second continuous insulating layers 232L after formation of the backside trenches 79. The backside recesses (143, 243) can be formed by performing an isotropic etch process that supplies an isotropic etchant that etches the patterned portions of the first continuous sacrificial material layers 142L and the second continuous sacrificial material layers 242L selective to patterned portions of the first continuous insulating layers 132L and the second continuous insulating layers 232L.

Figure 15:
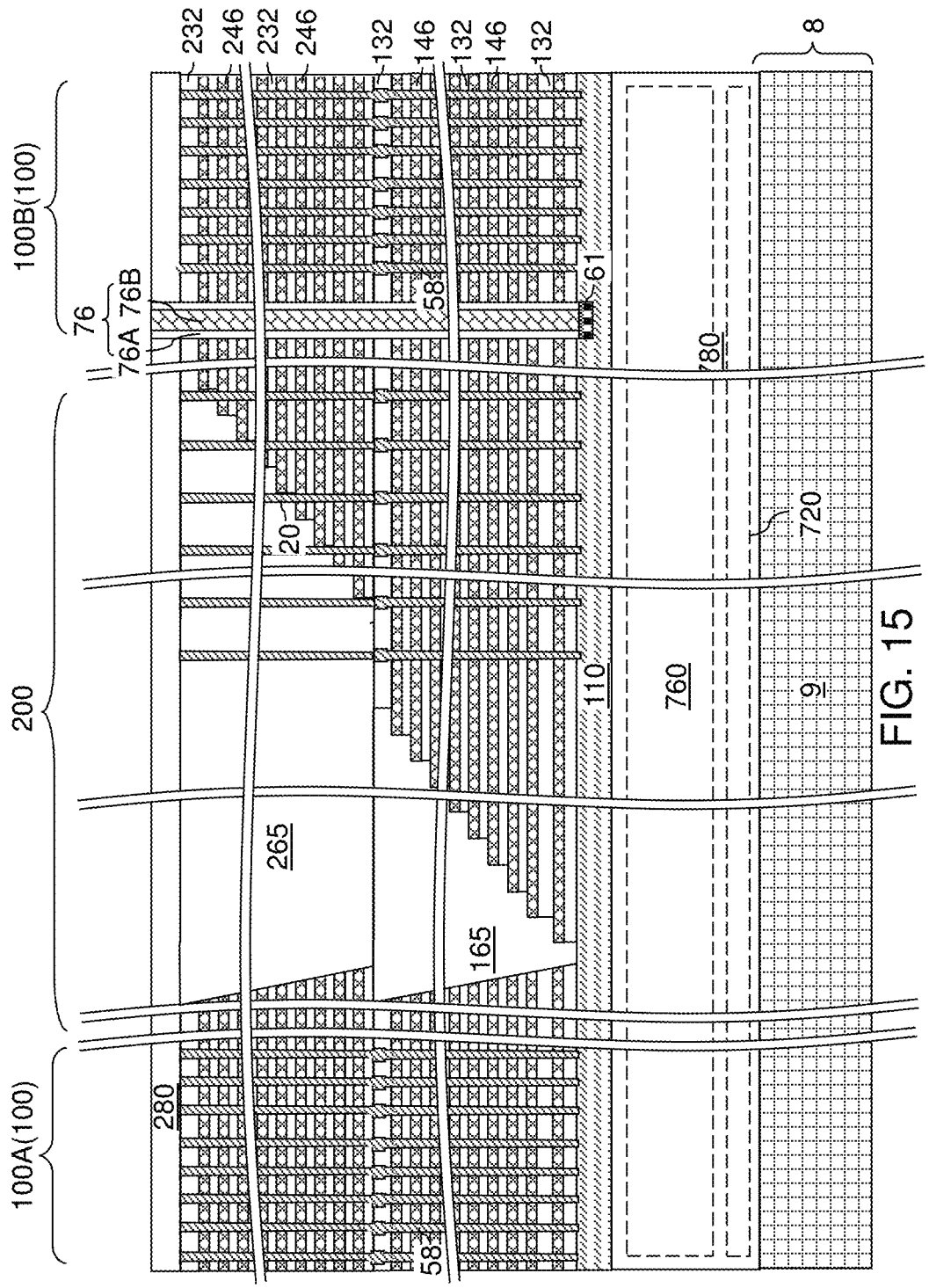
FIG. 15 is a schematic vertical cross-sectional view of the first exemplary structure after formation of electrically conductive layers and trench fill structures according to the first embodiment of the present disclosure.

Referring to FIG. 15, an optional backside blocking dielectric layer (not shown) may be optionally deposited in the backside recesses (143, 243) and the backside trenches 79 and over the contact-level dielectric layer 280. The backside blocking dielectric layer includes a dielectric material such as a dielectric metal oxide (e.g., aluminum oxide), silicon oxide, or a combination thereof.

At least one conductive material may be deposited in the plurality of backside recesses (143, 243), on the sidewalls of the backside trenches 79, and over the contact-level dielectric layer 280. The at least one conductive material may be deposited by a conformal deposition method, which may be, for example, chemical vapor deposition (CVD), atomic layer deposition (ALD), electroless plating, electroplating, or a combination thereof. The at least one conductive material may include an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof.

In one embodiment, the at least one conductive material may include at least one metallic material, i.e., an electrically conductive material that includes at least one metallic element. Non-limiting first exemplary metallic materials that may be deposited in the backside recesses (143, 243) include tungsten, tungsten nitride, titanium, titanium nitride, tantalum, tantalum nitride, cobalt, and ruthenium. For example, the at least one conductive material may include a conductive metallic nitride liner that includes a conductive metallic nitride material such as TiN, TaN, WN, or a combination thereof, and a conductive fill material such as W, Co, Ru, Mo, Cu, or combinations thereof. In one embodiment, the at least one conductive material for filling the backside recesses (143, 243) may be a combination of titanium nitride layer and a tungsten fill material.

Electrically conductive layers (146, 246) may be formed in the backside recesses (143, 243) by deposition of the at least one conductive material. A plurality of first electrically conductive layers 146 may be formed in the plurality of first backside recesses 143, a plurality of second electrically conductive layers 246 may be formed in the plurality of second backside recesses 243, and a continuous metallic material layer (not shown) may be formed on the sidewalls of each backside trench 79 and over the contact-level dielectric layer 280. Each of the first electrically conductive layers 146 and the second electrically conductive layers 246 may include a respective conductive metallic nitride liner and a respective conductive fill material. Thus, the first and second sacrificial material layers (142, 242) may be replaced with the first and second electrically conductive layers (146, 246), respectively. Specifically, each first sacrificial material layer 142 may be replaced with an optional portion of the backside blocking dielectric layer and a first electrically conductive layer 146, and each second sacrificial material layer 242 may be replaced with an optional portion of the backside blocking dielectric layer and a second electrically conductive layer 246. A backside cavity is present in the portion of each backside trench 79 that is not filled with the continuous metallic material layer.

Residual conductive material may be removed from inside the backside trenches 79. Specifically, the deposited metallic material of the continuous metallic material layer may be etched back from the sidewalls of each backside trench 79 and from above the contact-level dielectric layer 280, for example, by an anisotropic or isotropic etch. Each remaining portion of the deposited metallic material in the first backside recesses constitutes a first electrically conductive layer 146. Each remaining portion of the deposited metallic material in the second backside recesses constitutes a second electrically conductive layer 246. Sidewalls of the first electrically conductive layers 146 and the second electrically conductive layers 246 may be physically exposed to a respective backside trench 79. The backside trenches 79 may have a pair of curved sidewalls having a non-periodic width variation along the first horizontal direction hd1 and a non-linear width variation along the vertical direction.

Each electrically conductive layer (146, 246) may be a conductive sheet including openings therein. A first subset of the openings through each electrically conductive layer (146, 246) may be filled with memory opening fill structures 58. A second subset of the openings through each electrically conductive layer (146, 246) may be filled with the support pillar structures 20.

A subset of the electrically conductive layers (146, 246) may comprise word lines for the memory elements. The semiconductor devices in the underlying semiconductor devices 720 may comprise word line switch devices configured to control a bias voltage to respective word lines, and/or bit line driver devices, such as sense amplifiers. The memory-level assembly is located over the substrate semiconductor layer 9. The memory-level assembly includes at least one alternating stack (132, 146, 232, 246) and memory stack structures 55 vertically extending through the at least one alternating stack (132, 146, 232, 246). Each of the memory stack structures 55 comprises a vertical stack of memory elements located at each level of the electrically conductive layers (146, 246).

Generally, the patterned portions of the first continuous sacrificial material layers 142L and the second continuous sacrificial material layers 242L are replaced with the electrically conductive layers (146, 246). A first-tier alternating stack of first insulating layers 132 and first electrically conductive layers 146 can be formed between each neighboring pair of backside trenches 79. The first insulating layers 132 comprise patterned portions of the first continuous insulating layers 132L, and the first electrically conductive layers 146 comprise the first subset of the electrically conductive layers (146, 246) and are interlaced with the first insulating layers 132. A second-tier alternating stack of second insulating layers 232 and second electrically conductive layers 246 is formed between the neighboring pair of backside trenches 79. The second insulating layers 232 comprise patterned portions of the second continuous insulating layers 232L, and the second electrically conductive layers 246 comprise a second subset of the electrically conductive layers (146, 246) that is interlaced with the second insulating layers 246.

A trench fill structure 76 can be formed in each backside trench 79. In one embodiment, an insulating liner layer including a dielectric material (such as silicon oxide) can be conformally deposited at a periphery of each backside trench 79, and can be anisotropically etched to form an insulating spacer 76A within each backside trench 79. At least one conductive material can be deposited in remaining volumes of the backside trenches 79, and excess portions of the at least one conductive material can be removed from above the top surface of the contact-level dielectric layer 280 by a planarization process. Each remaining portion of the at least one conductive material contacting a source region 61 and laterally surrounded by a respective insulating spacer 76A constitutes a backside contact via structure 76B, which laterally extends along the first horizontal direction hd1. Each contiguous combination of an insulating spacer 76A and a backside contact via structure 76B that fills a backside trench 79 constitutes a trench fill structure 76.

Alternatively, at least one dielectric material, such as silicon oxide, may be conformally deposited in the backside trenches 79 by a conformal deposition process. Each portion of the deposited dielectric material that fills a backside trench 79 constitutes a trench fill structure 76. In this case, each trench fill structure may fill the entire volume of a backside trench 79 and may consist essentially of at least one dielectric material. In this alternative embodiment, the source region 61 may be omitted, and a horizontal source line (e.g., a direct strap contact layer) may contact a side of the lower portion of the semiconductor channel 60.

The trench fill structures 76 can be arranged in a configuration illustrated in FIGS. 1B-1F. In one embodiment, each first-tier retro-stepped dielectric material portion 165 and each second-tier retro-stepped dielectric material portion 265 can be located between a neighboring pair of the trench fill structures 76.

Figure 16:
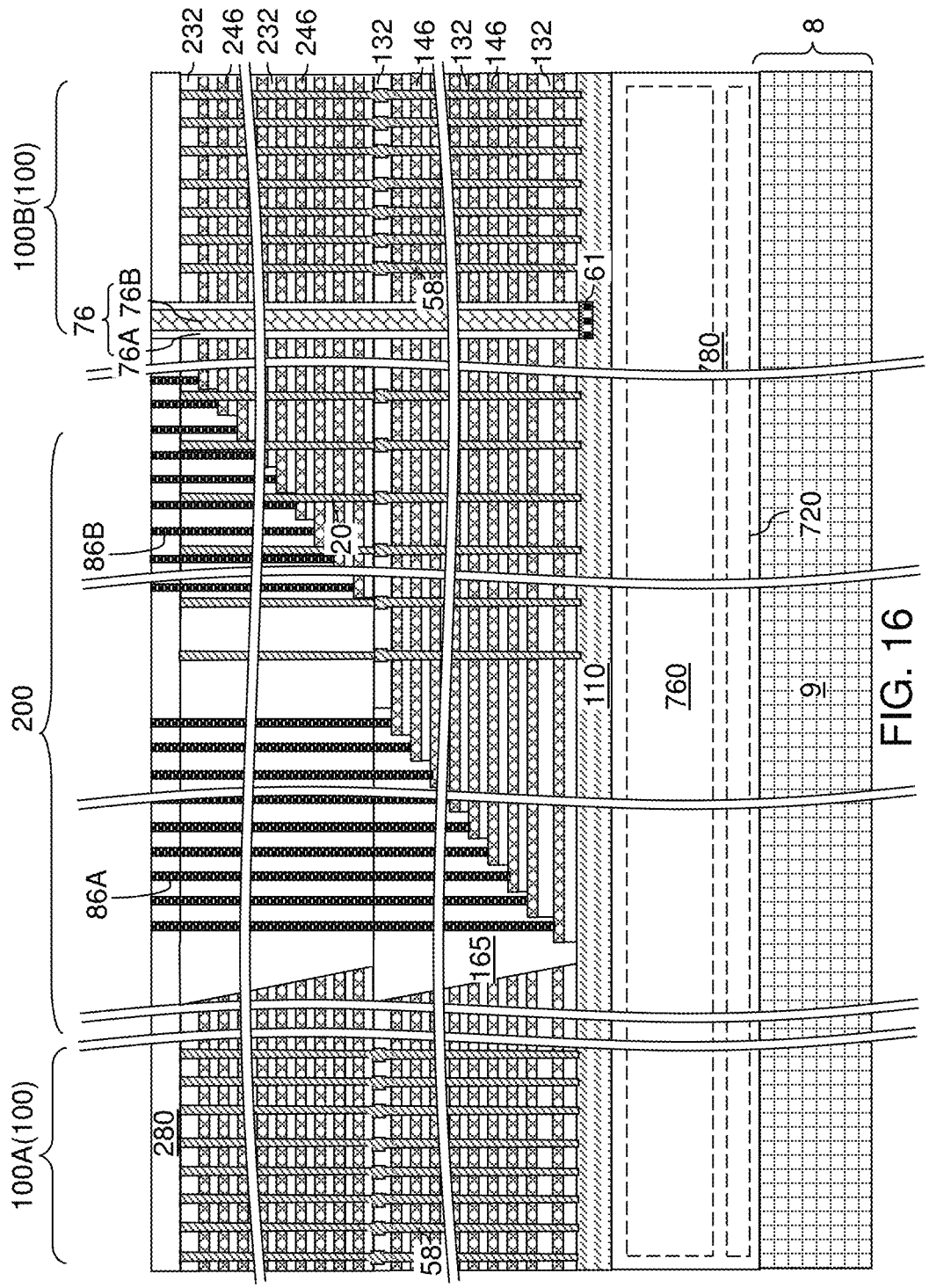
FIG. 16 is a schematic vertical cross-sectional view of the first exemplary structure after formation of layer contact via structures according to the first embodiment of the present disclosure.

Referring to FIGS. 16, 17A, and 17B, various contact via structures (88, 86A, 86B) can be formed through the contact-level dielectric layer 280 and optionally through underlying material portions onto a respective underlying conductive structure. The various contact via structures (88, 86A, 86B) can include drain contact via structures (e.g., drain electrodes) 88 that are formed in the memory array regions 100 through the contact-level dielectric layer 280 on a top surface of a respective drain region 63. The various contact via structures (88, 86A, 86B) can include layer contact via structures (86A, 86B) that are formed in the inter-array region 200. The layer contact via structures (86A, 86B) can include first contact via structures 86A that contact a respective first electrically conductive layer 146 and second contact via structures 86B that contact a respective second electrically conductive layer 246.

For example, a photoresist layer (not shown) can be applied over the second-tier alternating stacks (232, 246), and can be lithographically patterned to form openings within areas of the memory opening fill structures 58, and the second-tier retro-stepped dielectric material portion 265 which is located over the horizontal surfaces of the second stepped surfaces of the second-tier alternating stacks (232, 246). An anisotropic etch process can be performed to transfer the pattern of the openings in the photoresist layer through the contact-level dielectric layer 280, the first-tier retro-stepped dielectric material portions 165, and the second-tier retro-stepped dielectric material portions 265.

Drain contact via cavities can be formed over each memory opening fill structure 58. Top portions of the memory opening fill structures 58, such as the drain regions 63, may be employed as etch stop structures during the anisotropic etch process. In one embodiment, the drain contact via cavities may be formed concurrently with formation of the first contact via cavities and the second contact via cavities. Alternatively, the drain contact via cavities may be formed prior to, or after, formation of the first contact via cavities and the second contact via cavities employing an additional lithographic patterning process and an additional anisotropic etch process.

At least one conductive material can be deposited in each of the first contact via cavities, the second contact via cavities, and the drain contact via cavities. The at least one conductive material can include, for example, a metallic barrier material (such as TiN, TaN, and/or WN) and a metallic fill material (such as W, Cu, Mo, Co, Ru, etc.). Excess portions of the at least one conductive material can be removed from above the horizontal plane including the top surface of the contact-level dielectric layer employing a planarization process (such as a chemical mechanical planarization process). Each remaining portion of the at least one conductive material filling the first contact via cavities comprises a first contact via structure 86A. Each remaining portion of the at least one conductive material filling the second contact via cavities comprise a second contact via structure 86B. Each remaining portion of the at least one conductive material filling the drain contact via cavities comprises drain contact via structures 88.

The first contact via structures 86A can be formed through a respective second-tier retro-stepped dielectric material portion 265 and through a respective first-tier retro-stepped dielectric material portion 165 and directly on a first subset of the electrically conductive layers, i.e., the first electrically conductive layers 146. The second contact via structures 86B can be formed through a respective second-tier retro-stepped dielectric material portion 265 and directly on a second subset of the electrically conductive layers (i.e., the second electrically conductive layers 246) that is located over a horizontal plane including top surfaces of the first-tier retro-stepped dielectric material portions 165.

Bit lines (not shown) are then formed in a manner that provides electrical contact with the drain contact via structures 88. The bit lines may directly contact top surfaces of a respective subset of the drain contact via structures 88, or intermediate contact via structures (not shown) may be employed between the drain contact via structures 88 and the bit lines.

Figure 18A:
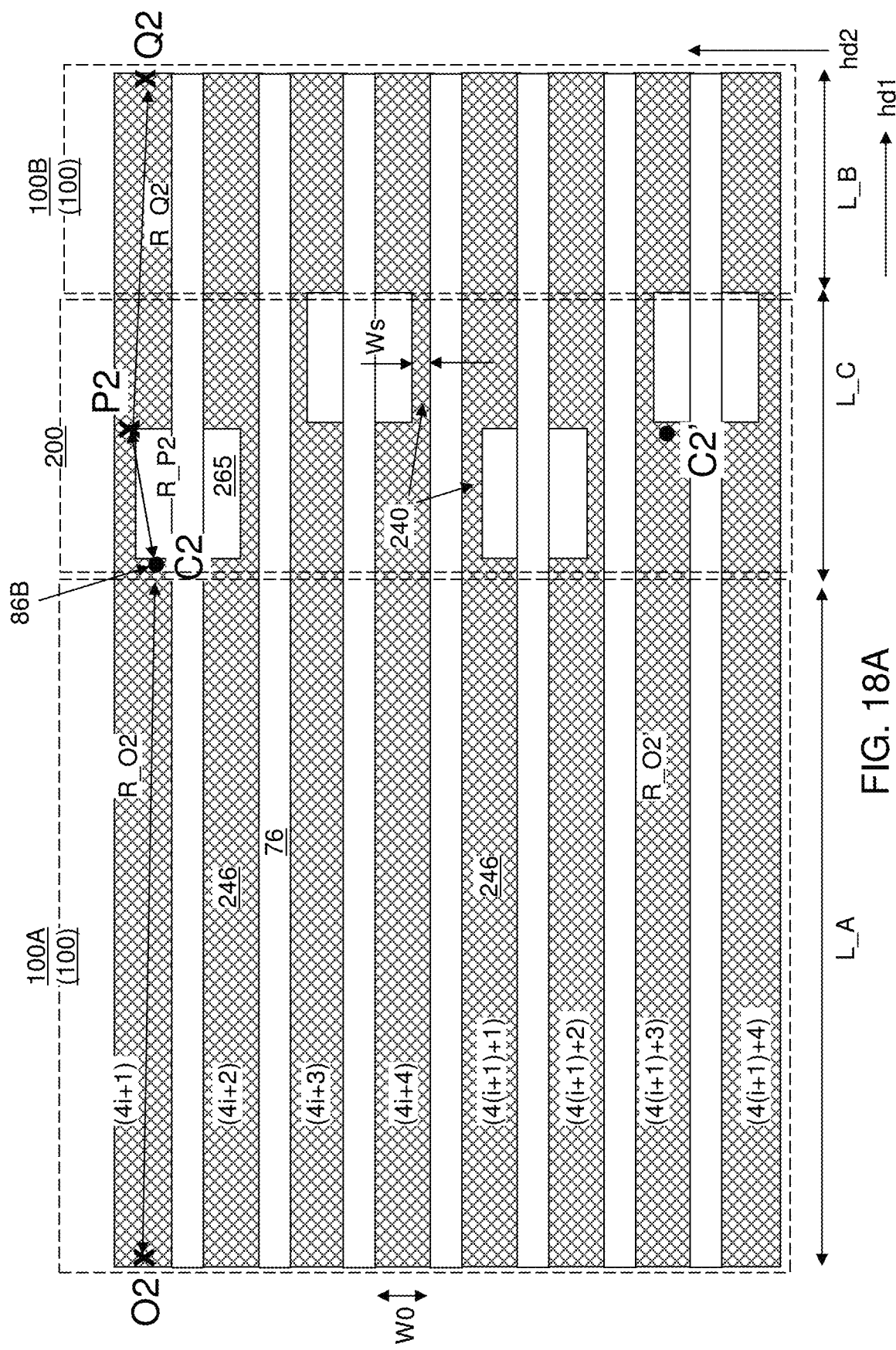
FIG. 18A is a horizontal cross-sectional view of the first exemplary structure of FIG. 16 along a horizontal plane including topmost second electrically conductive layers according to the first embodiment of the present disclosure.

Referring to FIG. 18A, a horizontal cross-sectional view of topmost second electrically conductive layers 246 is shown with numbers associated with the alternating stacks {(132,146), (232, 246)}. Each of the topmost second electrically conductive layers 246 can have a uniform width W0 along the second horizontal direction hd2 in each of the first memory array region 100A and the second memory array region 100B and in portions of the inter-array region 200 located outside the bridge regions 240. A strip portion of a topmost second electrically conductive layer 246 is present in each bridge region 240. Each strip portion can have a strip width Ws that is less than the uniform width W0.

The first memory array region 100A can have a first length L_A along the first horizontal direction hd1, and the second memory array region 100B can have a second length L_B along the first horizontal direction hd1. The inter-array region 200 can have an inter-array region width L_C.

The greatest electrical resistance between topmost second layer contact via structures 86B and most distal portions of the second memory array region 100B occurs for a topmost second layer contact via structure 86B that is formed through the second-tier retro-stepped dielectric material portion 265 that is proximal to the first memory array region 100A. The electrical resistance between a bottom contact point C2 of a topmost second layer contact via structure 86B and a most distal portion O2 of a topmost second electrically conductive layer within the first memory array region 100A is herein referred to as a first-array-region-side topmost-layer maximum resistance R_O2. The electrical resistance between the bottom contact point C2 of the topmost second layer contact via structure 86B and a most distal portion Q2 of the topmost second electrically conductive layer within the second memory array region 100B is herein referred to as a second-array-region-side topmost-layer maximum resistance. The second-array-region-side topmost-layer maximum resistance is the sum of a strip resistance R_P2 and a wide-portion-resistance R_O2. The strip resistance is the electrical resistance between the bottom contact point C2 and an edge point P2 of the strip portion that adjoin a wider portion of the topmost second electrically conductive layer 246 that continuously extends toward the second memory array region 100B. The wide-portion-resistance R_O2 is the electrical resistance between the edge point P2 and the most distal portion Q2 of the topmost second electrically conductive layer within the second memory array region 100B. The second-array-region-side topmost-layer maximum resistance is the greatest electrical resistance among all electrically conductive paths between a layer contact via structure (86A, 86B) and a most distal portion of the second memory array region 100B.

Figure 18B:
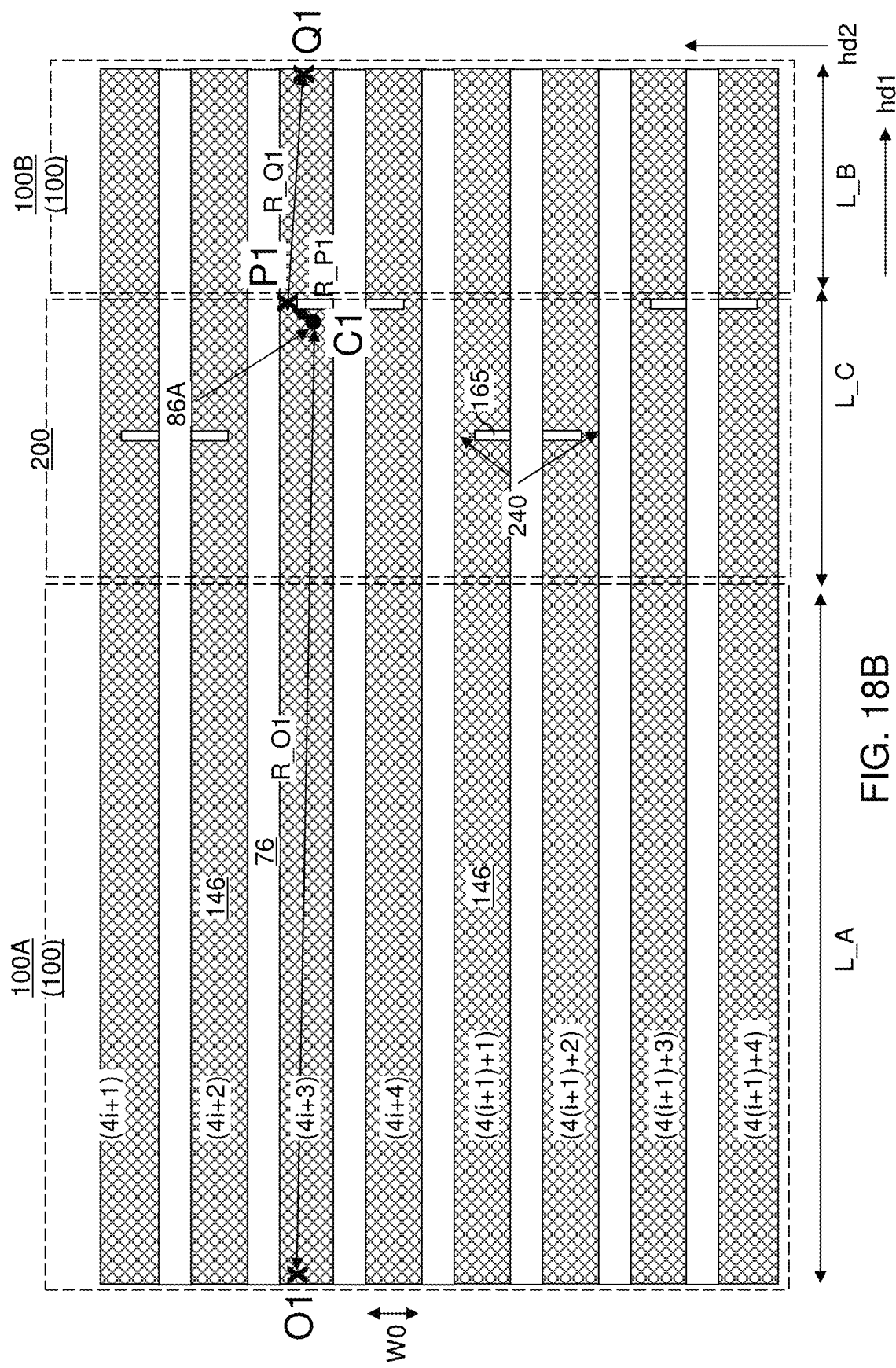
FIG. 18B is a horizontal cross-sectional view of the first exemplary structure of FIG. 16 along a horizontal plane including bottommost first electrically conductive layers according to a second embodiment of the present disclosure.

Referring to FIG. 18B, a horizontal cross-sectional view of bottommost first electrically conductive layers 146 is shown with numbers associated with the alternating stacks {(132,146), (232, 246)}. Each of the bottommost first electrically conductive layers 146 can have a uniform width W0 along the second horizontal direction hd2 in each of the first memory array region 100A and the second memory array region 100B and in portions of the inter-array region 200 located outside the bridge regions 240. A strip portion of a bottommost first electrically conductive layer 146 is located in the bridge region 240.

The greatest electrical resistance between bottommost first layer contact via structures 86A and most distal portions of the first memory array region 100A occurs for a bottommost first layer contact via structure 86A that is formed adjacent to a first-tier retro-stepped dielectric material portion 165 that is proximal to the second memory array region 100B. The electrical resistance between a bottom contact point C1 of a bottommost first layer contact via structure 86A and a most distal portion O1 of a bottommost first electrically conductive layer within the first memory array region 100A is herein referred to as a first-array-region-side bottommost layer maximum resistance R_O1. The electrical resistance between the bottom contact point C1 of the bottommost first layer contact via structure 86A and a most distal portion Q1 of the bottommost first electrically conductive layer 146 within the second memory array region 100B is herein referred to as a second-array-region-side bottommost layer maximum resistance. The second-array-region-side bottommost layer maximum resistance is the sum of a strip resistance R_P1 and a wide-portion-resistance R_O1. The strip resistance is the electrical resistance between the bottom contact point C1 and an edge point P1 of the strip portion that adjoin a wider portion of the bottommost first electrically conductive layer 146 that continuously extends toward the second memory array region 100B. The wide-portion-resistance R_O1 is the electrical resistance between the edge point P1 and the most distal portion Q1 of the bottommost electrically conductive layer 146 within the second memory array region 100B. The first-array-region-side bottommost layer maximum resistance is the greatest electrical resistance among all electrically conductive paths between a layer contact via structure (86A, 86B) and a most distal portion of the first memory array region 100B.

According to an aspect of the present disclosure, the greatest electrical resistance among all electrically conductive paths between a layer contact via structure (86A, 86B) and a most distal portion of the second memory array region 100B can be equal to, or can be substantially equal to (e.g., differ from each other by no more than 10%, and/or by no more than 5%, and/or by no more than 2%, and/or by no more than 1%), the greatest electrical resistance among all electrically conductive paths between a layer contact via structure (86A, 86B) and a most distal portion of the first memory array region 100B. In this case, the second-array-region-side topmost-layer maximum resistance can be the same as, and/or can be substantially the same as, the first-array-region-side bottommost layer maximum resistance. By equalizing the maximum resistance on the side of the first memory array region 100A and on the side of the second memory array region 100B, fast word line access can be provided for the three-dimensional memory array device.

Figure 19:
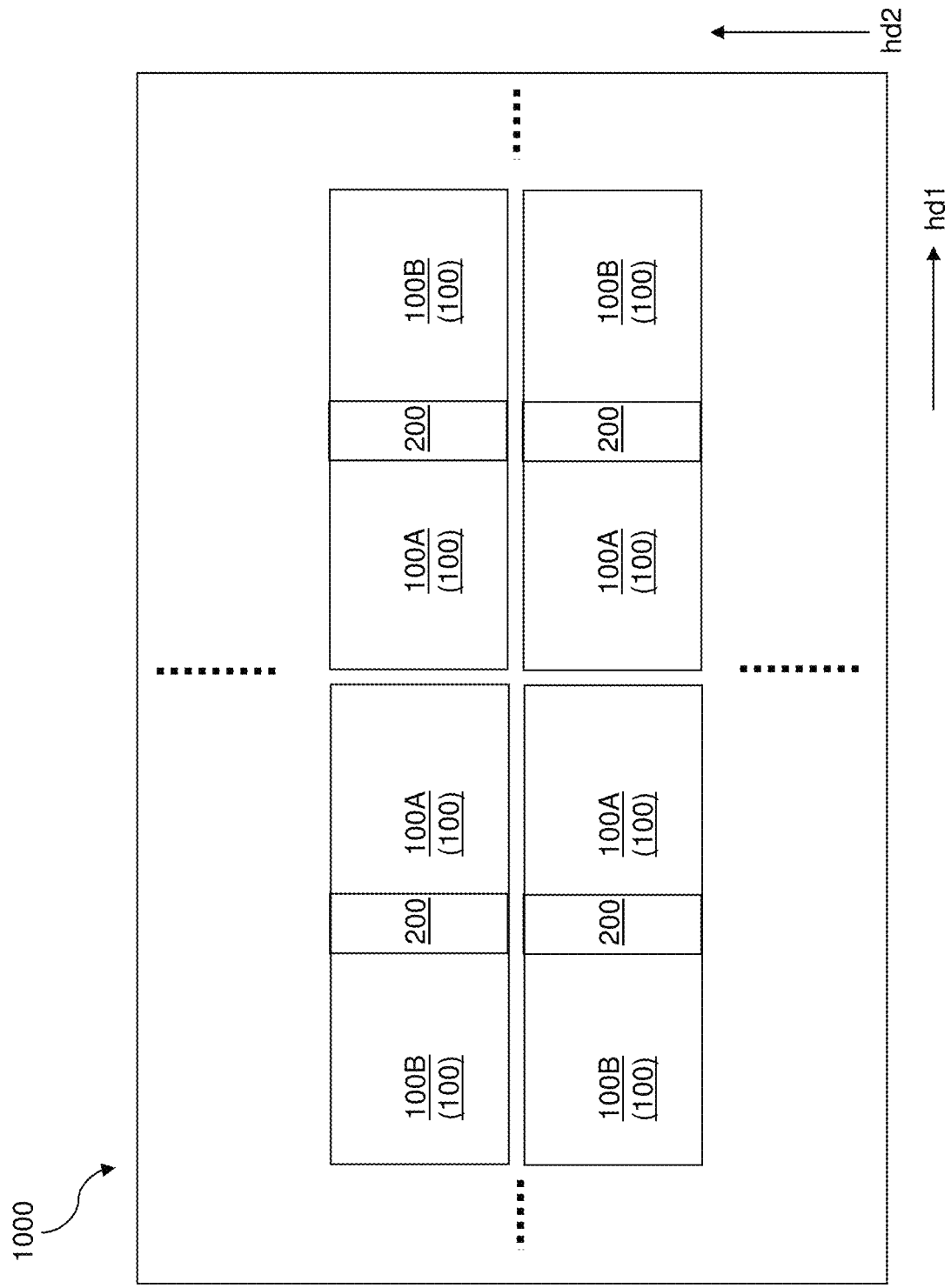
FIG. 19 is a plan view of a second exemplary semiconductor die including multiple three-dimensional memory array regions according to the second embodiment of the present disclosure.

Referring to FIG. 19, a second exemplary semiconductor die 1000 according to a second embodiment of the present disclosure can be derived from the first exemplary structure by forming the first stepped surfaces and the second stepped surfaces (i.e., first and second staircases) of each alternating stack {(132, 146), (232, 246)} such that the first stepped surfaces ascend along the first horizontal direction hd1 and the second stepped surfaces descend along the first horizontal direction hd1, or such that he first stepped surfaces descend along the first horizontal direction hd1 and the second stepped surfaces ascend along the first horizontal direction hd1. In other words, the first and second staircases ascend in opposite directions (i.e., ascend in directions that are 180 degrees apart) and have a generally reverse slopes. In this embodiment, the first length of the first memory array region 100A along the first horizontal direction hd1 can be the same as, or can be approximately the same as, the second length of the second memory array region 200A along the first horizontal direction hd1.

Figure 20:
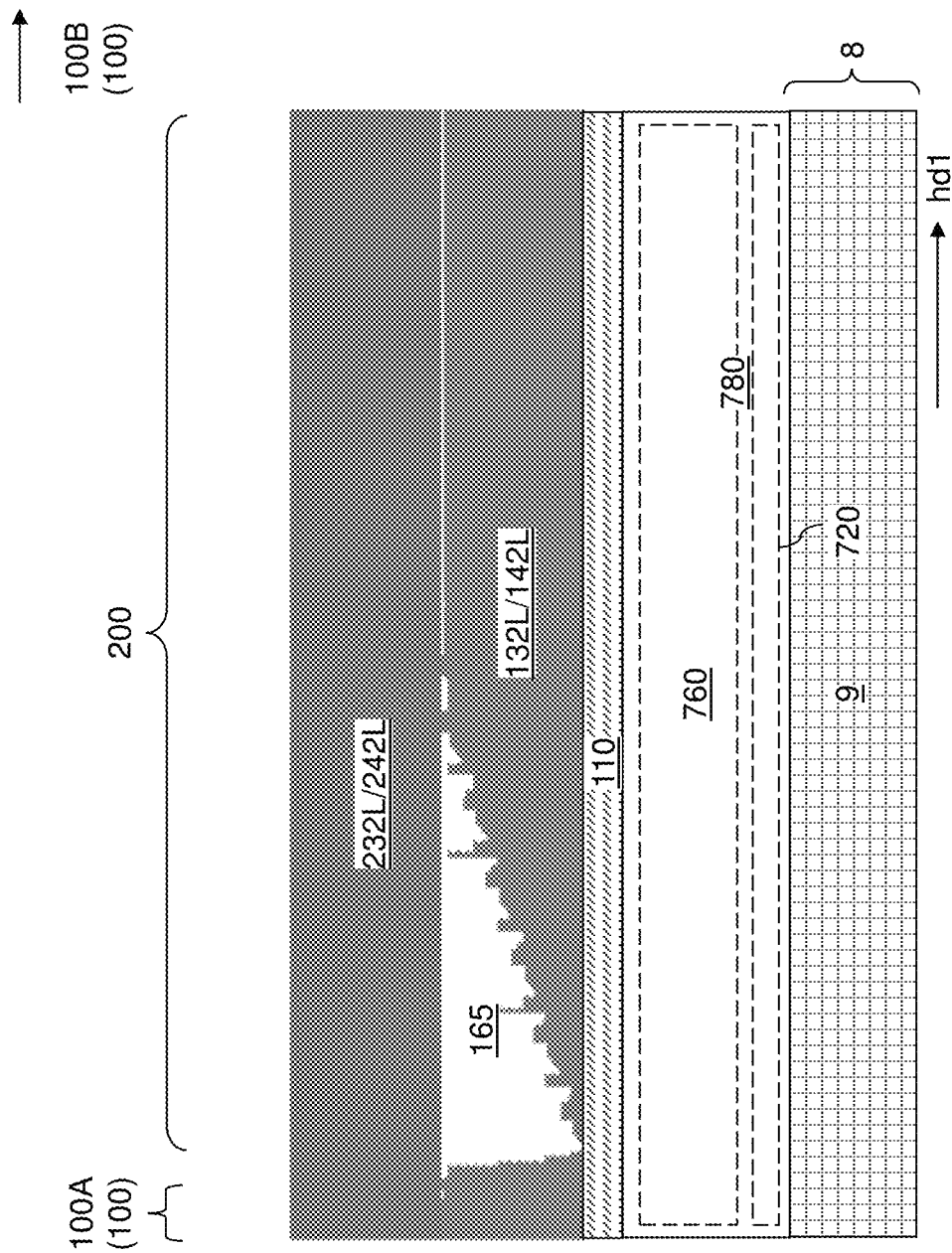
FIG. 20 is a vertical cross-sectional view of a second exemplary structure after formation of a second vertically alternating sequence of second continuous insulating layers and second continuous sacrificial material layers according to the second embodiment of the present disclosure.

Referring to FIG. 20, a vertical cross-sectional view of a second exemplary structure is illustrated. The second exemplary structure can be derived from the first exemplary structure of FIG. 5 by modifying the positions of the first-tier retro-stepped dielectric material portions 165 within the inter-array regions 200. Generally, the second exemplary structure can have the same structural features as the first exemplary structure of FIG. 5 other than the positioning of the retro-stepped dielectric material potions. In one embodiment, all of the first stepped surfaces within a plane may ascend along a same horizontal direction such as the first horizontal direction hd1. In another embodiment, the first stepped surfaces may alternately ascend or descend along the first horizontal direction hd1. For example, upon sequentially numbering the first-tier retro-stepped dielectric material portions with positive integers along the second horizontal direction hd2, odd-numbered first-tier retro-stepped dielectric material portions 165 may have first stepped surfaces that ascend along the first horizontal direction hd1 and even-numbered first-tier retro-stepped dielectric material portions 165 may have first stepped surfaces that descend along the first horizontal direction hd1. Alternatively, even-numbered first-tier retro-stepped dielectric material portions 165 may have first stepped surfaces that ascend along the first horizontal direction hd1 and odd-numbered first-tier retro-stepped dielectric material portions 165 may have first stepped surfaces that descend along the first horizontal direction hd1.

Figure 21:
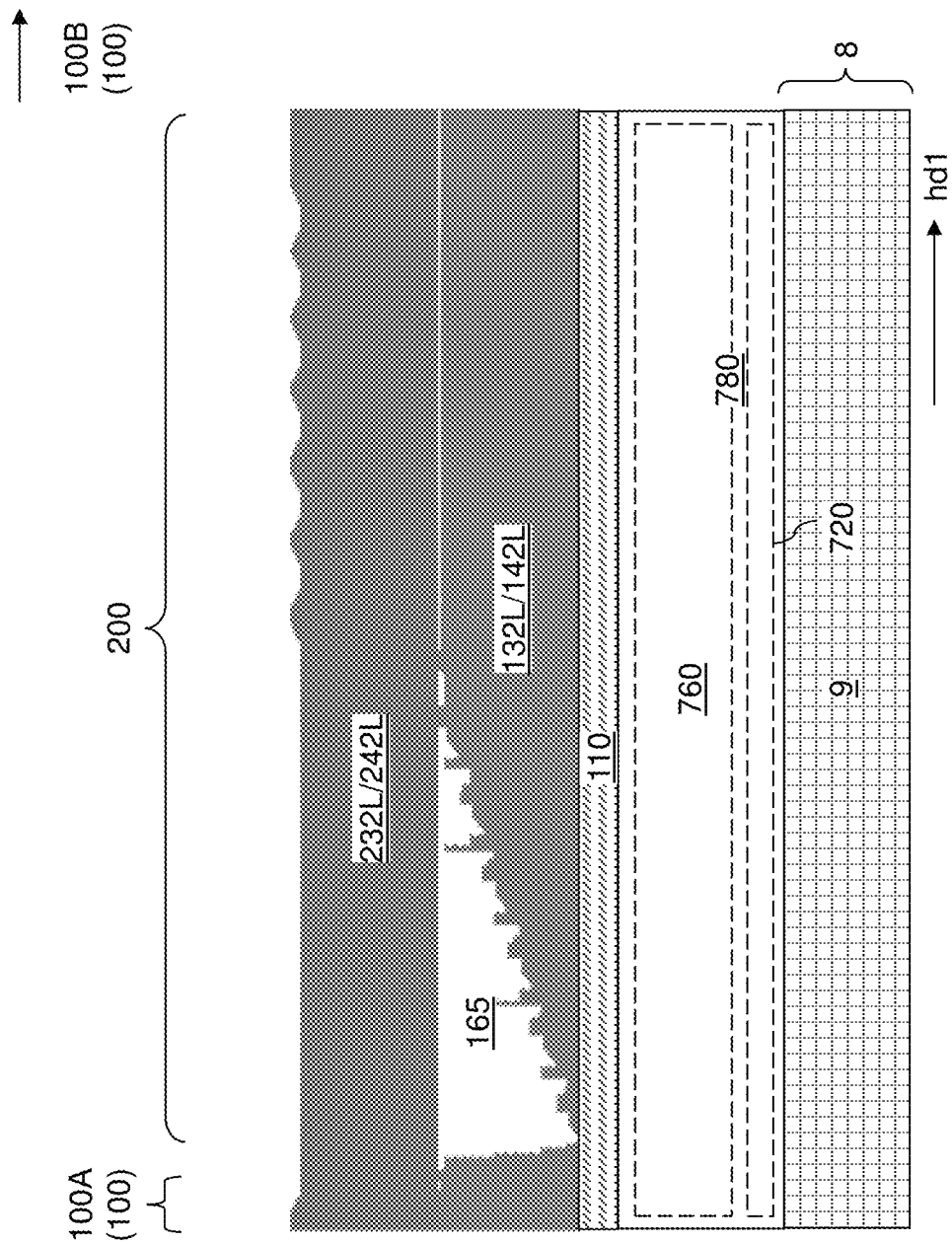
FIG. 21 is a vertical cross-sectional view of a second exemplary structure after formation of drain-select-level stepped surfaces according to the second embodiment of the present disclosure.

Referring to FIG. 21, processing steps for forming drain-select-level stepped surfaces may be optionally formed to provide individual access of topmost second electrically conductive layers 246 to be subsequently formed in drain select levels.

Figure 22:
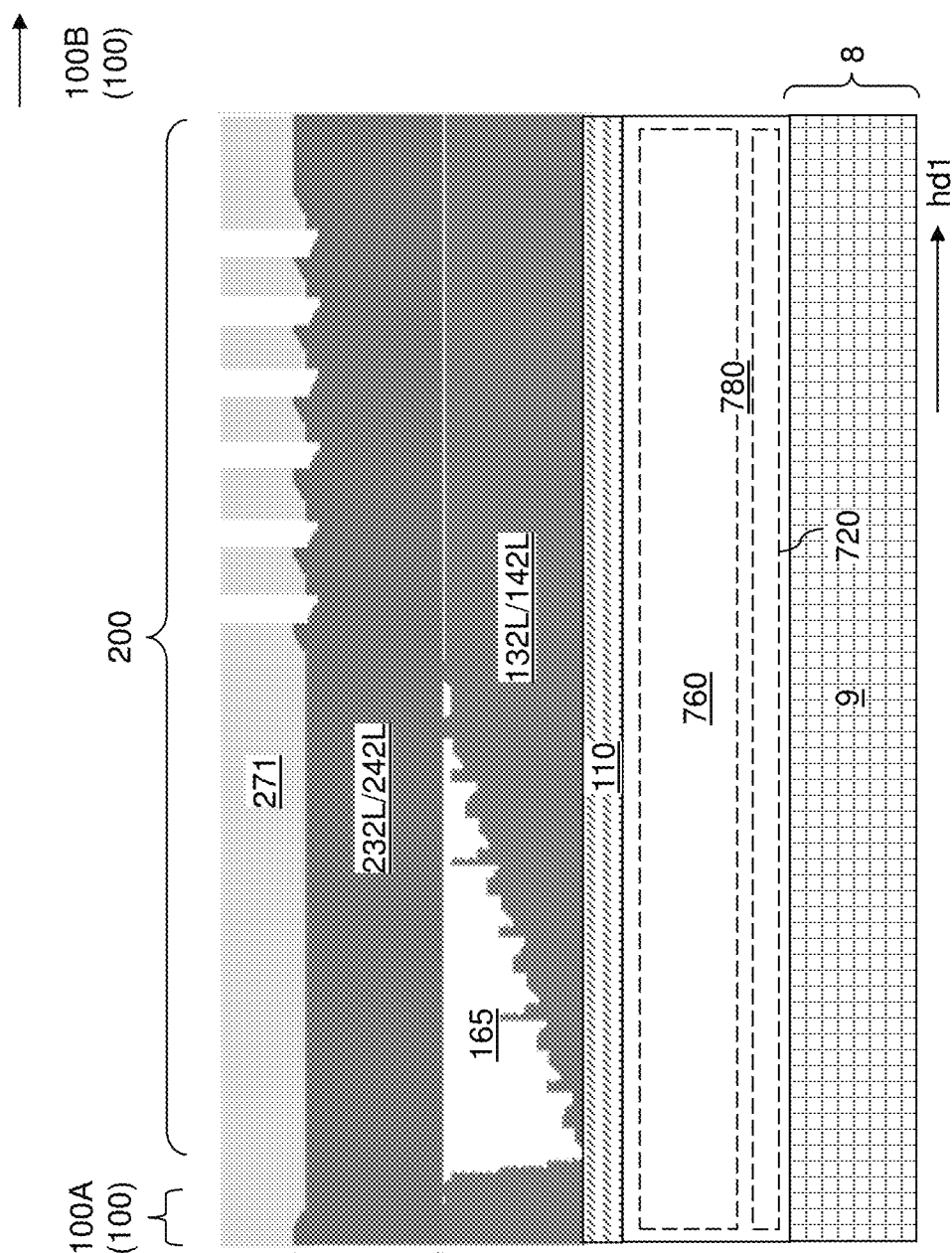
FIG. 22 is a vertical cross-sectional view of a second exemplary structure after a set of staircase-forming processing steps according to the second embodiment of the present disclosure.

Referring to FIG. 22, second stepped surfaces can be formed within the areas of a laterally-neighboring pair of second-tier retro-stepped dielectric material portions 265 that are laterally spaced apart along the second horizontal direction hd1 and between a respective intervening volume within the structure. For example, an optional sacrificial hard mask layer (not shown) and a trimming mask layer 271 may be employed to form the second stepped surfaces. In one embodiment, a row of multiple second staircase regions can be formed within each area that corresponds to a combination of the area of a laterally-neighboring pair of second-tier retro-stepped dielectric material portions 265 and an intervening area. In this case, the multiple second staircase regions can be subsequently vertically offset by different depths by subsequently performing area recess etch processes. In one embodiment, $2^N$ sets of second stepped surfaces can be formed within a combination of the area of a laterally-neighboring pair of second-tier retro-stepped dielectric material portions 265 and an intervening area. N can be an integer in a range from 2 to 8. Each set of second stepped staircases may include P steps such that sidewalls of Q second continuous spacer material layers are physically exposed with lateral offsets. Q may be an integer from 2 to 64.

Figure 26:
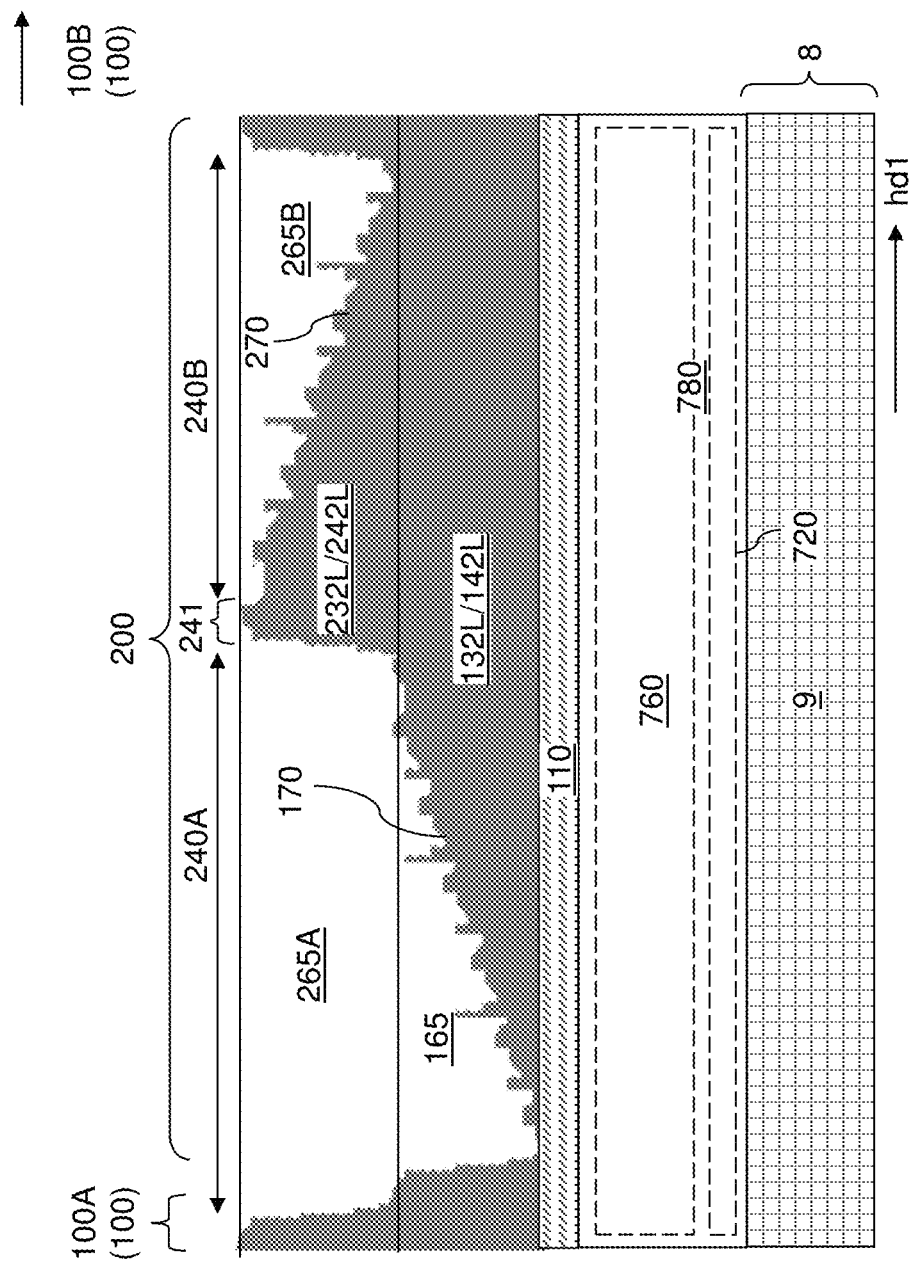
FIG. 26 is a vertical cross-sectional view of a second exemplary structure after removal of a third etch mask layer according to the second embodiment of the present disclosure.

According to an aspect of the present disclosure, the second stepped surfaces can be laterally offset from the area of a proximate underlying first-tier retro-stepped dielectric material portion 165 along the first horizontal direction hd1. The area of the second stepped surfaces can be adjacent to the area of the first-tier retro-stepped dielectric material portion 165. Further, according to an aspect of the present disclosure, if the first stepped surfaces underlying the first-tier retro-stepped dielectric material potion 165 are generally ascending along the first horizontal direction hd1 in a vertical cross-sectional view that is perpendicular to the second horizontal direction hd2, then the second stepped surfaces are generally descending along the first horizontal direction hd1 in the vertical cross-sectional view. If the first stepped surfaces underlying the first-tier retro-stepped dielectric material potion 165 are generally descending along the first horizontal direction hd1 in a vertical cross-sectional view that is perpendicular to the second horizontal direction hd2, then the second stepped surfaces are generally ascending along the first horizontal direction hd1 in the vertical cross-sectional view. As used herein "generally" ascending and descending means that at least a majority of the steps of each staircase are ascending or descending. However, a minority of the steps may be descending or ascending in the opposite direction, as shown in FIG. 26. In other words, the average slope of the first staircase is opposite to that of the second staircase.

Subsequently, M area recess etch processes can be performed such that each area recess etch process vertically recesses Q times $2^j$ sets of a second continuous insulating layer 232L and a second continuous sacrificial material layer 242L, in which j is a different integer from 0 to (N−1). A total of up to $2^N \times Q$ stepped surfaces can be formed for the second vertically alternating sequence of the second continuous insulating layers 232L and the second continuous sacrificial material layers 242L. The total number of the stepped surfaces within each continuous cavity overlying the second stepped surfaces can be the same as the total number of the second continuous sacrificial material layers 242L in the second vertically alternating sequence (132L, 242L).

Figure 23:
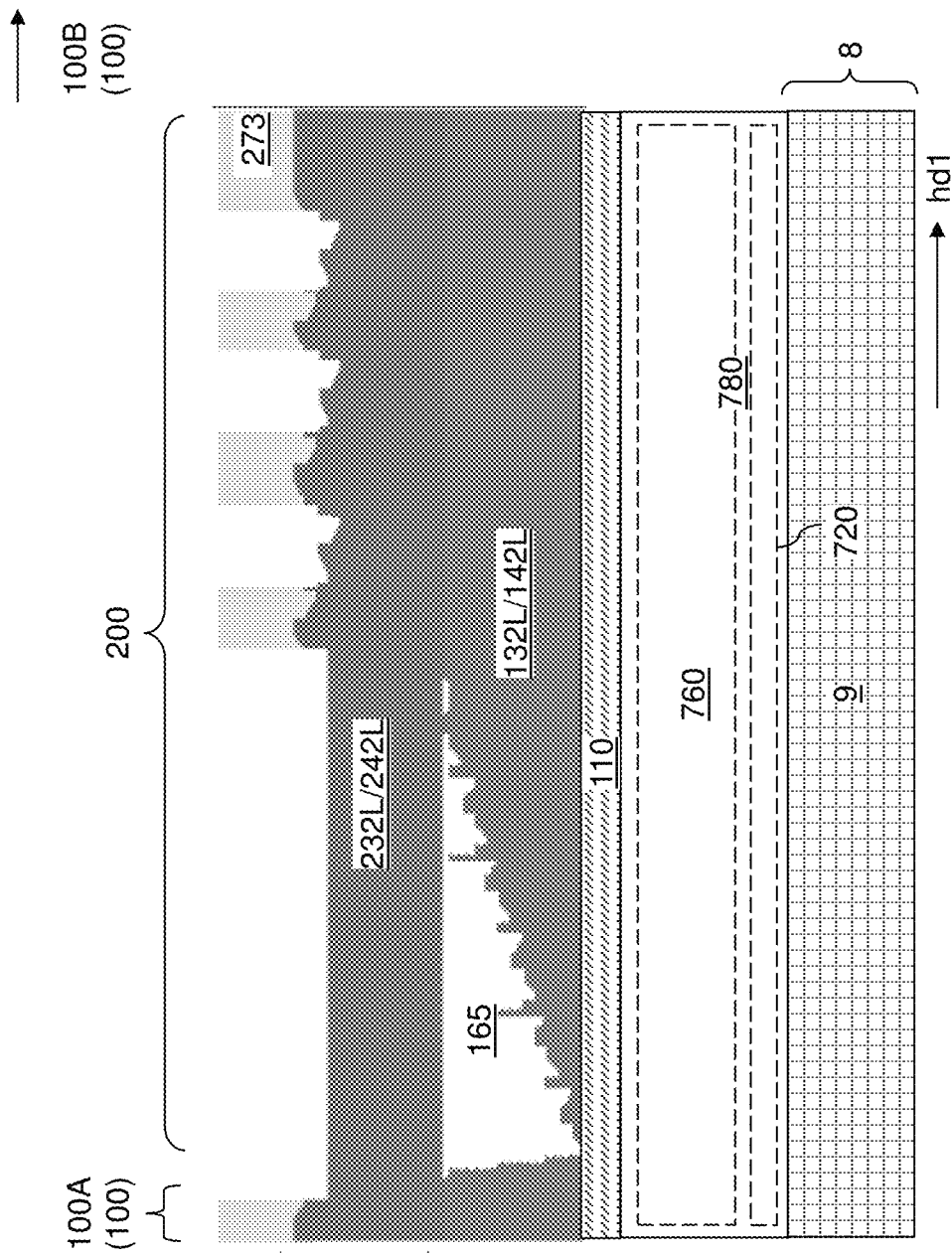
FIG. 23 is a vertical cross-sectional view of a second exemplary structure after a first level-shifting etch process according to the second embodiment of the present disclosure.
Figure 24:
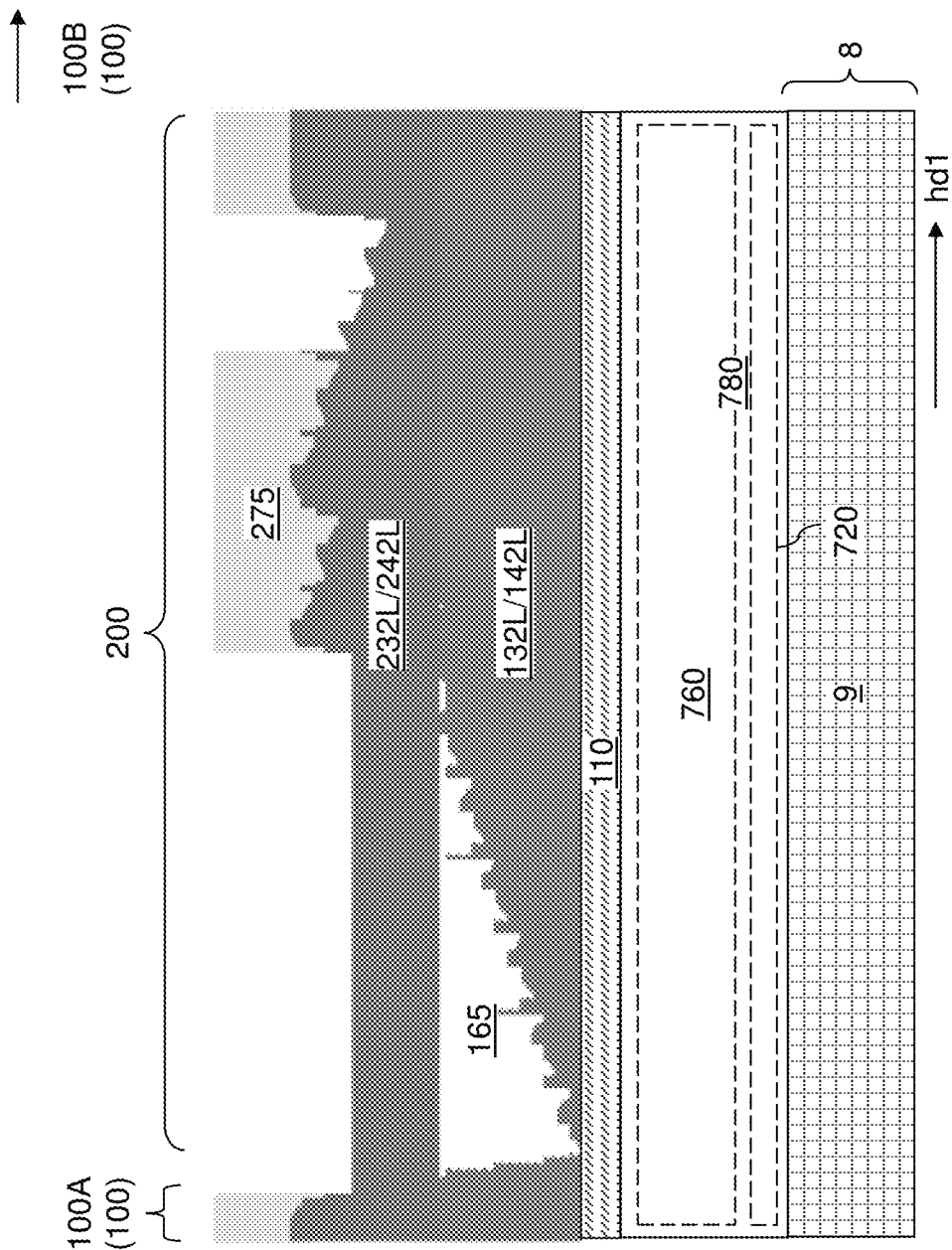
FIG. 24 is a vertical cross-sectional view of a second exemplary structure after a second level-shifting etch process according to the second embodiment of the present disclosure.
Figure 25:
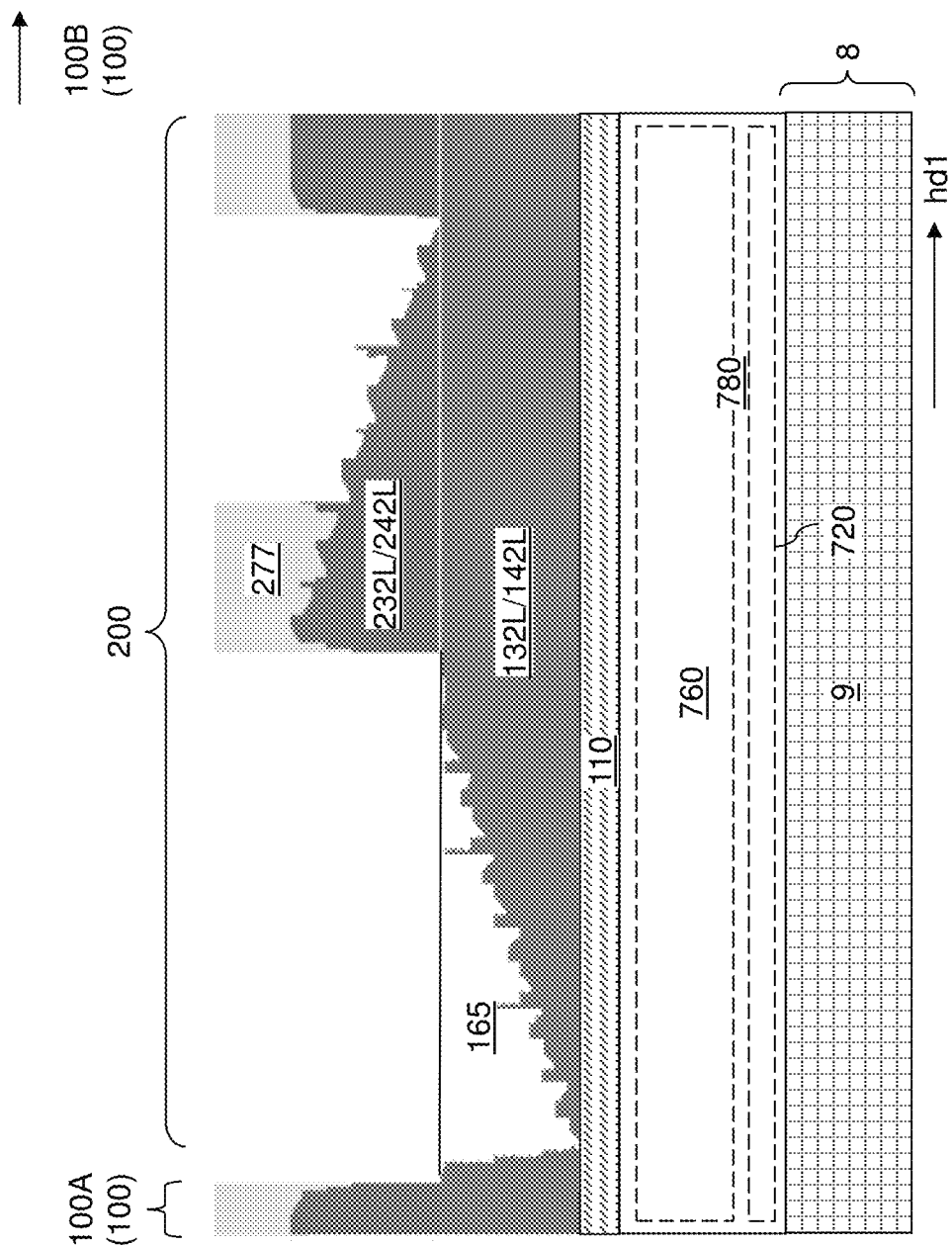
FIG. 25 is a vertical cross-sectional view of a second exemplary structure after a third level-shifting etch process according to the second embodiment of the present disclosure.

Referring to FIGS. 23-25, an illustrative example is shown, in which M is 3. At the processing step illustrated in FIG. 23, a first patterned etch mask layer 273 can be formed over the second exemplary structure such that a first subset of the second stepped surfaces is not covered by the first patterned etch mask layer 273 while the complement of the first subset of the second stepped surfaces is covered by the first patterned etch mask layer 273. Further, the entire area of the first-tier retro-stepped dielectric material portions 165 is not covered by the first patterned etch mask layer 273. In one embodiment, openings in the first patterned etch mask layer 273 that overlie the first-tier retro-stepped dielectric material portions 165 can be discrete openings that are laterally spaced from other openings in the first patterned etch mask layer 273 that overlie the first subset of the second stepped surfaces.

A first area recess etch process can be subsequently performed to vertically recess unmasked areas of the second vertically alternating sequence (232L, 242L), i.e., areas of the second vertically alternating sequence (232L, 242L) located within the openings in the first patterned etch mask layer 273. In one embodiment, the total number of pairs of a second continuous insulating layer 232L and a second continuous sacrificial material layer 242L can be Q, or a number less than Q. The first patterned etch mask layer 273 can be subsequently removed, for example, by ashing.

Referring to FIG. 24, a second patterned etch mask layer 275 can be formed over the second exemplary structure such that a second subset of the second stepped surfaces is not covered by the second patterned etch mask layer 275 while the complement of the second subset of the second stepped surfaces is covered by the second patterned etch mask layer 275. Further, the entire area of the first-tier retro-stepped dielectric material portions 165 is not covered by the second patterned etch mask layer 275. In one embodiment, openings in the second patterned etch mask layer 275 that overlie the first-tier retro-stepped dielectric material portions 165 can be discrete openings that are laterally spaced from other openings in the second patterned etch mask layer 275 that overlie the second subset of the second stepped surfaces.

A second area recess etch process can be subsequently performed to vertically recess unmasked areas of the second vertically alternating sequence (232L, 242L), i.e., areas of the second vertically alternating sequence (232L, 242L) located within the openings in the second patterned etch mask layer 275. In one embodiment, the total number of pairs of a second continuous insulating layer 232L and a second continuous sacrificial material layer 242L can be 2Q, or a number less than 2Q. The second patterned etch mask layer 275 can be subsequently removed, for example, by ashing.

Referring to FIG. 25, a third patterned etch mask layer 277 can be formed over the second exemplary structure such that a third subset of the second stepped surfaces is not covered by the third patterned etch mask layer 277 while the complement of the third subset of the second stepped surfaces is covered by the third patterned etch mask layer 277. Further, the entire area of the first-tier retro-stepped dielectric material portions 165 is not covered by the third patterned etch mask layer 277. In one embodiment, openings in the third patterned etch mask layer 277 that overlie the first-tier retro-stepped dielectric material portions 165 can be discrete openings that are laterally spaced from other openings in the third patterned etch mask layer 277 that overlie the third subset of the second stepped surfaces.

A third area recess etch process can be subsequently performed to vertically recess unmasked areas of the third vertically alternating sequence (232L, 242L), i.e., areas of the third vertically alternating sequence (232L, 242L) located within the openings in the third patterned etch mask layer 277. In one embodiment, the total number of pairs of a third continuous insulating layer 232L and a third continuous sacrificial material layer 242L can be 4Q, or a number less than 4Q.

Referring to FIG. 26, the third patterned etch mask layer 277 can be subsequently removed, for example, by ashing. Each of the second continuous sacrificial material layers 242L can be patterned by at least one etch process within the processing steps of FIGS. 22-25. Within each vertical cross-sectional profile that is perpendicular to the second horizontal direction hd2 and cuts through a first-tier retro-stepped dielectric material potion 165, the layers within the first vertically alternating sequence (132L, 142L) can have a generally ascending or generally descending horizontal cross-sectional profile along the first horizontal direction hd1 such that the bottommost step within the first vertically alternating sequence (132L, 142L) is more proximal to a first one of the first memory array region 100A and the second memory array region 100B than the topmost step within the first vertically alternating sequence (132L, 142L) is to the first one of the first memory array region 100A and the second memory array region 100B. Within the same vertical cross-sectional profile, the layers within the second vertically alternating sequence (232L, 242L) can have a generally descending or generally ascending horizontal cross-sectional profile along the first horizontal direction hd1 such that the bottommost step within the second vertically alternating sequence (232L, 242L) is more proximal to a second one of the first memory array region 100A and the second memory array region 100B than the topmost step within the second vertically alternating sequence (232L, 242L) is to the second one of the first memory array region 100A and the second memory array region 100B. The first and second memory array regions are different from each other.

A second dielectric fill material (such as undoped silicate glass (i.e., silicon oxide) or a doped silicate glass) can be deposited in each second continuous retro-stepped cavity. The second dielectric fill material can be planarized to remove excess portions of the second dielectric fill material from above the horizontal plane including the topmost surface of the second vertically alternating sequence (232L, 242L). Each remaining portion of the second dielectric fill material that fills a respective second continuous retro-stepped cavity constitutes a second-tier retro-stepped dielectric material portion 265B. Each remaining portion of the second dielectric fill material that has a flat bottom surface and contacts a top surface of a respective first-tier retro-stepped dielectric material portion 165 constitutes a flat-bottomed dielectric material portion 265A.

Generally, a second-tier structure is formed, which comprises a second vertically alternating sequence of second continuous insulating layers 232L and second continuous sacrificial material layers 242L, second-tier retro-stepped dielectric material portions 265B overlying second stepped surfaces of the second vertically alternating sequence that are located in the inter-array regions 200, and flat-bottomed dielectric material potions 265A overlying and contacting a top surface of a respective first-tier retro-stepped dielectric material portion 165 and located in the inter-array regions 200. An inter-bridge region 241 of the alternating stacks {(132, 146), (232, 246)} is located between separate first bridge portion and the second bridge portion in the inter-array region 200.

Figure 6A:
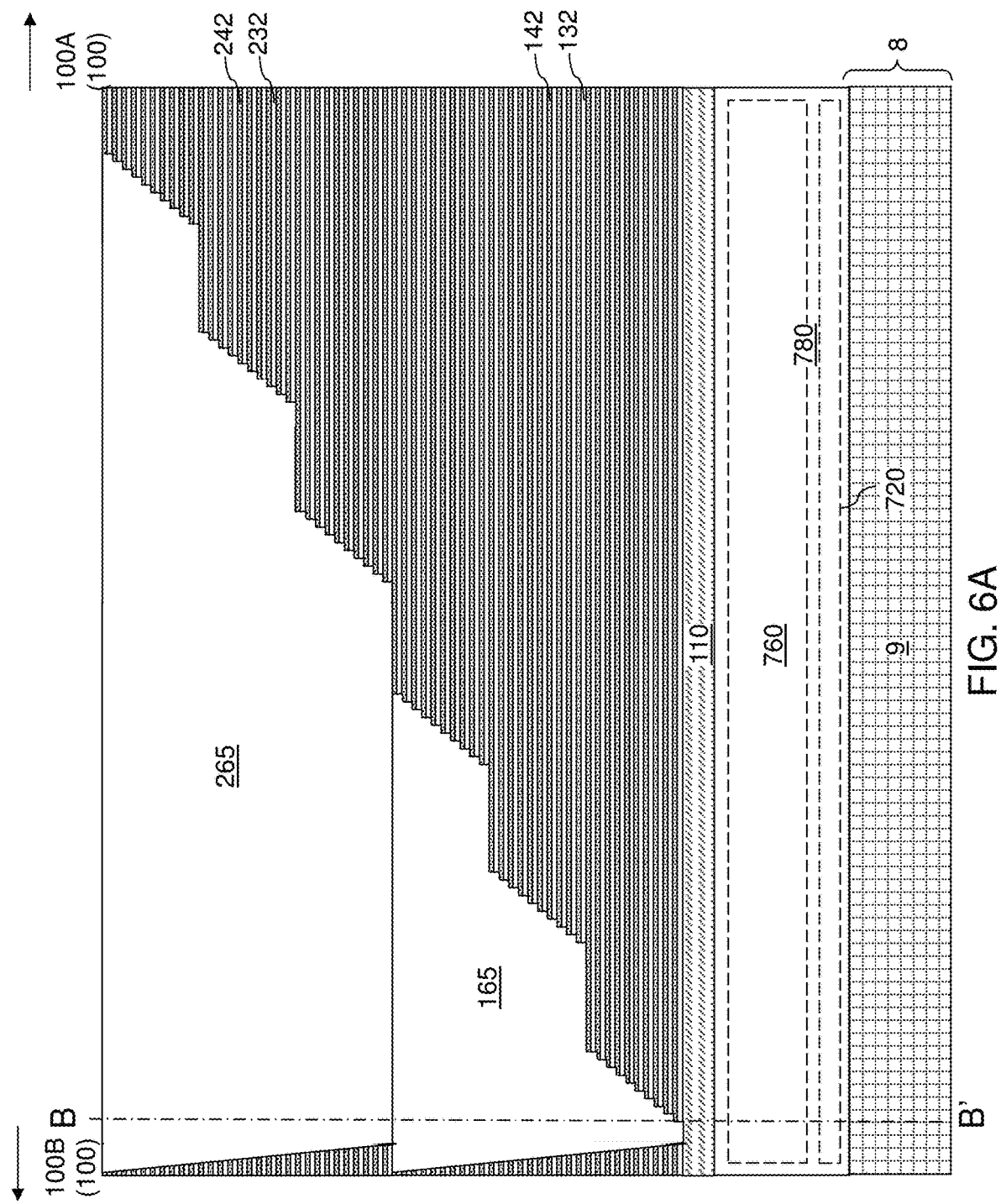
FIG. 6A is a vertical cross-sectional view of the first exemplary structure along the first horizontal direction after formation of a second-tier retro-stepped dielectric material portion according to the first embodiment of the present disclosure.
Figure 6B:
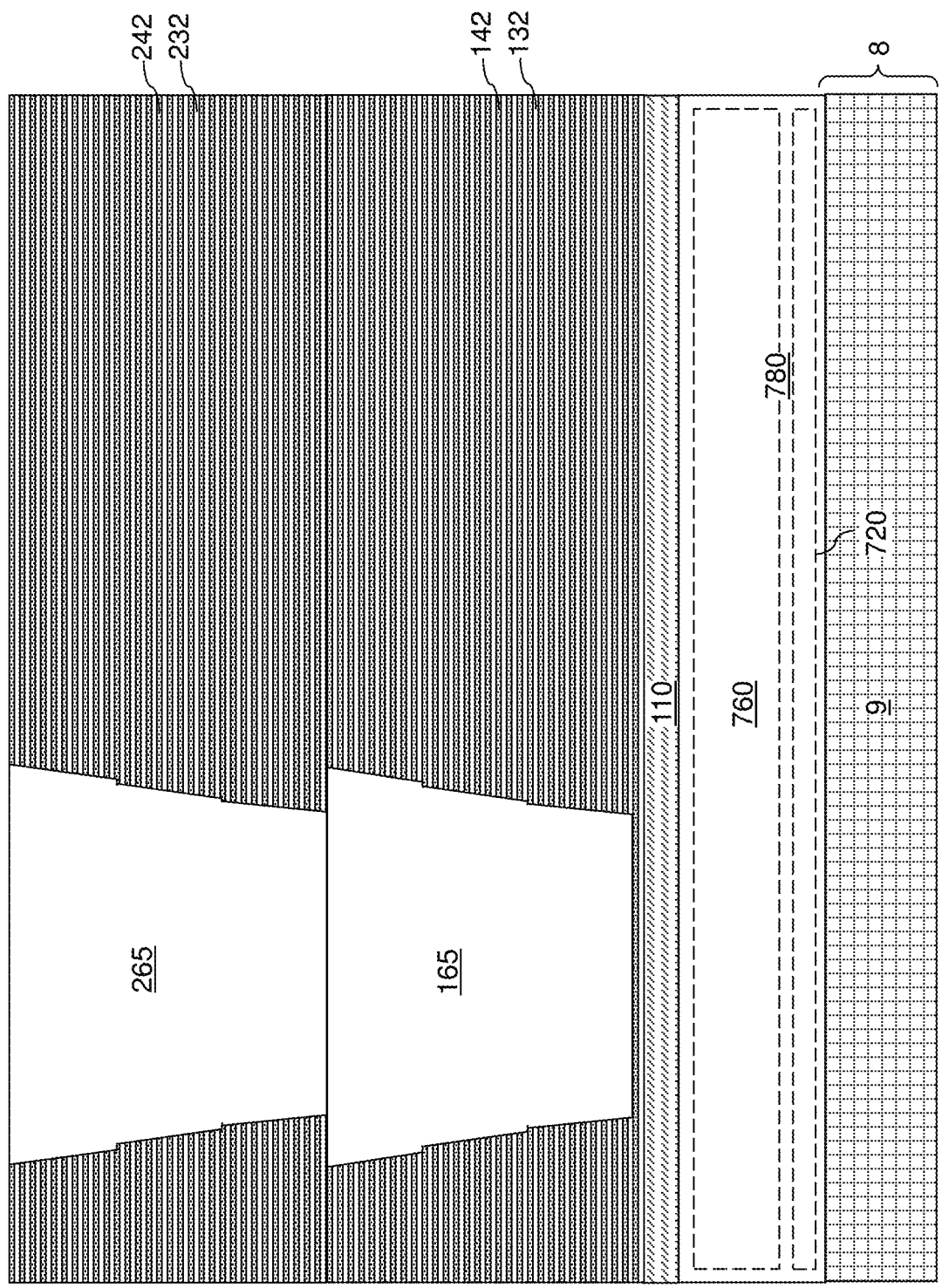
FIG. 6B is a vertical cross-sectional view of the first exemplary structure along a vertical plane B-B' of FIG. 6A.
Figure 8:
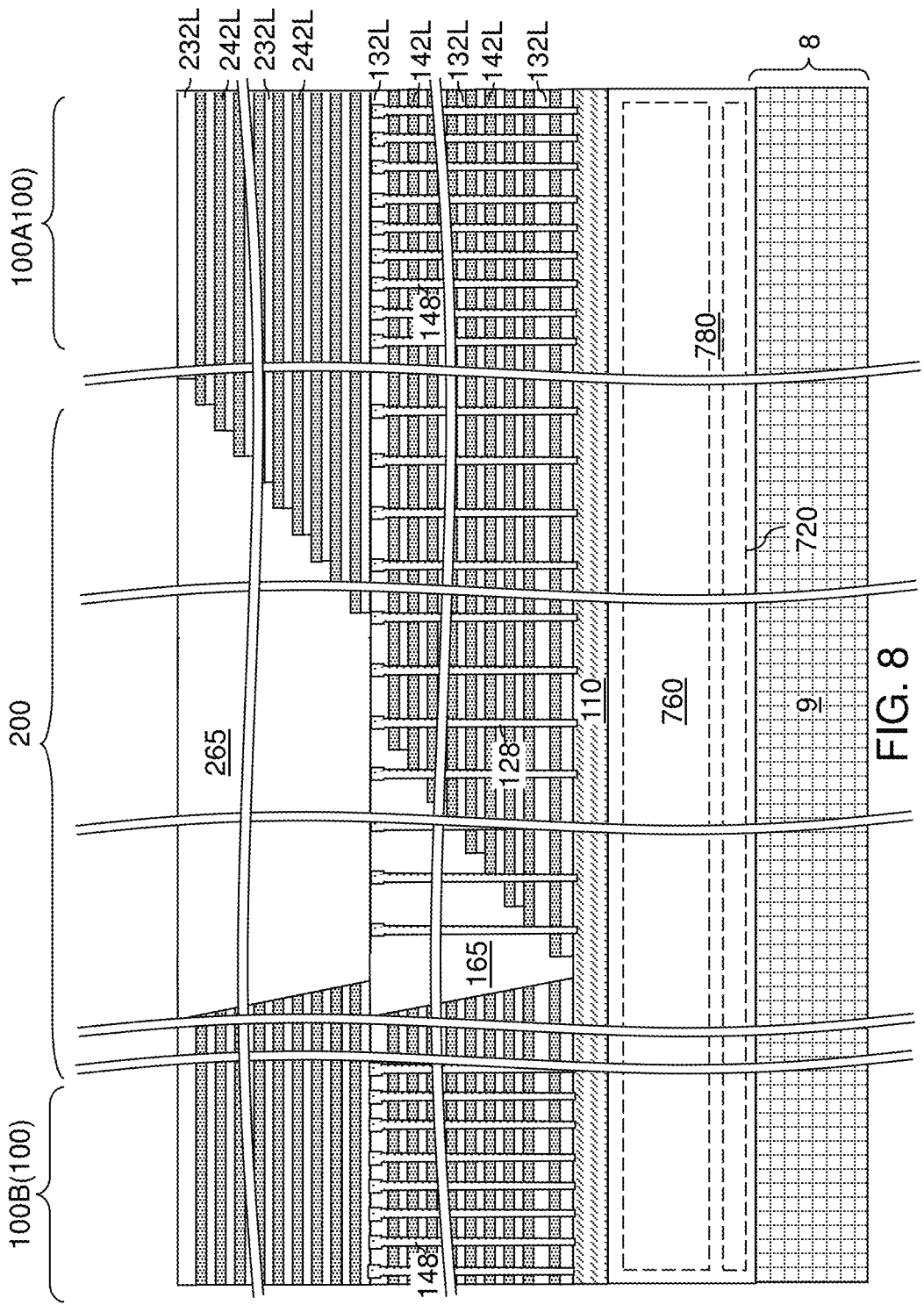
FIG. 8 is still another vertical cross-sectional view of the first exemplary structure of FIGS. 6A, 6B, 7A, and 7B along the first horizontal direction according to the first embodiment of the present disclosure.
Figure 27A:
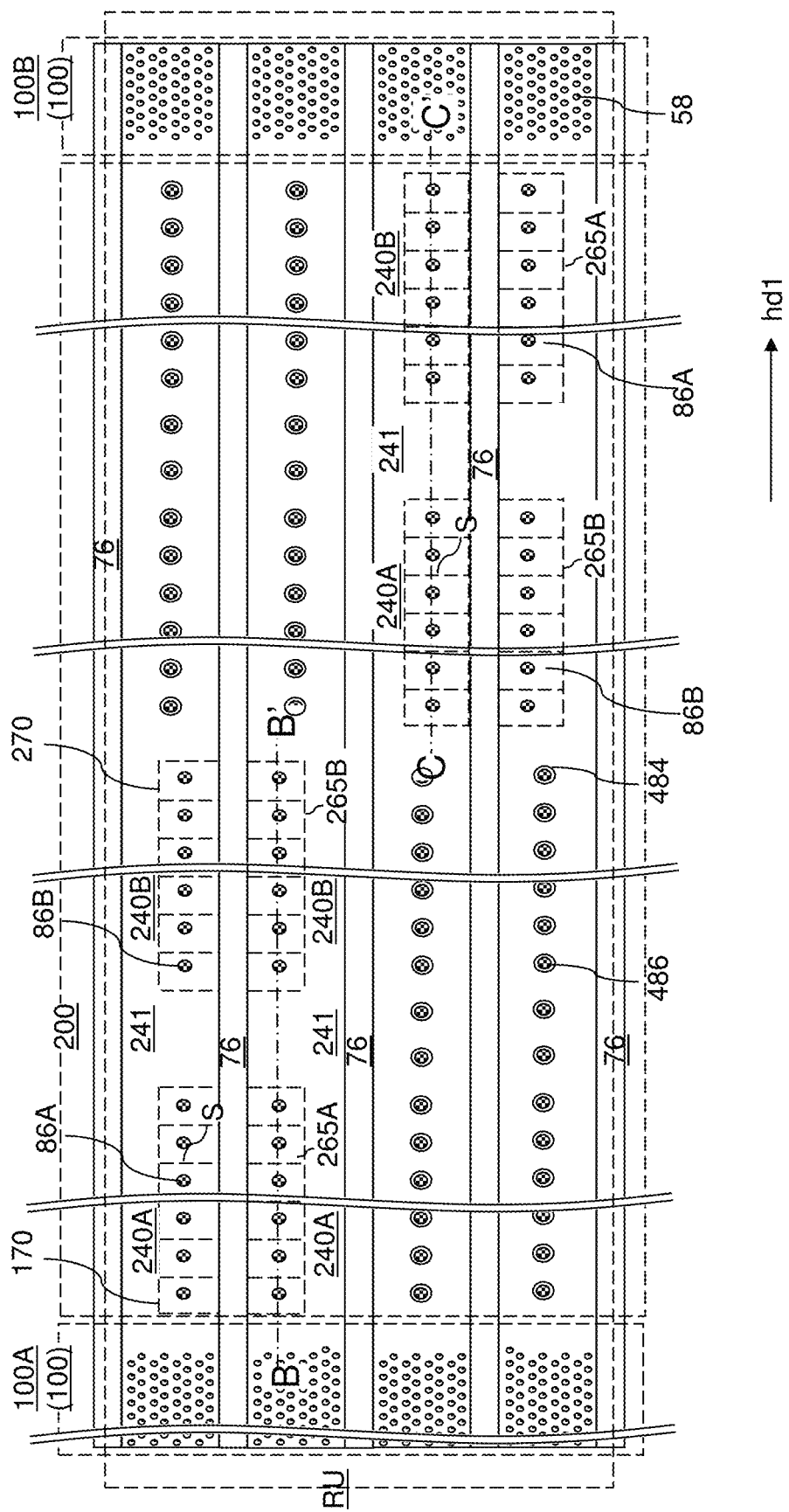
FIG. 27A is a top-down view of the second exemplary structure after formation of various contact via structures according to the second embodiment of the present disclosure.
Figure 27B:
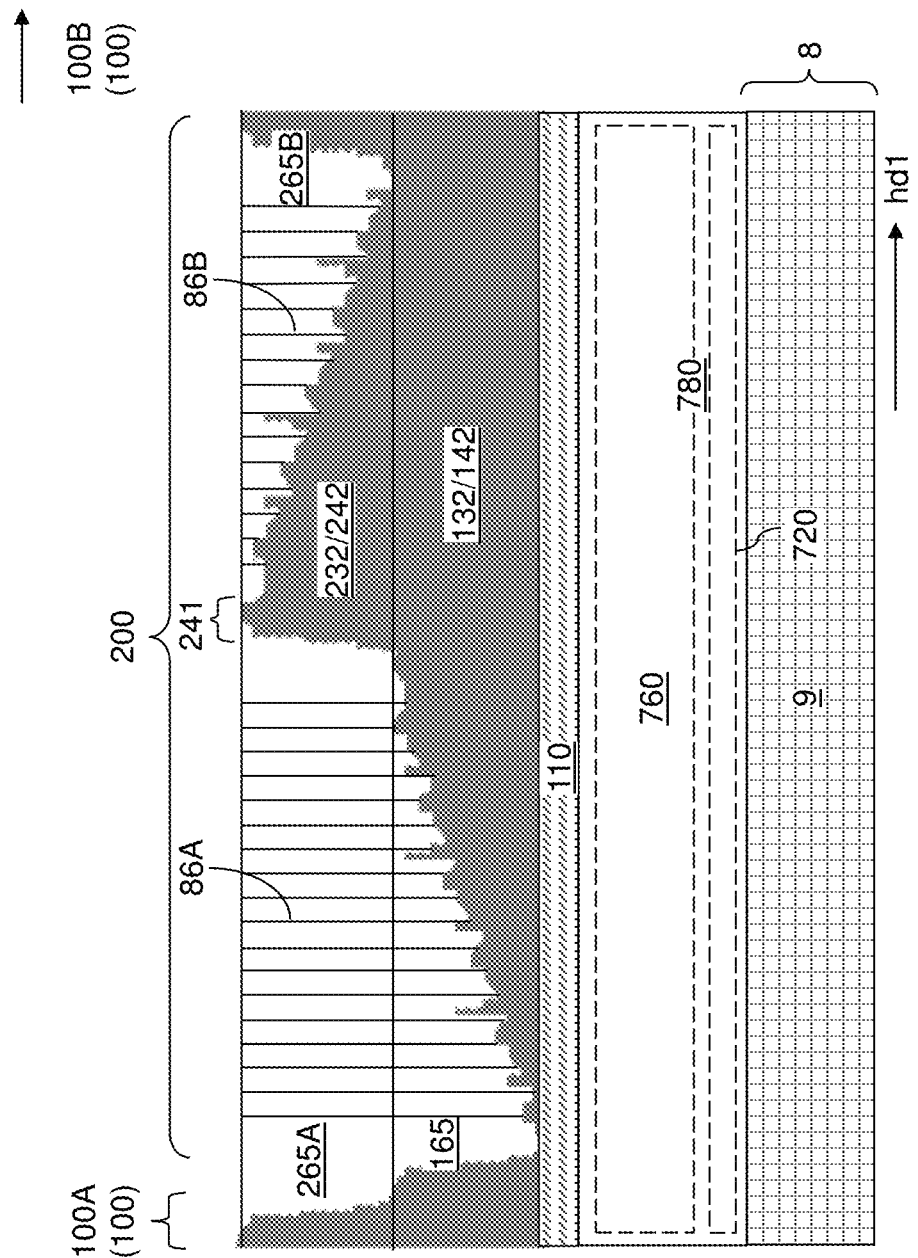
FIG. 27B is a schematic vertical cross-sectional view of the second exemplary structure along the vertical plane B-B' of FIG. 27A.
Figure 27C:
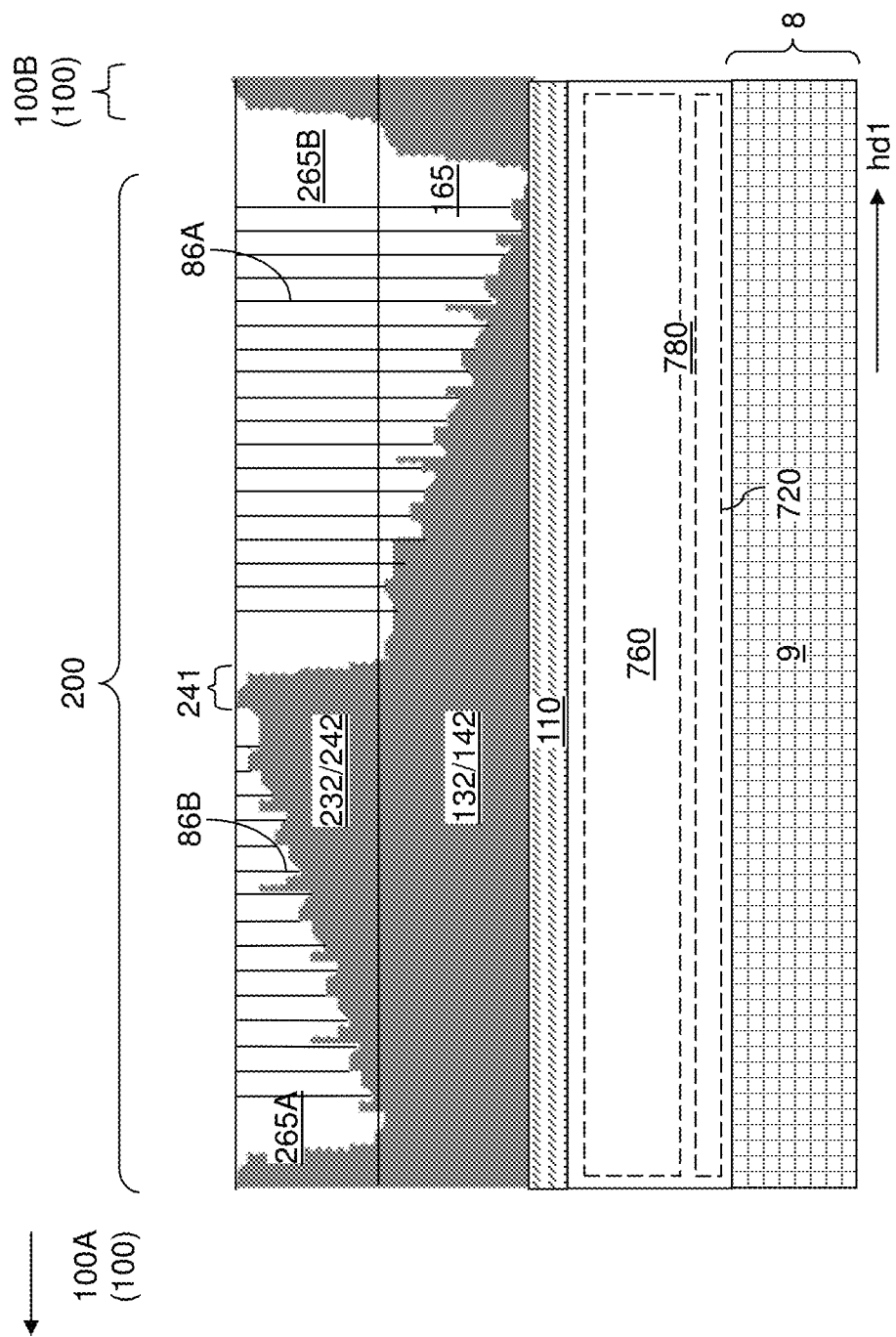
FIG. 27C is a schematic vertical cross-sectional view of the second exemplary structure along the vertical plane C-C' of FIG. 27A.

Referring to FIGS. 27A-27C, the processing steps of FIGS. 9, 10, 11A-11D, 12, 13A, 13B, 14, 15, 16, 17A, and 17B can be performed with any needed changes to accommodate the changes in the locations of the inter-array region 200 and changes in the vertical cross-sectional profiles of the first stepped surfaces and the second stepped surfaces. As shown in FIG. 27A, the inter-bridge region 241 of the alternating stacks {(132, 146), (232, 246)} is located between the separate first bridge portion 240A and the second bridge portion 240B in the inter-array region 200. The width of the electrically conductive layers (146, 246) in the inter-bridge region 241 is wider than the width of the electrically conductive layer (146, 246) strips in the first and second bridge portions (240A, 240B). Therefore, the length of each of the bridge portions (240A, 240B) shown in FIGS. 27A-27C is shorter than that of the single continuous bridge region 240 of the first embodiment shown in FIGS. 1B, 1F and 18A which is formed when the upper and lower staircases located between the same pair of line trench fill structures 76 ascend in the same direction, as shown in FIG. 6A. Thus, the length of the bridge region of the topmost electrically conductive layer 246 is cut by about half in the second embodiment. Thus, the length of the narrow width strip of topmost electrically conductive layer 246 in the bridge region is also decreased by about half, which improves the overall resistance of the topmost electrically conductive layer 246, decreases the RC delay and increases the speed of the memory device.

Referring to FIGS. 19-27C and all related drawings of the second exemplary structure, and according to the second embodiments of the present disclosure, a three-dimensional memory device comprises alternating stacks of insulating layers (132, 232) and electrically conductive layers (146, 246), wherein each of the alternating stacks {(132, 146), (232, 246)} laterally extends along a first horizontal direction hd1 through a first memory array region 100A and a second memory array region 100B that are laterally spaced apart by an inter-array region 200, and memory stack structures 55 vertically extending through a respective one of the alternating stacks and located within the first memory array region 100A and the second memory array region 100B.

Each of the alternating stacks comprises a first-tier alternating stack (132, 146) of first insulating layers and first electrically conductive layers and a second-tier alternating stack (232, 246) of second insulating layers and second electrically conductive layers located over the first tier-alternating stack. The first-tier alternating stack (132, 146) has a first staircase 170 having first stepped surfaces located in the inter-array region 200. The second-tier alternating stack (232, 246) has a second staircase 270 having second stepped surfaces located in the inter-array region 200. The first staircase 170 generally ascends in first direction hd1 and the second staircase 270 generally ascends in a direction opposite to the first direction in each alternating stack which includes the first-tier alternating stack and the second-tier alternating stack.

In one embodiment, first layer contact via structures 86A vertically extend through a respective first-tier retro-stepped dielectric material portion 165 and contact a respective one of the first electrically conductive layers 146; and second layer contact via structures 86B vertically extend through a respective second-tier retro-stepped dielectric material portion 265B and contact a respective one of the second electrically conductive layers 246.

For each alternating stack {(132, 146), (232, 246)} including a first-tier alternating stack (132, 146) and a second-tier alternating stack (232, 246), a first layer contact via structure 86A contacting a bottommost first electrically conductive layer 146 of the first-tier alternating stack (132, 246) is more proximal to one of the first memory array region 100A and the second memory array region 100B than an additional first layer contact via structure 86A contacting a topmost first electrically conductive layer 146 of the first-tier alternating stack (132, 146) is to the one of the first memory array region 100A and the second memory array region 100B; and a second layer contact via structure 86B contacting a bottommost second electrically conductive layer 246 of the second-tier alternating stack (232, 246) is more distal from the one of the first memory array region 100A and the second memory array region 100B than an additional second layer contact via structure 86B contacting a topmost second electrically conductive layer 246 of the second-tier alternating stack (232, 246) is from the one of the first memory array region 100A and the second memory array region 100B.

In one embodiment, the additional second layer contact via structure 86B is more distal from the one of the first memory array region 100A and the second memory array region 100B than the additional first layer contact via structure 86A is from the one of the first memory array region 100A and the second memory array region 100B.

In one embodiment shown in FIG. 27A, a first bridge portion 240A is located adjacent to the first staircase region 170 along a second horizontal direction hd2 which is perpendicular to the first horizontal direction hd2, a second bridge portion 240B is located adjacent to the second staircase region 270 along the second horizontal direction hd2, and an inter-bridge region 241 is located between the first bridge portion 240A and the second bridge portion 240B along the first horizontal direction hd1; each electrically conductive layer (146, 246) within the alternating stacks {(132, 146), (232, 246)} has a respective strip width Ws within the first and second bridge portions (240A, 240B) and has a respective uniform width W0 greater than the respective strip width Ws in the inter-bridge region 241, the first memory array region 100A, the second memory array region 100B, and portions of the inter-array region 200 located outside the bridge portions (240A and 240B).

In one embodiment, the alternating stacks {(132, 146), (232, 246)} are laterally spaced apart along the second horizontal direction hd2 by line trenches (such as backside trenches 79) that laterally extend along the first horizontal direction hd1; the line trenches are filled with line trench fill structures 79 having dielectric surfaces (such as surfaces of insulating spacers 76A) that contact sidewalls of the alternating stacks {(132, 146), (232, 246)}; and upon sequentially numbering the line trench fill structures 76 with positive integers along the second horizontal direction hd2, odd-numbered line trench fill structures 76 contact a respective pair of retro-stepped dielectric material portions (165, 265B) located over the first and the second staircase regions (170, 270) and even-numbered line trench fill structures 76 (170, 270) and even-numbered line trench fill structures 76 do not contact any retro-stepped dielectric material portion (165, 265B), or the even-numbered line trench fill structures 76 contact the respective pair of retro-stepped dielectric material portions (165, 265B) and the odd-numbered line trench fill structures 76 do not contact any retro-stepped dielectric material portion (165, 265B).

In one embodiment, each of the memory stack structures 55 comprises a vertical stack of memory elements (such as portions of a charge storage layer 54) located at levels of the electrically conductive layers (146, 246) and a vertical electrical current path (such as a vertical semiconductor channel 60) that is electrically connected to a respective overlying metal interconnect structure (such as a bit line); and the inter-array region 200 is free of any memory stack structure that is electrically contacted by any metal interconnect structure (such as a bit line).

The various embodiments of the present disclosure can provide word line contact via structures that provide a same maximum resistive path to distal portions of electrically conductive layers located at either end of a first memory array region 100A and a second memory array region 100B. Furthermore, by forming upper and lower staircases with opposite slopes, the bridge length of the uppermost electrically conductive layer 246 is cut in half. By equalizing the electrical resistance of most resistive electrically conductive paths and by cutting the bridge length of the most resistive electrically conductive path(s) in half, the overall operational speed of word lines in the three-dimensional memory array can be enhanced to provide faster operation of the three-dimensional memory device.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device, comprising:
   alternating stacks of insulating layers and electrically conductive layers, wherein each of the alternating stacks laterally extends along a first horizontal direction through a first memory array region and a second memory array region that are laterally spaced apart by an inter-array region, wherein a subset of the electrically conductive layers is present within each of the first memory array region, the second memory array region, and the inter-array region as respective continuous layers, wherein the second memory array region is laterally spaced from the first memory array region along the first horizontal direction, and each electrically conductive layer within the subset of the electrically conductive layers comprises a respective strip portion that laterally extends along the first horizontal direction between the first memory array region and the second memory array region, and wherein each of the alternating stacks includes a set of stepped surfaces in the inter-array region;

retro-stepped dielectric material portions overlying a respective set of stepped surfaces of the alternating stacks; and memory stack structures vertically extending through a respective one of the alternating stacks and located within the first memory array region and the second memory array region, wherein:

the first memory array region has a first length along the first horizontal direction;

the second memory array region has a second length along the first horizontal direction that is less than the first length;

one of the alternating stacks comprises a vertical stack of a first-tier alternating stack of first insulating layers and first electrically conductive layers and a second-tier alternating stack of second insulating layers and second electrically conductive layers that overlie the first-tier alternating stack;

the retro-stepped dielectric material portions comprise contiguous combinations of a first-tier retro-stepped dielectric material portion contacting the first-tier alternating stack and a second-tier retro-stepped dielectric material portion contacting the second-tier alternating stack;

the first-tier retro-stepped dielectric material portion has a first tapered sidewall laterally extending along the first horizontal direction and vertically extending from a bottommost surface of a respective first-tier alternating stack to a topmost surface of the respective first-tier alternating stack;

the second-tier retro-stepped dielectric material portion has a second tapered sidewall laterally extending along the first horizontal direction and vertically extending from a bottommost surface of a respective second-tier alternating stack to a topmost surface of the respective second-tier alternating stack, wherein a top surface of the first-tier retro-stepped dielectric material portion has a first width along a second horizontal direction that is perpendicular to the first horizontal direction greater than a second width of a bottom surface of the second-tier retro-stepped dielectric material portion along the second horizontal direction; and a top edge of the first tapered sidewall that is parallel to the first horizontal direction is connected to a bottom edge of the second tapered sidewall that is parallel to the first horizontal direction by a horizontal surface segment of a bottommost surface of the second-tier alternating stack that has a width along the second horizontal direction that equals a difference between the first width and the second width, and the horizontal surface segment of a bottommost surface of the second-tier alternating stack directly contacts a surface segment of the top surface of the first-tier retro-stepped dielectric material portion.

2. The three-dimensional memory device of claim 1, further comprising layer contact via structures vertically extending through a respective one of the retro-stepped dielectric material portions and contacting a respective stepped surface of a respective one of the electrically conductive layers.

3. The three-dimensional memory device of claim 2, for each pair of electrically conductive layers located within a same alternating stack, a layer contact via structure that contacts an overlying electrically conductive layer is more proximal to the first memory array region than a layer contact via structure that contacts an underlying electrically conductive layer is to the first memory array region.

4. The three-dimensional memory device of claim 1, wherein the first length is greater than the second length at least by one half of a length of the inter-array region along the first horizontal direction.

5. The three-dimensional memory device of claim 4, wherein the first length is greater than the second length at least by the length of the inter-array region along the first horizontal direction.

6. The three-dimensional memory device of claim 1, wherein each electrically conductive layer within the alternating stacks has a respective bridge region having a respective strip width within the inter-array region, and has a respective uniform width greater than the strip width in the first memory array region, the second memory array region, and portions of the inter-array region located outside the bridge region.

7. The three-dimensional memory device of claim 6, wherein:

the alternating stacks are laterally spaced apart along the second horizontal direction by line trenches that laterally extend along the first horizontal direction;

the line trenches are filled with line trench fill structures having dielectric surfaces that contact sidewalls of the alternating stacks; and upon sequentially numbering the line trench fill structures with positive integers along the second horizontal direction, odd-numbered line trench fill structures contact a respective pair of retro-stepped dielectric material portions and even-numbered line trench fill structures do not contact any retro-stepped dielectric material portion, or even-numbered line trench fill structures contact a respective pair of retro-stepped dielectric material portions and odd-numbered line trench fill structures do not contact any retro-stepped dielectric material portion.

8. The three-dimensional memory device of claim 1, wherein:

strip widths of the first electrically conductive layers decrease with a respective vertical distance from the substrate;

strip widths of the second electrically conductive layers decrease with a respective vertical distance from the substrate; and a bottommost second electrically conductive layer within the second-tier alternating stack has a greater strip width than a topmost first electrically conductive layer within the first-tier alternating stack.

9. The three-dimensional memory device of claim 6, wherein:

the three-dimensional memory device comprises a memory plane; and the inter-array region is offset from a center of the memory plane toward the second memory array region such that the second memory array region has the second length along the first horizontal direction that is less than the first length of the first memory array region along the first horizontal direction.

10. The three-dimensional memory device of claim 9, wherein:

a total length of a first electrically conductive layer of the electrically conductive layers equals to one arbitrary unit;

a resistance of the first electrically conductive layer between its corresponding layer contact via structure and an end of the first electrically conductive layer at an end of the second memory array region at a first edge of the plane equals to $xR_{wlb}+R_{br}$, where $R_{wlb}$ is a resistance of the first electrically conductive layer in the second memory array region, $R_{br}$ is a resistance of the first electrically conductive layer in the bridge region, and x is the fraction of the total length of the first electrically conductive layer located in the second memory array region;

a resistance of the first electrically conductive layer between its corresponding layer contact via structure and an end of the electrically conductive layer an end of the first memory array region at a second edge of the plane equals to $(1-x)R_{wla}$, where $R_{wla}$ is a resistance of the first electrically conductive layer in the first memory array region; and x is less than 0.5.

11. The three-dimensional memory device of claim 1, wherein:

each of the memory stack structures comprises a vertical stack of memory elements located at levels of the electrically conductive layers and a vertical semiconductor channel that is electrically connected to a respective bit line; and the inter-array region is free of any memory stack structure that is electrically contacted by any bit line.

12. The three-dimensional memory device of claim 1, wherein the horizontal surface segment of the bottommost surface of the second-tier alternating stack contacts a surface segment of a horizontal top surface of the first-tier retro-stepped dielectric material portion.

13. The three-dimensional memory device of claim 12, wherein:

the first-tier alternating stack comprises first stepped surfaces underlying the first-tier retro-stepped dielectric material portion; and the second-tier alternating stack comprises second stepped surfaces underlying the second-tier retro-stepped dielectric material portion and laterally spaced along the first horizontal direction from the second tapered sidewall by a greater lateral spacing than a most distal portion of the first-tier retro-stepped dielectric material portion is from the second tapered sidewall.

14. The three-dimensional memory device of claim 1, wherein the alternating stacks are laterally spaced apart along a second horizontal direction by line trenches that laterally extend straight along the first horizontal direction with a uniform lateral distance between each neighboring pair of line trenches throughout an entirety of the first memory array region, the second memory array region, and the inter-array region.

15. The three-dimensional memory device of claim 14, wherein, upon sequentially numbering the alternating stacks with positive integers represented by 4i+r in which i is a non-negative integer and r is a number selected from 1, 2, 3, and 4 along the second horizontal direction, a first subset of the retro-stepped dielectric material portions, which are in contact with a first subset of the alternating stacks for which a value of r is 1 or 2, is laterally offset along the first horizontal direction from a second subset of the retro-stepped dielectric material portions, which is in contact with a second subset of the alternating stacks for which the value of r is 3 or 4, by a lateral offset distance which is at least a maximum lateral extent of one of the retro-stepped dielectric material portions along the first horizontal direction.

16. The three-dimensional memory device of claim 15, wherein each electrically conductive layer within the alternating stacks has a respective bridge region contacting a sidewall of a respective one of the retro-stepped dielectric material portions and having a respective uniform strip width along the second horizontal direction, and has a uniform width along the second horizontal direction that equals the uniform lateral distance in the first memory array region, in the second memory array region, and in each portion of the inter-array region that is not laterally bounded by any sidewall of the retro-stepped dielectric material portions that laterally extend along the first horizontal direction.

17. The three-dimensional memory device of claim 1, wherein the top edge of the first tapered sidewall is laterally offset from the bottom edge of the second tapered sidewall along the first horizontal direction.

18. The three-dimensional memory device of claim 1, wherein:

the first-tier retro-stepped dielectric material portion has an additional first tapered sidewall laterally extending along the second horizontal direction and vertically extending from the bottommost surface of the respective first-tier alternating stack to the topmost surface of the respective first-tier alternating stack;

the second-tier retro-stepped dielectric material portion has an additional second tapered sidewall laterally extending along the second horizontal direction and vertically extending from the bottommost surface of the respective second-tier alternating stack to the topmost surface of the respective second-tier alternating stack; and a top edge of the additional first tapered sidewall that laterally extends along the second horizontal direction is connected to a bottom edge of the additional second tapered sidewall that laterally extends along the second horizontal direction by an additional horizontal surface segment of the bottommost surface of the second-tier alternating stack that directly contacts an additional surface segment of the top surface of the first-tier retro-stepped dielectric material portion.

* * * * *